US012684847B2

(12) United States Patent
Grote et al.

(10) Patent No.: US 12,684,847 B2
(45) Date of Patent: \*Jul. 14, 2026

(54) SEMICONDUCTOR DEVICE WITH A RECESSED FIELD PLATE AND METHOD OF FABRICATION THEREFOR

(71) Applicant: NXP USA, Inc., Austin, TX (US)

(72) Inventors: Bernhard Grote, Phoenix, AZ (US); Jie Hu, Chandler, AZ (US); Philippe Renaud, Chandler, AZ (US); Congyong Zhu, Gilbert, AZ (US); Bruce McRae Green, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 867 days.

This patent is subject to a terminal disclaimer.

(21) Appl. No.: 18/147,972

(22) Filed: Dec. 29, 2022

(65) Prior Publication Data

US 2024/0222442 A1     Jul. 4, 2024

(51) Int. Cl.
H10D 64/01          (2025.01)
H10D 30/01          (2025.01)
(Continued)

(52) U.S. Cl.
CPC ........... H10D 64/01 (2025.01); H10D 30/015 (2025.01); H10D 30/475 (2025.01);
(Continued)

(58) Field of Classification Search
CPC .... H10D 64/01; H10D 30/015; H10D 30/475; H10D 64/111; H10D 64/258; H10D 64/411; H10D 64/518; H10D 62/824; H10D 62/149; H10D 62/8503; H10D 64/117; H10D 30/4755; H01L 23/3171
See application file for complete search history.

(56) References Cited

U.S. PATENT DOCUMENTS 6,867,078 B1     3/2005   Green et al.
7,592,211 B2     9/2009   Sheppard et al.
(Continued)

OTHER PUBLICATIONS

U.S. Appl. No. 17/561,796, filed Dec. 24, 2021, not yet published, 51 pages.

(Continued)

*Primary Examiner* — Allison Bernstein
(74) *Attorney, Agent, or Firm* — Sherry W. Gourlay

(57)          ABSTRACT

A semiconductor device includes a semiconductor substrate with an upper surface and a channel, source and drain electrodes over the upper surface of the semiconductor substrate, a passivation layer between the source and drain electrodes, a gate electrode between the source and drain electrodes, and a conductive field plate adjacent to the gate electrode. The passivation layer includes a lower passivation sub-layer and an upper passivation sub-layer over the lower passivation sub-layer. The gate electrode includes a lower portion that extends at least partially through the passivation layer. The conductive field plate includes a recessed region that extends through the upper passivation sub-layer but does not extend through the lower passivation sub-layer. The conductive field plate and the upper surface of the semiconductor substrate are separated by a portion of the lower passivation sub-layer.

36 Claims, 42 Drawing Sheets

(51) Int. Cl.

| | |
|---|---|
| *H10D 30/47* | (2025.01) |
| *H10D 62/824* | (2025.01) |
| *H10D 64/00* | (2025.01) |
| *H10D 64/23* | (2025.01) |
| *H10D 64/27* | (2025.01) |

(52) U.S. Cl.

CPC ......... *H10D 64/111* (2025.01); *H10D 64/258* (2025.01); *H10D 64/411* (2025.01); *H10D 64/518* (2025.01); *H10D 62/824* (2025.01)

(56) References Cited

U.S. PATENT DOCUMENTS

| | | | | |
|---|---|---|---|---|
| 8,049,252 | B2 | 11/2011 | Smith et al. | |
| 8,722,547 | B2 | 5/2014 | Mani et al. | |
| 9,741,840 | B1 | 8/2017 | Moens et al. | |
| 9,847,411 | B2 | 12/2017 | Sriram et al. | |
| 12,464,799 | B2 * | 11/2025 | Grote ..................... | H10D 64/01 |
| 2016/0086938 | A1 | 3/2016 | Kinzer | |
| 2019/0326412 | A1 | 10/2019 | Behammer | |
| 2023/0207675 | A1 | 6/2023 | Grote et al. | |
| 2024/0222443 | A1 | 7/2024 | Grote et al. | |
| 2024/0395872 | A1 * | 11/2024 | Hu ....................... | H10D 30/015 |
| 2025/0142924 | A1 * | 5/2025 | Grote ................. | H01L 23/3171 |

OTHER PUBLICATIONS

U.S. Appl. No. 17/450,879, filed Oct. 14, 2021, not yet published, 47 pages.

U.S. Appl. No. 17/645,290, filed Dec. 20, 2021, not yet published, 32 pages.

U.S. Appl. No. 17/645,280, filed Dec. 20, 2021, not yet published, 35 pages.

Denninghoff et al.: "Design of High-Aspect-Ratio T-Gates on N-Polar GaN/AIGaN MIS-HEMTs for High fmax", IEEE Electron Device Letters ( vol. 33, Issue: 6, Jun. 2012), pp. 785-787.

Elkashlan et al.: "Analysis of Gate-Metal Resistance in CMOS-Compatible RF GaN HEMTs" IEEE Transactions on Electron Devices, Year: 2020 , vol. 67, Issue: 11, Nov. 11, 2020, 5 pages.

Bothe et al: "Improved X-Band Performance and Reliability of a GaN HEMT With Sunken Source Connected Field Plate Design", IEEE Electron Device Letters ( vol. 43, Issue: 3, Mar. 2022), pp. 354-357.

Kaddeche, M. et al.; "Study of Field Plate Effects on AlGaN/GaN HEMTs"; IEEE 2009 Int'l Conf. on Microelectronics, IEEE Xplore; 4 pages (Feb. 2010).

Williams, Kirt R. et al; "Etch Rates for Micromachining Processing—Part II"; IEEE J. of Microelectromechanical Systems, vol. 12, No. 6; 18 pages (Dec. 2003).

U.S. Appl. No. 19/353,700, filed Oct. 9, 2025, 46 pages.

* cited by examiner

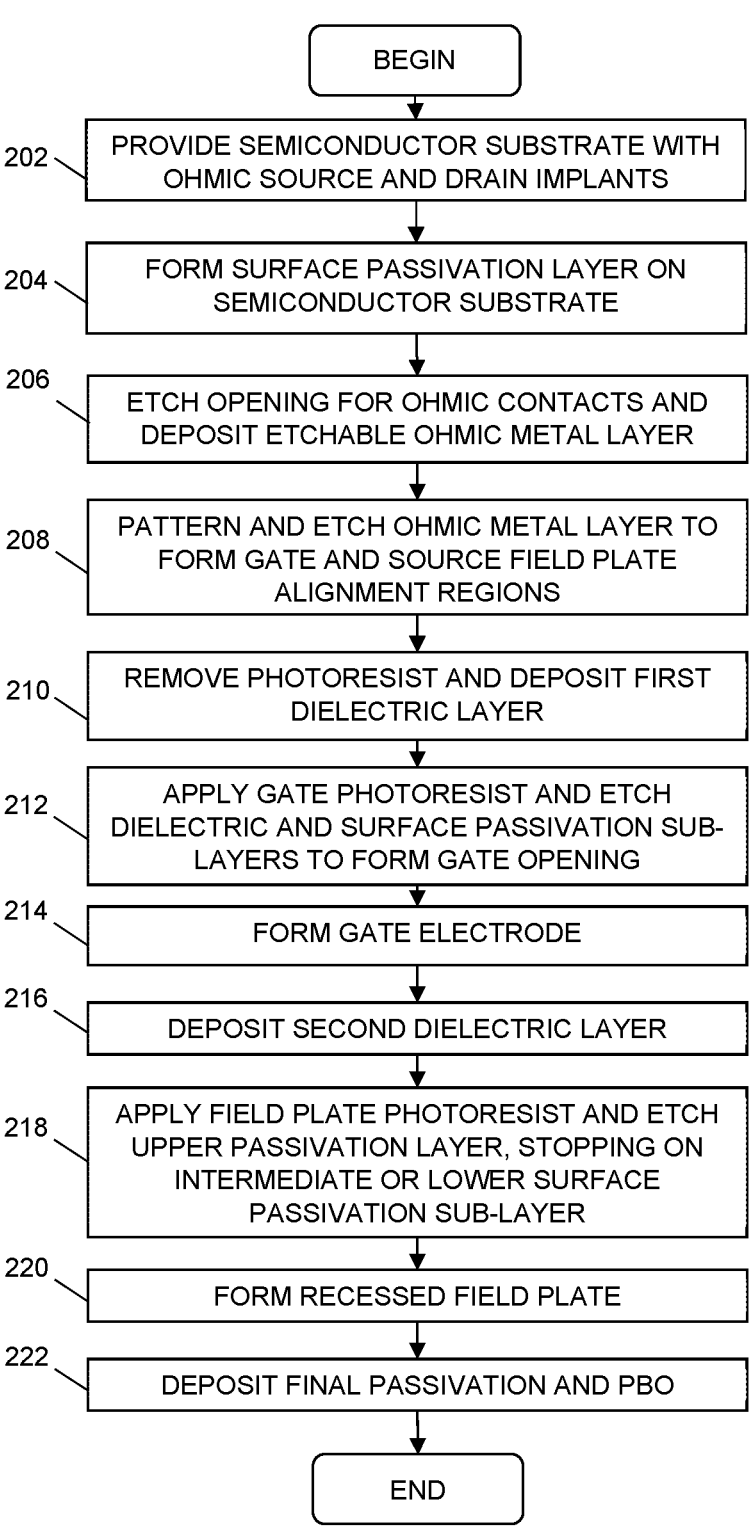

BEGIN

202 — PROVIDE SEMICONDUCTOR SUBSTRATE WITH OHMIC SOURCE AND DRAIN IMPLANTS

204 — FORM SURFACE PASSIVATION LAYER ON SEMICONDUCTOR SUBSTRATE

206 — ETCH OPENING FOR OHMIC CONTACTS AND DEPOSIT ETCHABLE OHMIC METAL LAYER

208 — PATTERN AND ETCH OHMIC METAL LAYER TO FORM GATE AND SOURCE FIELD PLATE ALIGNMENT REGIONS

210 — REMOVE PHOTORESIST AND DEPOSIT FIRST DIELECTRIC LAYER

212 — APPLY GATE PHOTORESIST AND ETCH DIELECTRIC AND SURFACE PASSIVATION SUB-LAYERS TO FORM GATE OPENING

214 — FORM GATE ELECTRODE

216 — DEPOSIT SECOND DIELECTRIC LAYER

218 — APPLY FIELD PLATE PHOTORESIST AND ETCH UPPER PASSIVATION LAYER, STOPPING ON INTERMEDIATE OR LOWER SURFACE PASSIVATION SUB-LAYER

220 — FORM RECESSED FIELD PLATE

222 — DEPOSIT FINAL PASSIVATION AND PBO

END

SEMICONDUCTOR DEVICE WITH A RECESSED FIELD PLATE AND METHOD OF FABRICATION THEREFOR

TECHNICAL FIELD

Embodiments of the subject matter described herein relate generally to semiconductor devices with gate electrodes and field plates and methods for fabricating such devices.

BACKGROUND

Semiconductor devices find application in a wide variety of electronic components and systems. High power, high frequency transistors find application in radio frequency (RF) systems and power electronics systems. Gallium nitride (GaN) device technology is particularly suited for these RF power and power electronics applications due to its superior electronic and thermal characteristics. In particular, the high electron velocity and high breakdown field strength of GaN make devices fabricated from this material ideal for RF power amplifiers and high-power switching applications.

Some GaN transistors include a field plate, which is an electrically-grounded area of metallization that extends over the transistor's gate electrode. The field plate functions to alter the electric field distribution, particularly at the drain-side gate edge. This may result in an increased breakdown voltage and a reduced high-field trapping effect. Accurate alignment of the gate channel and the field plate is important in achieving the necessary device performance for various RF and power applications. Accordingly, in order to meet device performance requirements for a given application, there is a need for GaN devices and methods of fabricating such devices that ensure accurate alignment of the gate channel and the field plate.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 2 is a process flow diagram describing embodiments of methods for fabricating the heterojunction field effect transistor (HFET) devices of FIGS. 1 and 3-9;

FIGS. 6A, 6B-1, 6C-1, 6B-2, 6C-2, 6D, 6E, 6F, 6G, and 6H (collectively FIG. 6) are cross-sectional, side views of another embodiment of an HFET device during a sequence of fabrication steps, according to another fabrication embodiment;

DETAILED DESCRIPTION

Embodiments disclosed herein include field effect transistors (FETs), in particular heterojunction field effect transistors (HFET) including high electron mobility transistors (HEMTs) and metal insulator FETs (MISFETS), with fully self-aligned source connected field plates (SFP), gate connected field plates (GFP), and gate channel (GCH). By self-aligning these features of a FET, device-to-device variations in performance (e.g., variations in capacitances, gain, cut-off frequency, output power, and trapping) that may otherwise occur due to mis-alignment may be avoided.

Further, the FET embodiments disclosed herein include a SFP with a portion that is recessed with respect to the GFPs, which may result in a beneficial reduction in gate-drain capacitance, $C_{GD}$. More particularly, and according to the various embodiments, the recessed portion of the SFP is "self aligned" to the GCH. Further, in at least one embodiment, the gate construction allows for reduction in gate resistance, $R_G$, without incurring a notable capacitance increase.

Figure 1:
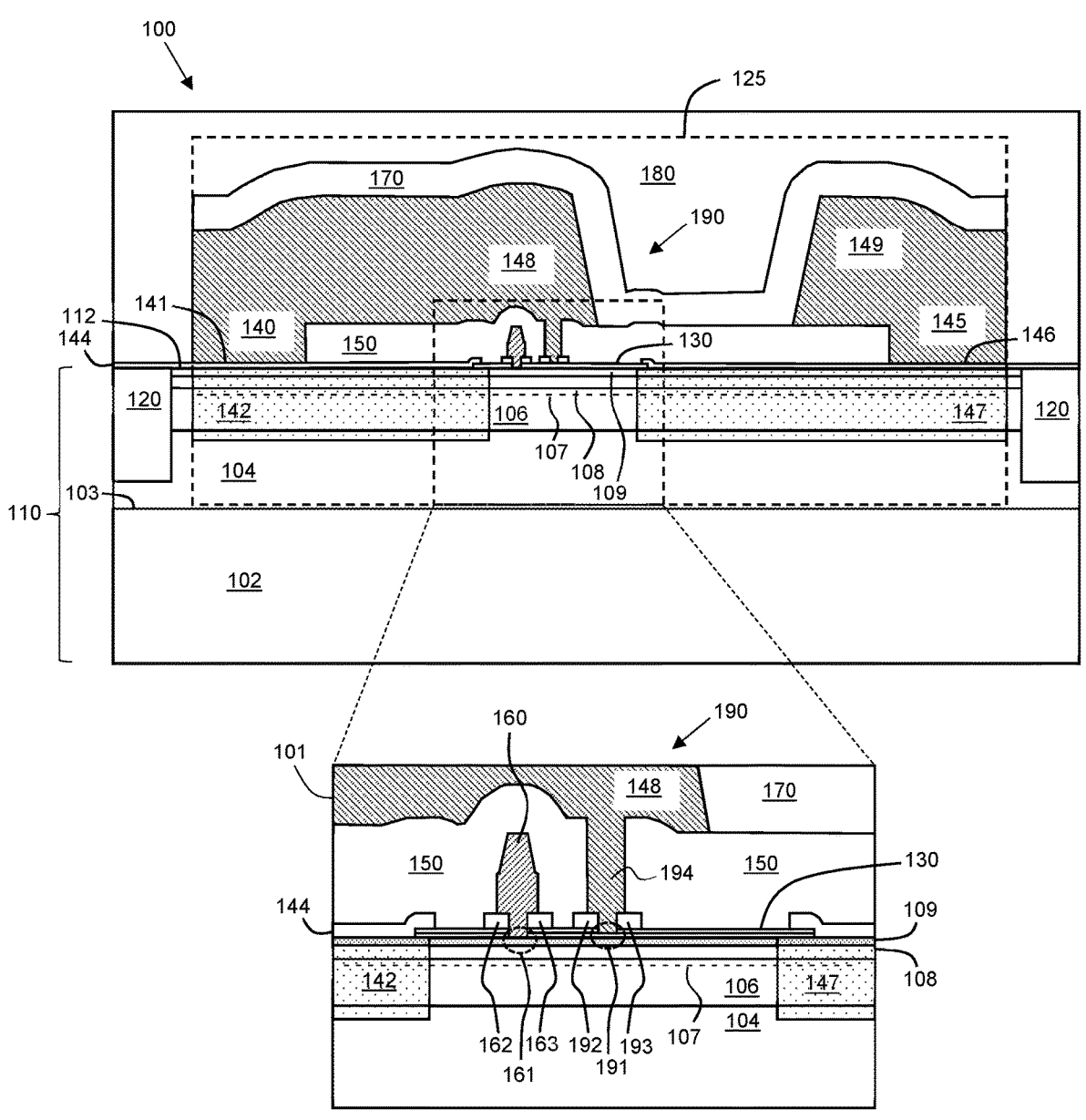
FIG. 1 is a cross-sectional, side view of an exemplary heterojunction field effect transistor (HFET), in accordance with an embodiment.

FIG. 1 is a cross-sectional, side view of an exemplary GaN heterojunction field effect transistor (HFET) device 100, in accordance with an embodiment. The upper image in FIG. 1 shows a comprehensive view of the GaN HFET device 100. In addition, for enhanced understanding, an enlarged view of a portion 101 of the GaN HFET device 100 is shown below the comprehensive view of device 100. Portion 101 corresponds to an embodiment of a transistor structure described in detail later in conjunction with FIG. 3H. As will be explained below in conjunction with FIGS. 4-9, various modifications may be made to the transistor structure depicted in portion 101 of FIG. 1, and those modified embodiments may be incorporated into the comprehensive view of device 100 (i.e., alternate embodiments shown in FIGS. 4H, 5H, 6H, 7H, 8H, 9I may replace portion 101 in FIG. 1). That said, the various details and embodiments discussed below in conjunction with FIG. 1, and particularly the details and embodiments associated with the semiconductor substrate 110 and other features lying outside of portion 101, apply to all of the embodiments depicted in FIGS. 3-9.

The GaN HFET device 100 includes a semiconductor substrate 110, one or more isolation regions 120 and an active region 125. The active region is defined as the portion of device 100 that is located between the isolation regions 120.

Within the active region 125, HFET device 100 includes a source electrode 140 disposed over a source contact 141 and source implant 142, a drain electrode 145 disposed over a drain contact 146 and drain implant 147, a gate electrode 160, gate connected field plate alignment structures 162, 163 ("gate alignment structures"), and a source connected field plate 190 (SFP) that includes a recessed SFP region 191 and SFP alignment structures 192, 193 ("field plate alignment structures"). As will be described in detail below, the SFP region 191 is recessed, with respect to the GFP alignment structures 162, 163 and the SFP alignment structures 192, 193, while still being self-aligned with the gate channel 161 (i.e., the portion of the gate electrode 160 that contacts the upper surface 112 of the semiconductor substrate 110). According to an embodiment, the self-aligned and recessed SFP region 191 is made possible with the inclusion, in device 100, of the SFP alignment structures 192, 193 and a surface passivation layer 130 that is formed from multiple (e.g., 2-3 or more) different dielectric layers (referred to herein as "passivation sub-layers") with different etch properties, as will be described in detail later. The recessed SFP region 191 may result in reduced gate drain capacitance, $C_{GD}$, when compared with devices that lack this feature. The lower gate drain capacitance, $C_{GD}$, in turn, may result in increased gain for the device 100.

The source electrode 140, the drain electrode 145, the gate electrode 160, the GFP alignment structures 162, 163, the recessed SFP region 191, the SFP alignment structures 192, 193, and the surface passivation layer 130 are disposed over an upper surface 112 of the semiconductor substrate 110. Conversely, the source implant 142 and the drain implant 147 represent regions of the semiconductor substrate 110 into which source and drain dopants have been implanted. In an embodiment, GaN HFET device 100 may be configured as a transistor finger wherein the source electrode 140, the drain electrode 145, the gate electrode 160, and the field plate 190 may be configured as elongated elements forming a gate finger. To build up a high power device, multiple instances of GaN HFET device 100 may be implemented in parallel with the drain electrodes 145 all coupled together, the source electrodes 140 all coupled together, and the gate electrodes 160 all coupled together.

In an embodiment, the semiconductor substrate 110 may include a host substrate 102, a buffer layer 104 disposed over the host substrate 102, a channel layer 106 disposed over the buffer layer 104, and a barrier layer 108 disposed over the channel layer 106. In some embodiments, a cap layer 109 is disposed over the channel layer 106, and the cap layer 109 defines the upper surface 112 of the substrate 110. In other embodiments, the cap layer 109 may be excluded, and the barrier layer 108 may define the upper surface 112 of the substrate 110. In the drawings, the cap layer 109 is shaded for enhanced distinguishability from the below-described surface passivation layer 130.

In an embodiment, the host substrate 102 may include silicon carbide (SiC). In other embodiments, the host substrate 102 may include other materials such as sapphire, silicon (Si), GaN, aluminum nitride (AlN), diamond, poly-SiC, silicon on insulator, gallium arsenide (GaAs), indium phosphide (InP), and other substantially insulating or high resistivity materials. A nucleation layer (not shown) may be formed on an upper surface 103 of the host substrate 102 between the buffer layer 104 and the host substrate 102. In an embodiment, the nucleation layer may include AlN. The buffer layer 104 may include a number of group III-N semiconductor layers and is supported by the host substrate 102. Each of the semiconductor layers of the buffer layer 104 may include an epitaxially grown group III-nitride epitaxial layer. The group-III nitride epitaxial layers that make up the buffer layer 104 may be nitrogen (N)-face or gallium (Ga)-face material, for example. In other embodiments, the semiconductor layers of the buffer layer 104 may not be epitaxially grown. In still other embodiments, the semiconductor layers of the buffer layer 104 may include Si, GaAs, InP, or other suitable materials.

In an embodiment, the buffer layer 104 may be grown epitaxially over the host substrate 102. The buffer layer 104 may include at least one AlGaN mixed crystal layer having a composition denoted by $Al_XGa_{1-X}N$ with an aluminum mole fraction, X, that can take on values between 0 and 1. The total thickness of the buffer layer 104, including all of its constituent layers, may be between about 200 angstroms and about 100,000 angstroms, although other thicknesses may be used. A limiting X value of 0 yields pure GaN while a value of 1 yields pure aluminum nitride (AlN). An embodiment may include a buffer layer 104 disposed over the host substrate 102 and nucleation layer (not shown). The buffer layer 104 may include additional $Al_XGa_{1-X}N$ layers. The thickness of the additional $Al_XGa_{1-X}N$ layer(s) may be between about 200 angstroms and about 50,000 angstroms, although other thicknesses may be used. In an embodiment, the additional $Al_XGa_{1-X}N$ layers may be configured as GaN (X=0) where the $Al_XGa_{1-X}N$ is not intentionally doped (NID). The additional $Al_XGa_{1-X}N$ layers may also be configured as one or more GaN layers, where the one or more GaN layers are intentionally doped with dopants that may include iron (Fe), chromium (Cr), carbon (C) or other suitable dopants that render the buffer layer 104 substantially insulating or high resistivity. The dopant concentration may be between about $10^{17}$ cm$^{-3}$ and $10^{19}$ cm$^{-3}$ though other higher or lower concentrations may be used. The additional $Al_XGa_{1-X}N$ layers may be configured with X=0.01 to 0.10 where the $Al_XGa_{1-X}N$ is NID or, alternatively, where the $Al_XGa_{1-X}N$ is intentionally doped with Fe, Cr, C, or other suitable dopant species. In other embodiments (not shown), the additional layers may be configured as a superlattice where the additional layers include a series of alternating NID or doped $Al_XGa_{1-X}N$ layers where the value of X takes a value between 0 and 1. In still other embodiments, the buffer layer 104 may also include one or more indium gallium nitride (InGaN) layers, with composition denoted $In_YGa_{1-Y}N$, where Y, the indium mole fraction, may take a value between 0 and 1. The thickness of the InGaN layer(s) may be between about 50 angstroms and about 2,000 angstroms, although other thicknesses may be used.

In an embodiment, a channel layer 106 may be formed over the buffer layer 104. The channel layer 106 may include one or more group III-N semiconductor layers and may be supported by the buffer layer 104. The channel layer 106 may include an $Al_XGa_{1-X}N$ layer where X takes on values between 0 and 1. In an embodiment, the channel layer 106 is configured as GaN (X=0), although other values of X may be used without departing from the scope of the inventive subject matter. The thickness of the channel layer 106 may be between about 50 angstroms and about 10,000 angstroms, although other thicknesses may be used. The channel layer 106 may be NID or, alternatively, may include Si, germanium (Ge), C, Fe, Cr, or other suitable dopants. The dopant concentration may be between about $10^{15}$ cm$^{-3}$ and about $10^{19}$ cm$^{-3}$, although other higher or lower concentrations may be used. In other embodiments, the channel layer 106 may include NID or doped $In_YGa_{1-Y}N$, where Y, the indium mole fraction, may take a value between 0 and 1.

A barrier layer 108 may be formed over the channel layer 106, in accordance with an embodiment. The barrier layer 108 may include one or more group III-N semiconductor layers and is supported by the channel layer 106. In some embodiments, the barrier layer 108 may have a larger bandgap and larger spontaneous polarization than the channel layer 106, and, when the barrier layer 108 is in direct contact with the channel layer 106, a channel 107 is created in the form of a two-dimensional electron gas (2-DEG) within the channel layer 106 near the interface between the channel layer 106 and the barrier layer 108. In addition, strain between the barrier layer 108 and channel layer 106 may cause additional piezoelectric charge to be introduced into the 2-DEG and channel 107. The barrier layer 108 may include at least one NID $Al_XGa_{1-X}N$ layer where X takes on values between 0 and 1. In some embodiments, X may take a value of 0.1 to 0.35, although other values of X may be used. The thickness of the barrier layer 108 may be between about 50 angstroms and about 1000 angstroms, although other thicknesses may be used. The barrier layer 108 may be NID or, alternatively, may include Si, Ge, C, Fe, Cr, or other suitable dopants. The dopant concentration may be between about $10^{16}$ $cm^{-3}$ and $10^{19}$ $cm^{-3}$ though other higher or lower concentrations may be used. In an embodiment, an additional AlN interbarrier layer (not shown) may be formed between the channel layer 106 and the barrier layer 108, according to an embodiment. The AlN interbarrier layer may increase the channel charge and improve the electron confinement of the resultant 2-DEG. In other embodiments, the barrier layer 108 may include indium aluminum nitride (InAlN) layers, denoted $In_YAl_{1-Y}N$, where Y, the indium mole fraction may take a value between about 0.1 and about 0.2, although other values of Y may be used. In the case of an InAlN barrier, the thickness of the barrier layer 108 may be between about 30 angstroms and about 1000 angstroms, although other thicknesses may be used. In the case of using InAlN to form the barrier layer 108, the InAlN may be NID or, alternatively, may include Si, Ge, C, Fe, Cr, or other suitable dopants. The dopant concentration may be between about $10^{16}$ $cm^{-3}$ and about $10^{19}$ $cm^{-3}$, although other higher or lower concentrations may be used.

In an embodiment illustrated in FIG. 1, a cap layer 109 may be formed over the barrier layer 108. The cap layer 109 may present a stable surface for the semiconductor substrate 110 and may protect the surface of the semiconductor substrate 110 from chemical and environmental exposure incident to wafer processing. The cap layer 109 may include one or more group III-N semiconductor layers and is supported by the barrier layer 108. In an embodiment, the cap layer 109 is GaN. The thickness of the cap layer 109 may be between about 5 angstroms and about 100 angstroms though other thicknesses may be used. The cap layer 109 may be NID or, alternatively, may include Si, Ge, C, Fe, Cr, or other suitable dopants. The dopant concentration may be between about $10^{16}$ $cm^{-3}$ and $10^{19}$ $cm^{-3}$, although other higher or lower concentrations may be used.

Without departing from the scope of the inventive subject matter, it should be appreciated that the choice of materials and arrangement of layers to form the semiconductor substrate 110 is exemplary. It should be appreciated that the inclusion of the host substrate 102, the buffer layer 104, the channel layer 106, the barrier layer 108, and the cap layer 109 into the semiconductor substrate 110 is exemplary, and that the function and operation of the various layers may be combined and may change depending on the materials used in any specific embodiment. For example, in some embodiments, the cap layer 109 may be omitted. In such embodiments, the barrier layer 108 defines the upper surface 112 of the substrate 110.

In other embodiments using N-polar materials, the channel layer 106 may be disposed over the barrier layer 108 to create a 2-DEG and channel 107 directly beneath the cap layer 109 and the gate electrode 160. Still further embodiments may include semiconductor layers formed from materials including GaAs, gallium oxide ($Ga_2O_3$) aluminum gallium arsenide (AlGaAs), indium gallium arsenide (InGaAs), and aluminum indium arsenide (AlInAs) to form the semiconductor substrate 110.

One or more isolation regions 120 may be formed in the semiconductor substrate 110 to define an active region 125 above and along the upper surface 103 of the host substrate 102, according to an embodiment. The isolation regions 120 may be formed via an implantation procedure configured to damage the epitaxial and/or other semiconductor layers to create high resistivity regions of the semiconductor substrate 110 (i.e., rendering the semiconductor substrate 110 high resistivity or semi-insulating in those high resistivity regions), while leaving the crystal structure intact in the active region 125. In other embodiments, the isolation regions 120 may be formed by removing one or more of the epitaxial and/or other semiconductor layers of the semiconductor substrate 110, rendering the remaining layers of the semiconductor substrate 110 semi-insulating and leaving behind active region "mesas" surrounded by high resistivity or semi-insulating isolation regions (not shown). In still other embodiments, the isolation regions 120 may be formed by removing one or more of the epitaxial and/or other semiconductor layers of the semiconductor substrate 110, and then using ion implantation to damage and further enhance the semi-insulating properties of the remaining layers of the semiconductor substrate 110 and leaving behind active region "mesas" surrounded by high resistivity or semi-insulating isolation regions 120 that have been implanted (not shown).

In an embodiment, a surface passivation layer 130 is formed over the active region 125 and isolation regions 120. In various embodiments, the surface passivation layer 130 is formed from multiple passivation sub-layers (e.g., layers 131, 132, 133, FIGS. 3-9), each of which is formed from a different dielectric material. At least some of the passivation sub-layers have different etch properties which, as will be described in more detail later, enable the formation of a recessed SFP region 191. For example, the various materials from which the passivation sub-layers may be formed include, but are not limited to, silicon dioxide ($SiO_2$), silicon nitride ($Si_3N_4$ or other stoichiometries), silicon oxynitride (SiON in various stoichiometries), aluminum oxide ($Al_2O_3$), aluminum nitride (AlN), and hafnium oxide ($HfO_2$), though other substantially insulating materials may be used.

In an embodiment, the source electrode 140 and the drain electrode 145 are formed over source and drain implants 142, 147, which are formed in semiconductor substrate 110 in the active region 125. In some embodiments, ion implantation may be used to form the source and drain implants 142, 147, and these implants 142, 147 extend between opposite ends of the channel 107 and the upper surface 112 of the semiconductor substrate 110.

Source and drain contacts 141, 146 are formed on the upper surface 112 of the substrate over the source and drain implants 142, 147 prior to forming the source and drain electrodes 140, 145, in various embodiments. For example, the source and drain contacts 141, 146 may be formed on the upper surface 112 through openings in the surface passivation layer 130. The source and drain contacts 141, 146 may contact the cap layer 109, in some embodiments, or may contact the barrier layer 108 if the cap layer 109 is excluded. In some embodiments, the source and drain contacts 141, 146 may be recessed into the semiconductor substrate 110.

In an embodiment, the source and drain contacts 141, 146 are formed from an etchable, patterned conductive layer 144, which may include one or more layers of titanium (Ti), titanium tungsten (TiW), titanium aluminum (TiAl), titanium-tungsten nitride (TiWN) or other materials that are suitable for forming an Ohmic contact in conjunction with the source and drain implants 142, 147. Accordingly, layer 144 alternatively may be referred to herein as Ohmic metal layer 144. In conjunction with the source and drain implants 142, 147, conductive layer 144 forms an Ohmic contact with the channel 107. As will be described in more detail in conjunction with FIGS. 3-9, the GFP alignment structures 162, 163 and SFP alignment structures 192, 193 may be formed from the same conductive layer 144 as the source and drain contacts 141, 146. In other embodiments, the Ohmic drain and source contacts 141, 146 may be formed using a different conductive layer of a suitable material.

The source and drain electrodes 140, 145 may be formed from a stack of multiple conductive layers, and the portions of the conductive stack corresponding to the source and drain electrodes 140, 145 may be referred to as source metallization and drain metallization, respectively. In some embodiments, the multi-layer stack used to form the source electrode 140 and the drain electrode 145 may include, for example, one or more layers of Ti, TiW, TiAl, TiWN, gold (Au), titanium-aluminum-gold (TiAlAu), Al, molybdenum (Mo), nickel (Ni), Si, Ge, platinum (Pt), tantalum (Ta), combinations of these materials, or other suitable materials.

Additional dielectric layers 150 (e.g., layers 151, 154, FIG. 3G) are disposed over the surface passivation layer 130, according to various embodiments. For example, the additional dielectric layers 150 may be formed from one or more suitable materials including silicon dioxide ($SiO_2$), tetraethyl orthosilicate (TEOS), organo-silicate glass, porous silicon dioxide, silicon nitride ($Si_3N_4$), silicon oxynitride (SiON), aluminum oxide ($Al_2O_3$), aluminum nitride (AlN), and hafnium oxide ($HfO_2$), though other substantially insulating materials may be used. In an embodiment, the additional dielectric layers 150 may be formed from low-k dielectric material(s). As used herein, the term, "low-k dielectric material" refers to a dielectric material having a dielectric constant below about 5.0. In an embodiment, the dielectric constant of the surface passivation layer 130 may exceed the dielectric constant of the additional dielectric layers 150. In other words, the surface passivation layer 130 may be formed from high-k dielectric materials. As used herein, the term, "high-k dielectric material" refers to a dielectric material having a dielectric constant above about 5.0. The lower dielectric constant for the additional dielectric layers 150, which as mentioned above may be realized using low-k dielectric material(s), may reduce the parasitic capacitance between the gate electrode 160 and the source metallization 148 and field plate structure 190, and between the drain electrode 145 and field plate 190, in some embodiments.

In an embodiment, the gate electrode 160 may be formed over the semiconductor substrate 110 between the source electrode 140 and the drain electrode 145 in the active region 125. As will be described in detail in conjunction with FIGS. 3-9, to form the gate electrode 160, an opening may be formed in the surface passivation layer 130 between the source electrode 140 and the drain electrode 145 to enable the gate electrode 160 to contact the upper surface 112 of the semiconductor substrate 110. The area of contact between the gate electrode 160 and the upper surface 112 of the substrate 110 is referred to herein as the "gate channel" 161, and a Schottky gate is formed in the gate channel 161. In an embodiment, the gate electrode 160 may be characterized by a gate length where the gate electrode 160 contacts the substrate surface 112, and the gate length may be between about 0.05 microns and about 1 micron, in various embodiments. In other embodiments, the gate length may be between about 0.02 microns and about 5 microns, although other suitable dimensions may be used.

Essentially, the gate electrode 160 is configured to control current flow through the channel 107 (i.e., between the source and drain contacts 142, 147) during operation of the device 100. More specifically, changes to the electric potential applied to the gate electrode 160 may shift the quasi Fermi level for the barrier layer 108 with respect to the quasi Fermi level for the channel layer 106 to thereby modulate the electron concentration in the channel 107 under the gate electrode 160. For a low-loss, Schottky gate electrode 160, one or more Schottky materials such as Ni, palladium (Pd), Pt, iridium (Ir), or Copper (Cu), may be combined with one or more low stress conductive materials such as Au, Al, Cu, poly Si, or other suitable material(s) in a metal stack to form the gate electrode 160, according to an embodiment.

Without departing from the scope of the inventive subject matter, numerous other embodiments may be realized. The exemplary embodiment of FIG. 1 depicts the gate electrode 160 as being disposed over the semiconductor substrate 110. In other embodiments (not shown), the gate electrode 160 may be recessed through the cap layer 109 and extend partially into the barrier layer 108, increasing the electrical coupling of the gate electrode 160 to the channel 107 through the barrier layer 108. In other embodiments (not shown), the cap layer 109 may be omitted and the gate electrode 160 may contact the barrier layer 108 directly. In still other embodiments, the gate electrode 160 may be disposed over a gate insulator (e.g., gate insulator 431, FIGS. 4E, 5E, 8E) that may be formed between the gate electrode 160 and the semiconductor substrate 110 to form a metal-insulator semiconductor field effect transistor (MISFET) device. Example embodiments that include MISFETs are described in conjunction with FIGS. 4, 5, and 8.

As discussed previously, a conductive source-connected field plate 190 (SFP) is formed over the additional dielectric layers 150, adjacent the gate electrode 160, and between the gate electrode 160 and the drain electrode 145. As used herein, the term "adjacent to" means next to, in the horizontal direction in FIGS. 1 and 3-9. In an embodiment, the SFP 190 may include a recessed SFP region 191 formed laterally adjacent the gate electrode 160 and in contact with a portion of the surface passivation layer 130. In addition, the field plate 190 includes source-side and drain-side SFP alignment structures 192, 193, respectively, on opposite sides of the recessed SFP region 191. During operation of the device 100, the field plate 190 may be configured to reduce the electric field and feedback capacitance, $C_{GD}$, between the gate electrode 160 and the drain electrode 145. According to an embodiment, a conductive field plate via 194 electrically connects the SFP region 191 and the SFP alignment structures 192, 193 to source metallization 148, which extends between the conductive field plate via 194 over the gate 160 to the source electrode 140. In various embodiments, the field plate 190 may be formed using one or more conductive layers that are also used to form the source and drain electrodes 140, 145. For example, the field plate 190 may be formed from Ti, Au, Al, Mo, Ni, Si, Ge, Pt, Ta, combinations of these materials, or other suitable materials. In other embodiments, the one or more conductive layers used to form the field plate 190 may include TiW, TiAl, or TiWN.

In various embodiments, additional dielectric and metal layers may be formed over and adjacent to the GaN HFET device 100. For example, in FIG. 1, additional passivation layers 170, 180 may be formed over dielectric layers 150 and the metallization for the source and drain electrodes 140, 145. Still other additional dielectric and metal layers may include additional passivation layers and interconnect metallization, and additional active devices (e.g. additional GaN HFETs) and additional circuitry, also may be formed along with device 100.

Figure 5A:
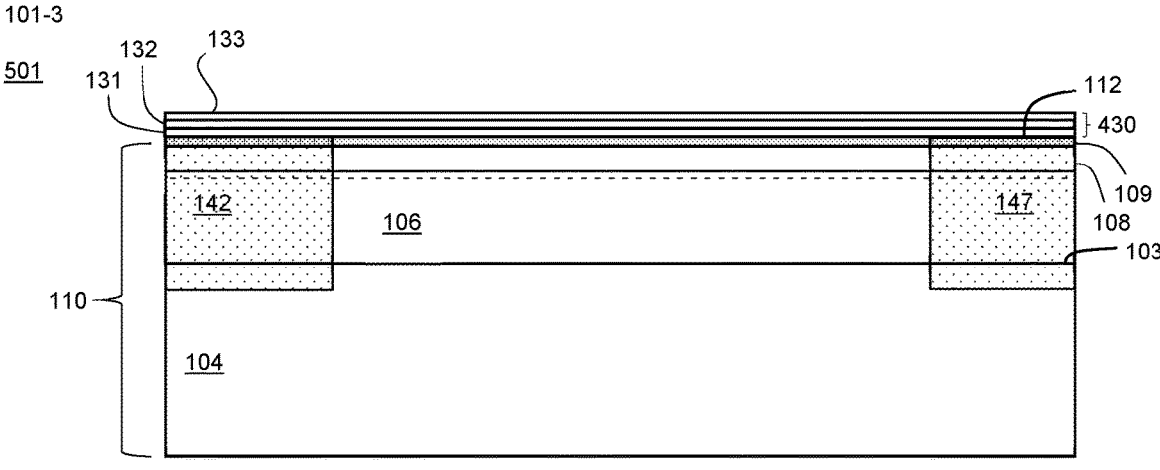
FIGS. 5A, 5B, 5C, 5D, 5E, 5F, 5G, and 5H (collectively FIG. 5) are cross-sectional, side views of another embodiment of an HFET device during a sequence of fabrication steps, according to another fabrication embodiment.
Figure 5B:
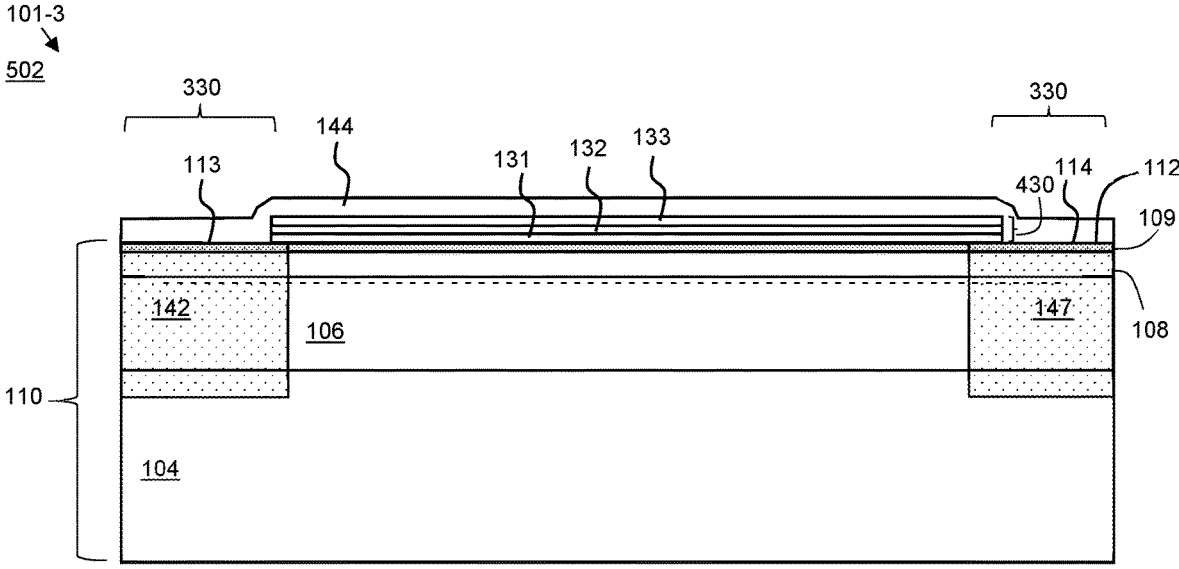
Figure 5C:
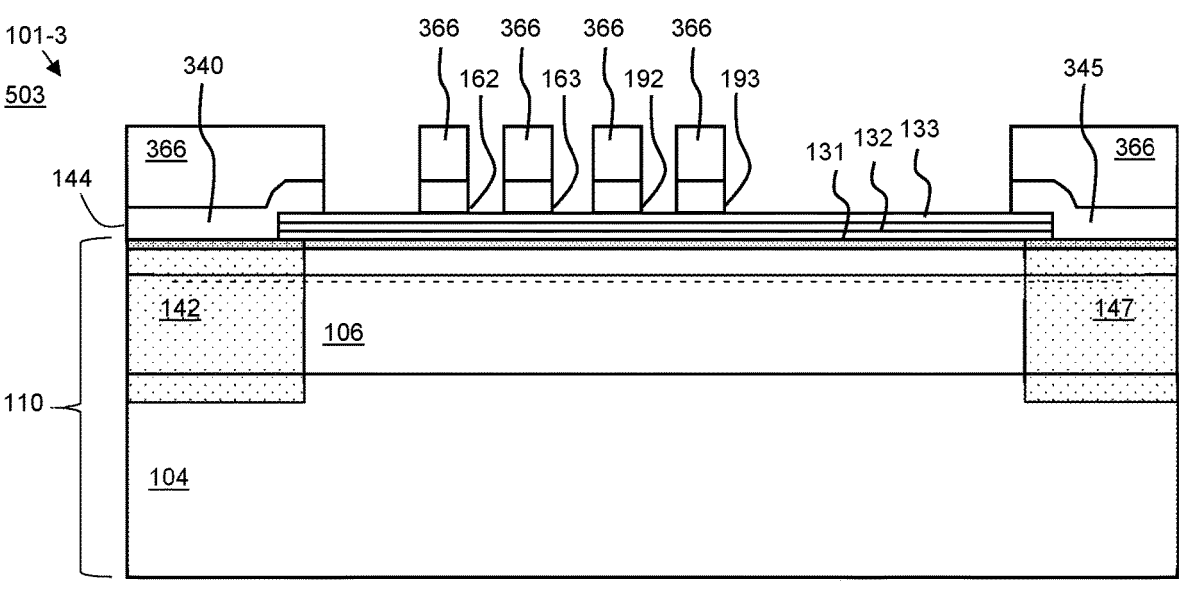
Figure 5D:
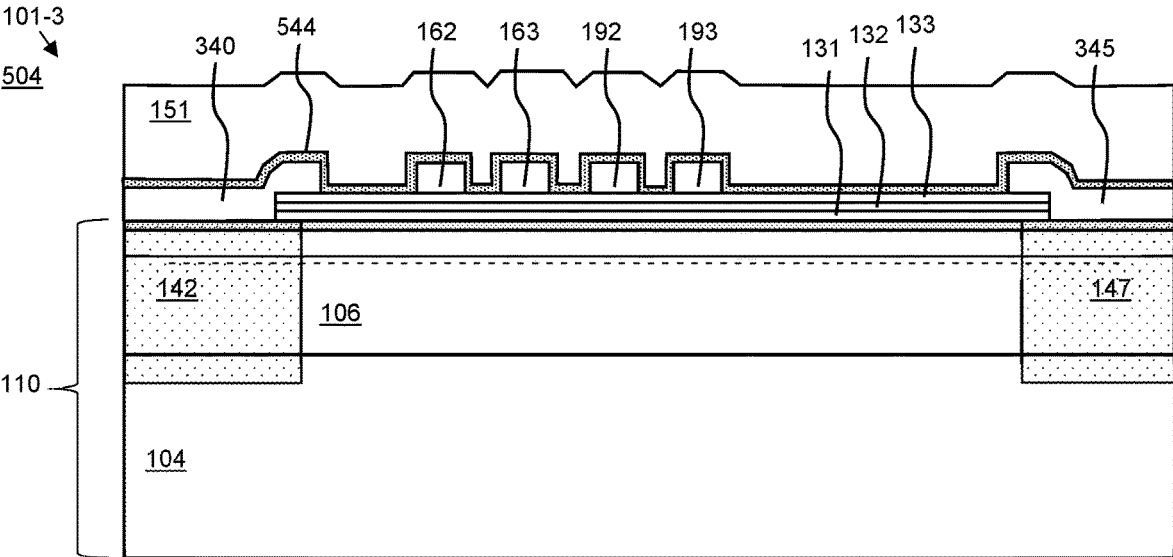
Figure 5E:
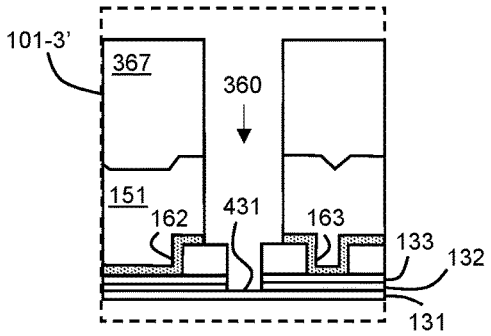
Figure 5E:
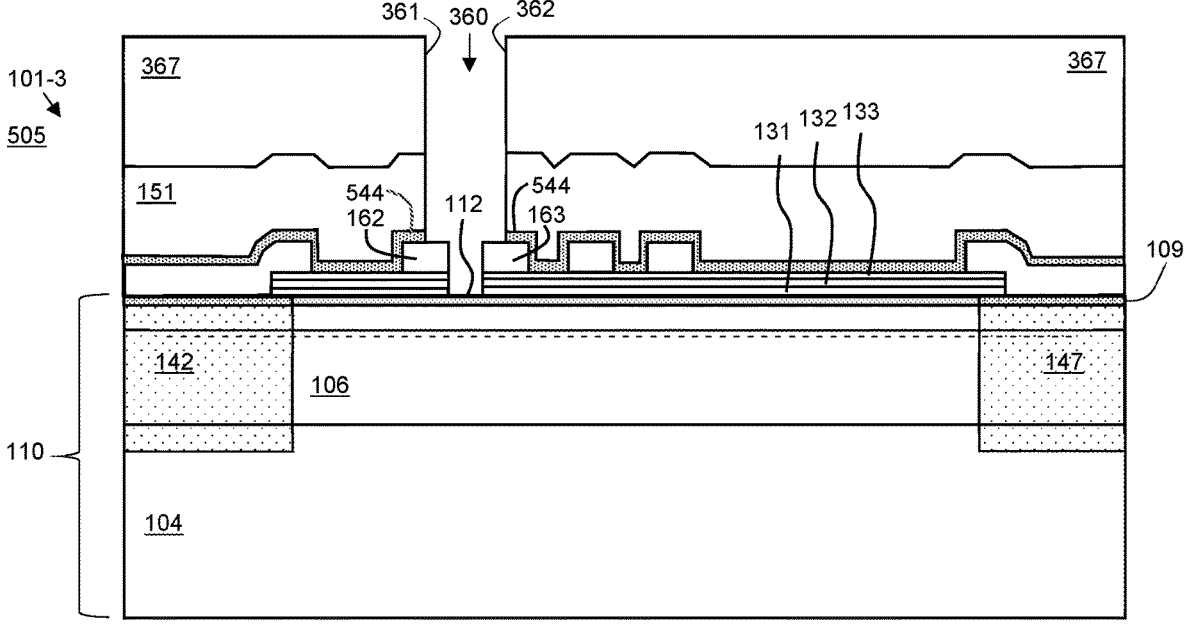
Figure 5F:
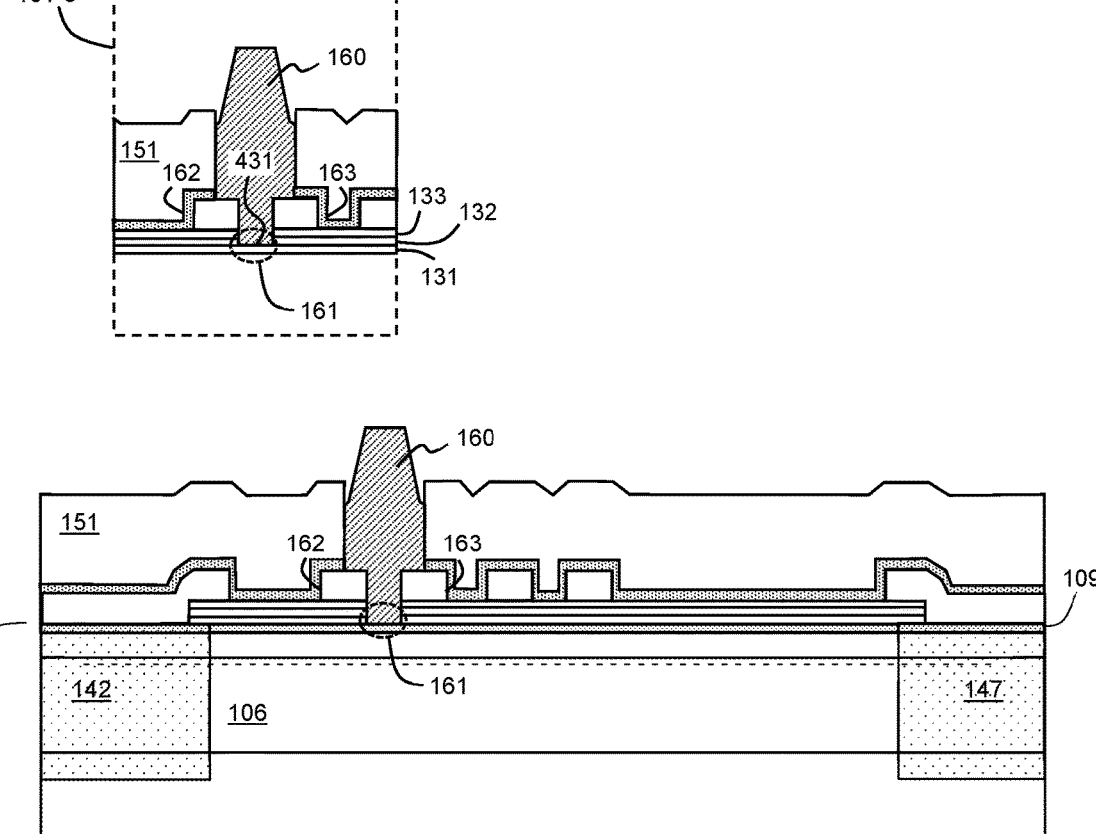
Figure 5G:
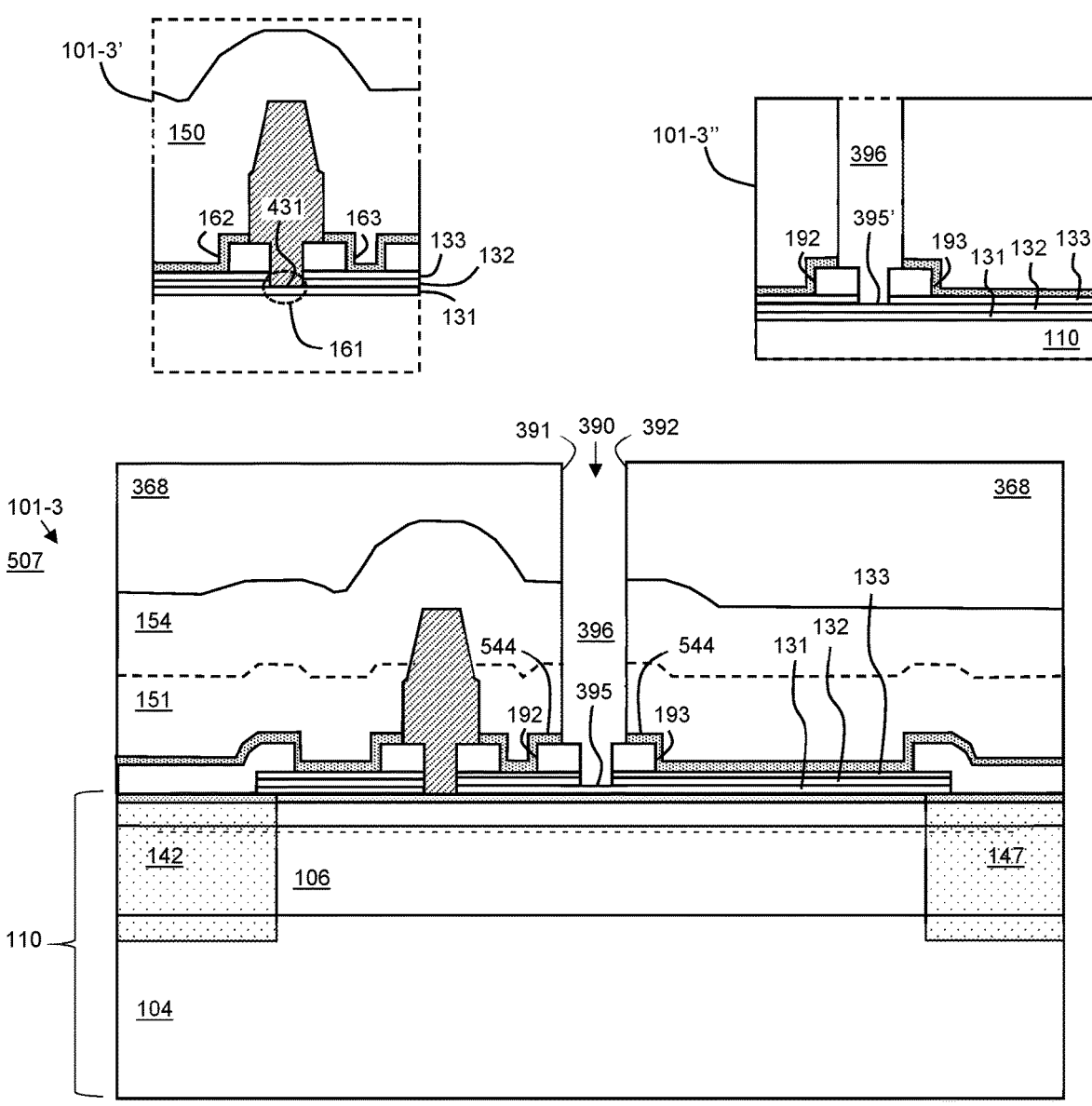
Figure 5H:
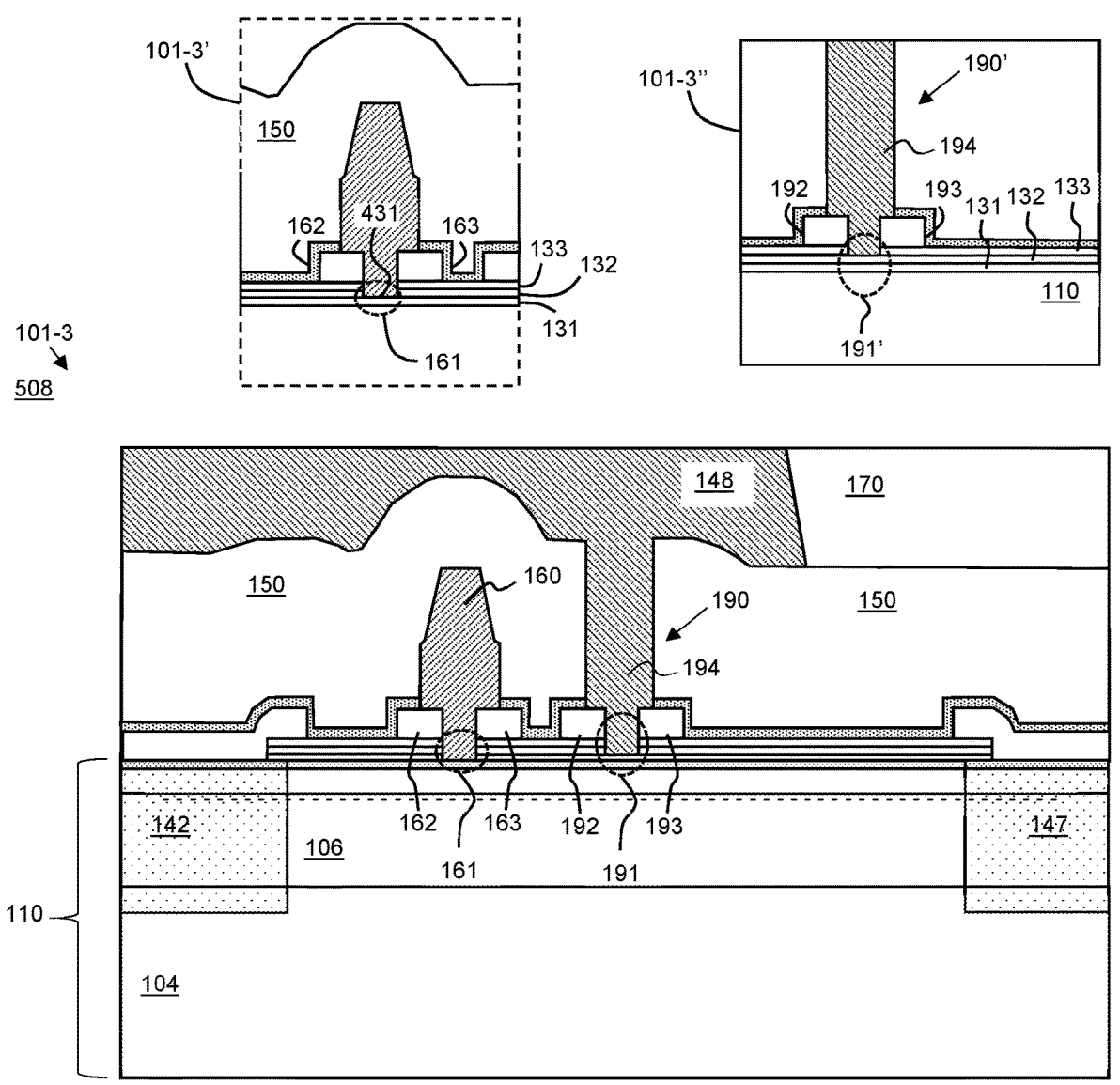
Figure 6A:
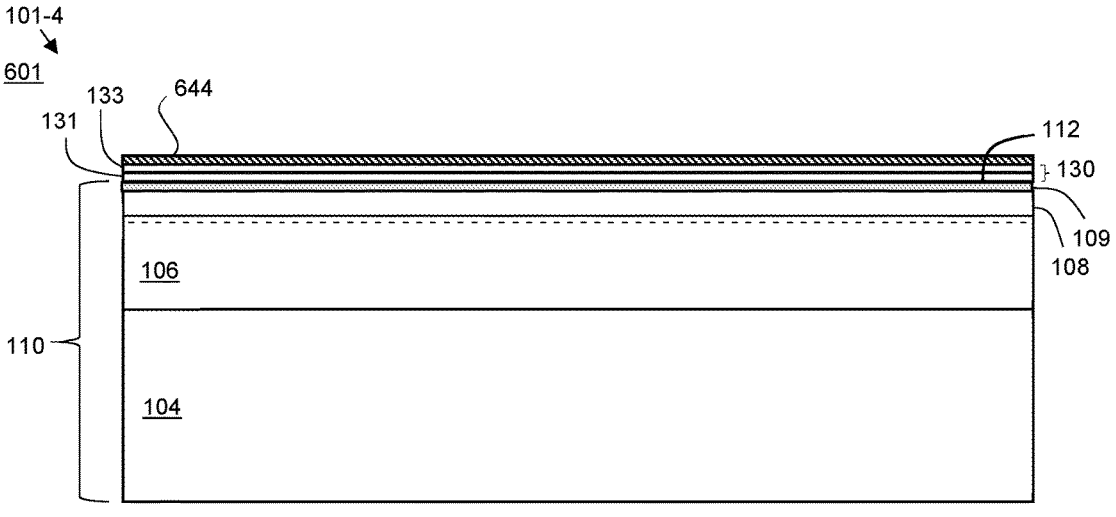
Figures 1, 6B:
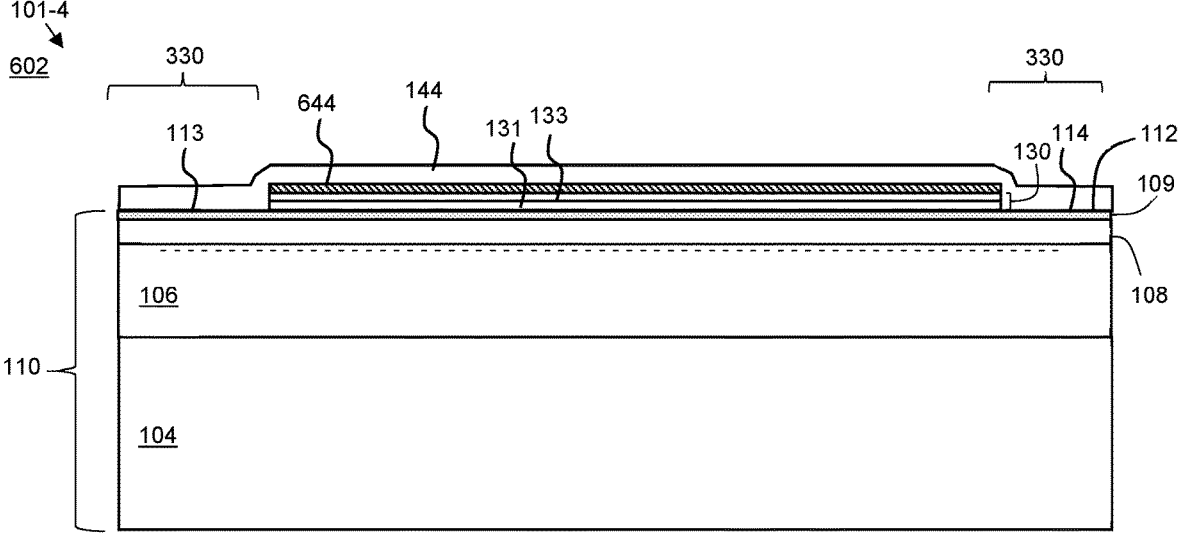
Figures 1, 6C:
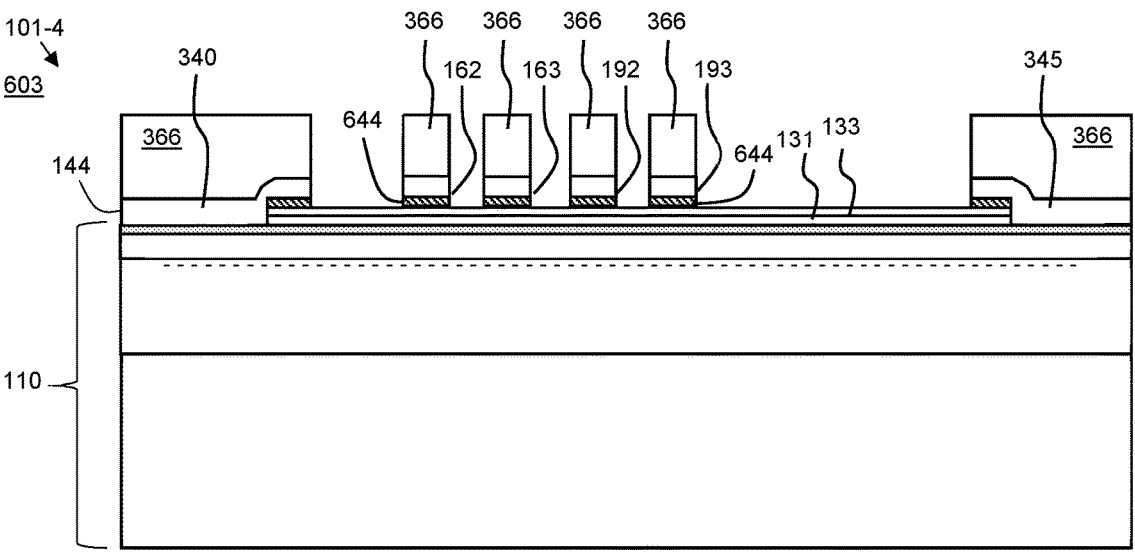
Figures 2, 6B:
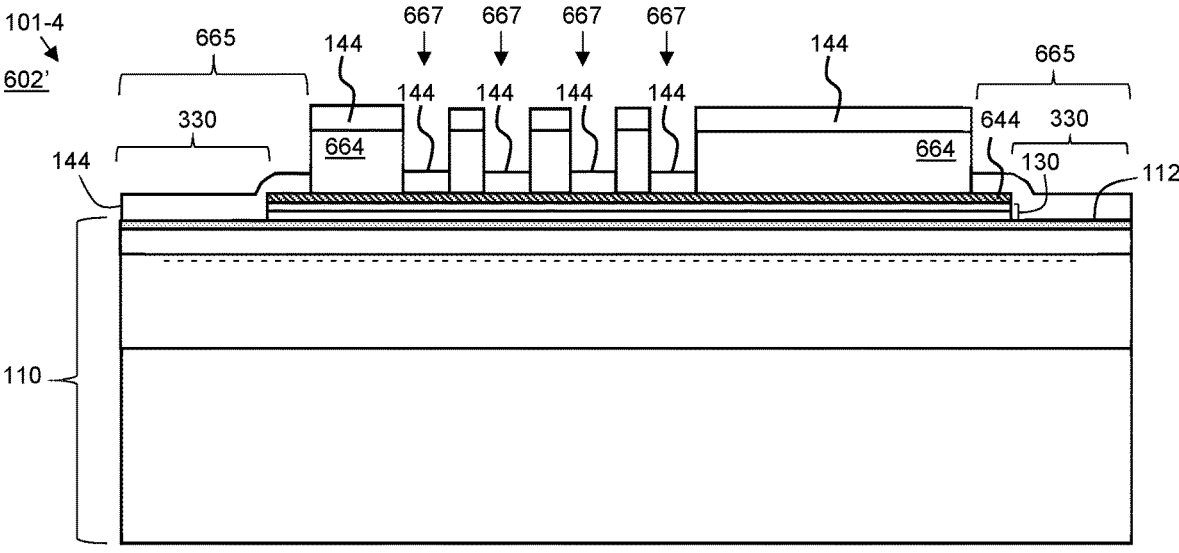
Figures 2, 6C:
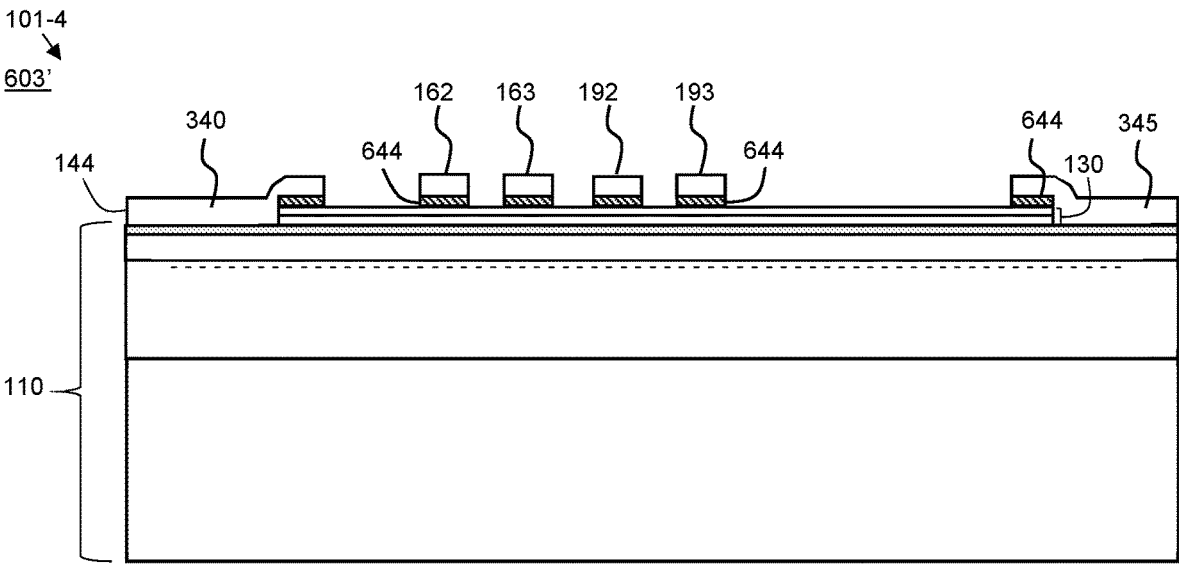
Figure 6D:
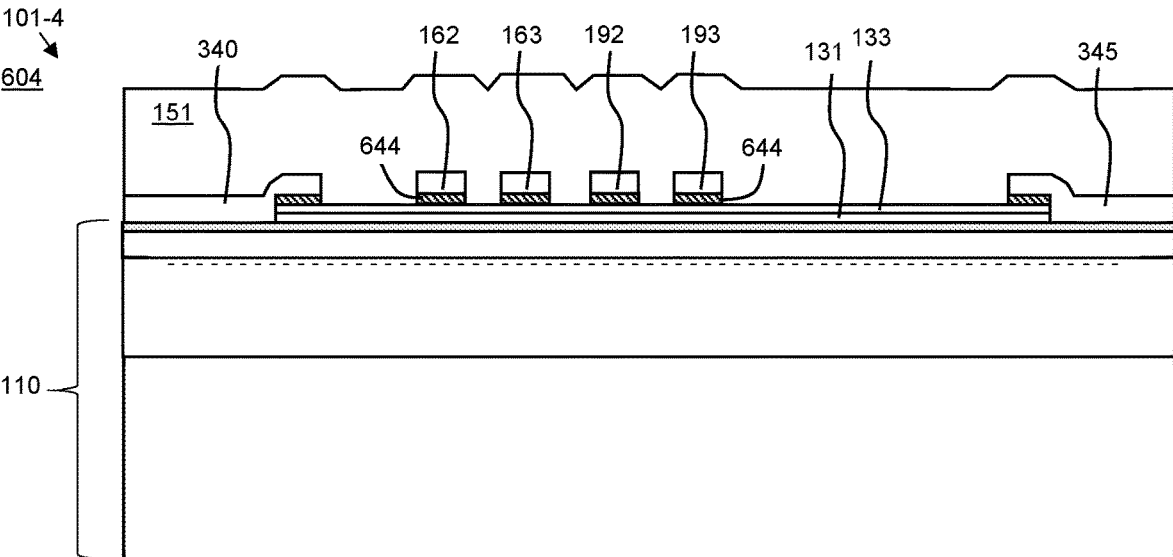
Figure 6E:
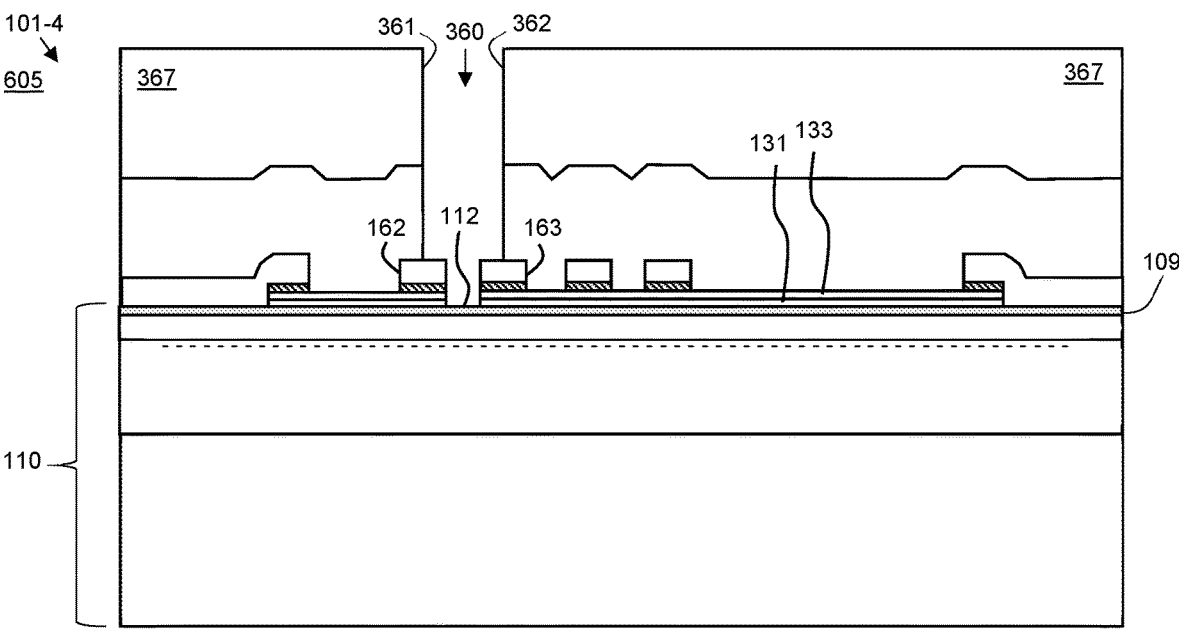
Figure 6F:
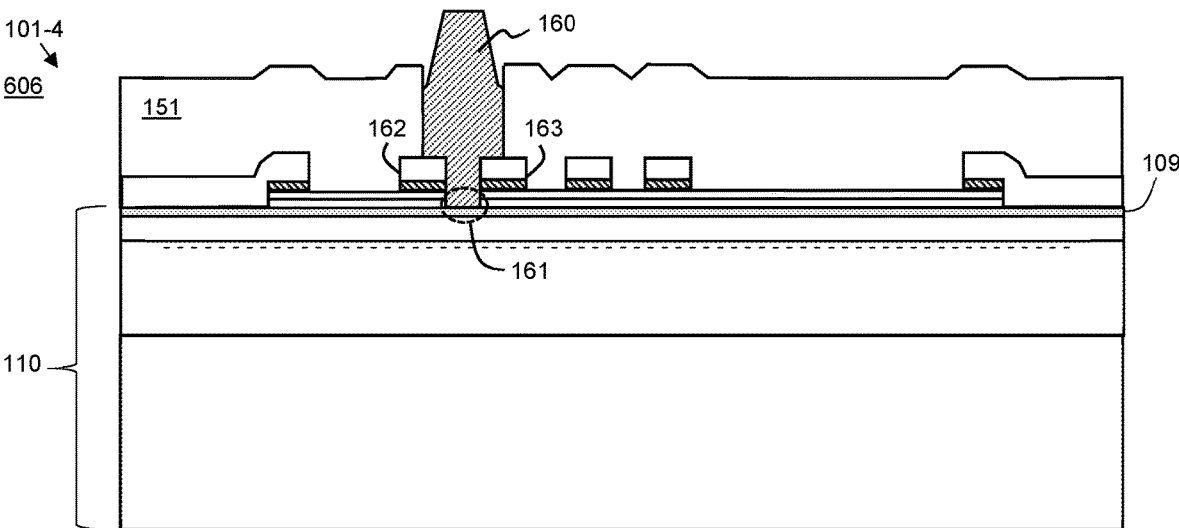
Figure 6G:
Figure 6G:
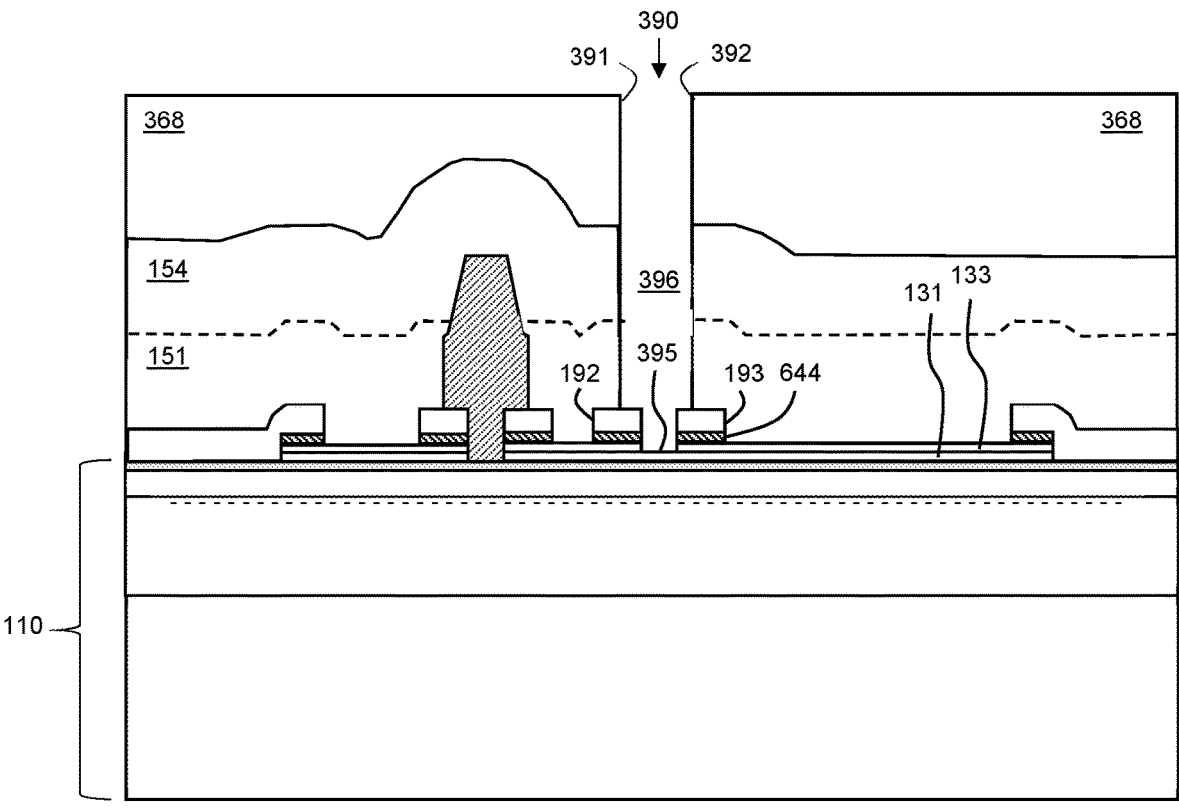
Figure 6H:
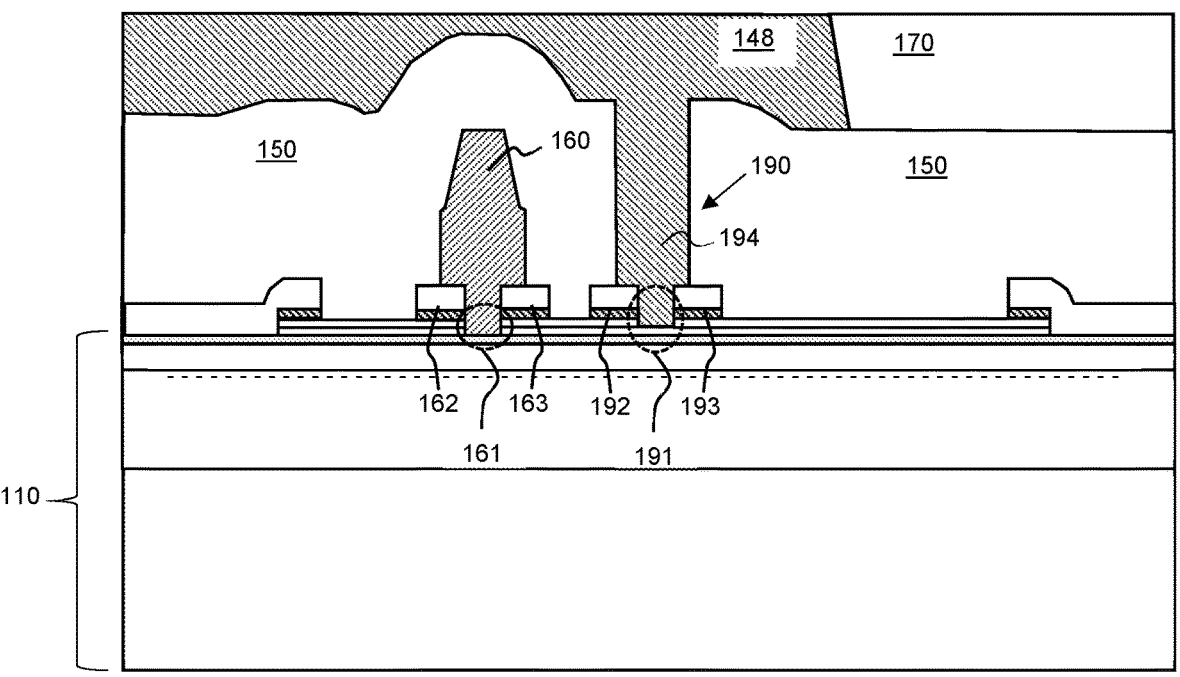

FIG. 2 is a process flow diagram describing embodiments of methods for fabricating the GaN HFET device of FIG. 1, as well as alternate embodiments of methods for fabricating alternate embodiments of GaN HFET devices (e.g., devices 400, 500, 600, 700, 800, 900, FIGS. 4-9). For enhanced understanding, FIG. 2 should be viewed in conjunction with FIGS. 3-9, where each of FIGS. 3-9 depict process steps corresponding to the fabrication of a different embodiment of a GaN HFET device. It should be noted here that FIGS. 3-9 only depict those portions 101-1, 101-2, 101-3, 101-4, 101-5, 101-6, and 101-7 (FIGS. 3-9) of GaN HFET devices in which the gate and field plate are formed so that the important and enlarged details of the various fabrication steps can be easily seen. It should be understood that the depicted portions 101-1, 101-2, 101-3, 101-4, 101-5, 101-6, and 101-7 of GaN HFET devices in FIGS. 3-9 essentially may be swapped out for portion 101 in the device 100 shown in FIG. 1. Accordingly, although FIGS. 3-9 only depict portions 101-1, 101-2, 101-3, 101-4, 101-5, 101-6, and 101-7 of GaN HFET devices, those GaN HFET devices also would include other adjacent device structures, such as those shown to the left and right of portion 101 in FIG. 1 (e.g., the other GaN HFET devices would include host substrate 102, source and drain implants 142, 147, source and drain electrodes 140, 145, source and drain contacts 141, 146, isolation regions 120, and so on).

Embodiment 1 (FIGS. 1 and 3A-H)

FIG. 2 will first be used to describe fabrication steps for the embodiment of GaN HFET 100 shown in FIG. 1. These fabrication steps are shown in detail in FIGS. 3A-H (collectively FIG. 3). More specifically, FIG. 3, which includes FIGS. 3A-H includes cross-sectional, side views of an embodiment of portion 101-1 of GaN HFET device 100 during a sequence of fabrication steps. It should be noted that portion 101-1 corresponds to portion 101 of FIG. 1, where the "–1" indicates that this is a first embodiment of portion 101.

Referring initially to FIGS. 1 and 2, fabrication of GaN HFET device 100 begins, in block 202, by providing a semiconductor substrate 110 in which Ohmic source and drain implants (e.g., source and drain implants 142, 147) have already been formed. In at least one embodiment, providing the semiconductor substrate 110 may include providing a host substrate 102 and forming number of semiconductor layers on or over the host substrate 102. For example, the host substrate 102 may include SiC, or may include other materials such as sapphire, Si, GaN, AlN, diamond, poly-SiC, silicon on insulator, GaAs, InP, or other substantially insulating or high resistivity materials. Forming the semiconductor layers may include forming a nucleation layer (not shown) on or over an upper surface 103 of the host substrate 102, forming a buffer layer 104 on or over the nucleation layer, forming a channel layer 106 on or over the buffer layer 104, forming a barrier layer 108 on or over the channel layer 106, and optionally forming a cap layer 109 on or over the barrier layer 108. As discussed previously, embodiments of the buffer layer 104, the channel layer 106, the barrier layer 108, and the cap layer 109 may include materials selected from AlN, GaN, AlGaN, InAlN, InGaN, or other suitable materials. The semiconductor layers 104, 106, 108, and 109 may be grown using one of metal-organo chemical vapor deposition (MOCVD), molecular beam epitaxy (MBE), hydride-vapor phase epitaxy (HVPE) or a combination of these techniques, although other suitable techniques may alternatively be used.

Embodiments of the method may optionally include forming doped (e.g., ion-implanted) source and drain regions 142 and 147 (FIG. 1). Forming source and drain regions 142 and 147 may include forming a sacrificial dielectric layer (e.g., selected from $Si_3N_4$, $Al_2O_3$, $SiO_2$, AlN, and $HfO_2$) on or over the semiconductor substrate 110. An implant mask may then be formed on the sacrificial dielectric layer, and a dopant species (e.g., selected from one or more of Si, Ge, 0, or other suitable n-type dopant(s)) is implanted through openings in the implant mask into the semiconductor substrate 110 to form source and drain implant regions within the semiconductor substrate. The implant mask may be removed (e.g., using one or more conventional wet chemical and plasma ashing technique(s)) before activating the dopant species in the implant regions to complete the formation of the source and drain regions 142 and 147 within the semiconductor substrate 110. The implant regions then may be activated (e.g., by annealing the semiconductor substrate 110) to form the source and drain regions 142, 147, and the sacrificial dielectric layer is removed (e.g., using wet or dry etching).

Figure 3A:
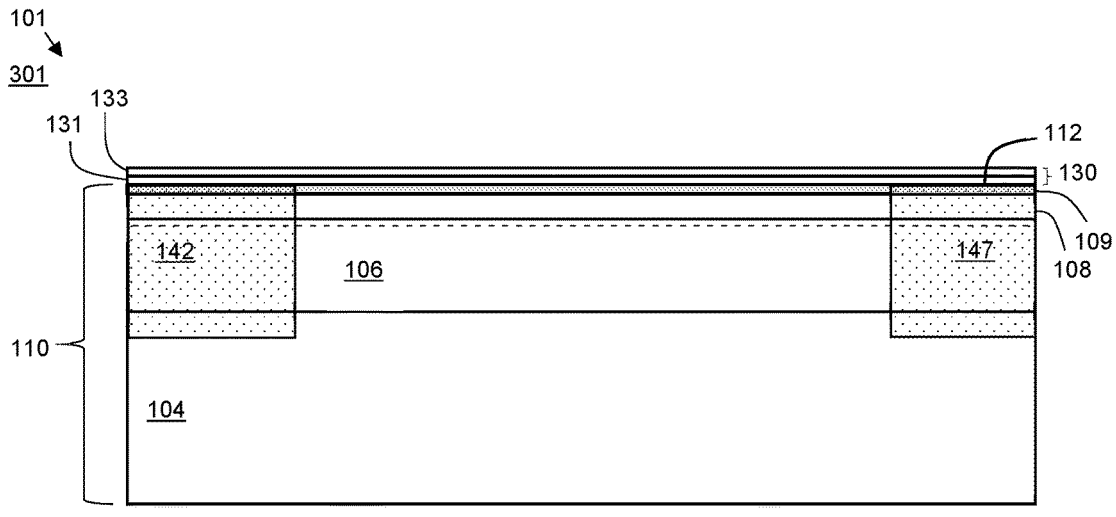
FIGS. 3A, 3B, 3C, 3D, 3E, 3F, 3G, and 3H (collectively FIG. 3) are cross-sectional, side views of an embodiment of an HFET device during a sequence of fabrication steps, according to a fabrication embodiment.

Referring now to FIGS. 2 and 3A, in block 204 and fabrication stage 301 (FIG. 3A), a surface passivation layer 130 is formed on the upper surface 112 of the semiconductor substrate 110. According to an embodiment, the surface passivation layer 130 includes at least two passivation sub-layers 131, 133, which may be referred to as lower and upper passivation sub-layers 131, 133, respectively. In some embodiments, such as that shown in FIG. 3A, surface passivation layer 130 includes only two passivation sub-layers 131, 133. In an alternate embodiment (e.g., as described in conjunction with FIG. 4), surface passivation layer 130 may include a third passivation sub-layer (e.g., layer 132, FIG. 4A). According to an embodiment, the surface passivation layer 130 may have a total thickness (including the thicknesses of all layers 131-133) of between about 200 angstroms and about 1000 angstroms, although other thicknesses may be used.

The lower and upper passivation sub-layers 131, 133 are formed from different dielectric materials that enable etch selectivity (i.e., layers 131 and 133 are etchable using different etch chemistries). In particular, as described below, the lower passivation sub-layer 131 will function as an etch stop when etching through the upper passivation sub-layer 133 using a first etch chemistry. In other words, one or more etch chemistries that are used, as described later, to etch the upper passivation sub-layer 133 have a high etch selectivity between the materials of the upper and lower passivation sub-layers 133, 131. As is understood by those of skill in the art, etch selectivity is the ratio of etch rates between materials. In the present case, the etch selectivity for an etchant used to etch the upper passivation sub-layer 133 may be defined as the ratio between the etch rate for the material of the upper passivation sub-layer 133 ("etch rate 133") to the etch rate for the material of the lower passivation sub-layer 131 ("etch rate 131") (i.e., the etch selectivity for the etchant used to etch the upper passivation sub-layer 133 equals etch rate 133/etch rate 131). According to various embodiments, the materials of layers 131, 133 are high-k dielectric materials to provide high dielectric voltage withstand capability for a low equivalent oxide thickness.

The lower passivation sub-layer 131 is formed directly on the upper surface 112 of the semiconductor substrate 110 (e.g., on cap layer 109, if included, or on barrier layer 108 if cap layer 109 is excluded). According to various embodiments, the lower passivation sub-layer 131 may have a thickness in a range of about 100 angstroms to about 500 angstroms, although layer 131 may be thinner or thicker, as well. In some embodiments, the portion of the lower passivation sub-layer 131 that is present between the recessed SFP region 191 of the SFP 190 and the upper surface 112 of the substrate 110 has a thickness that essentially is the entire thickness of the lower passivation sub-layer 131. In other embodiments, a relatively small depth (e.g., up to 20 percent) of the upper surface of the lower passivation sub-layer 131 may be etched away during the processes of etching dielectric material of the upper passivation sub-layer 133, and accordingly, the portion of the lower passivation sub-layer 131 that is present between the recessed SFP region 191 of the SFP 190 and the upper surface 112 of the substrate 110 may have a thickness that is less than the entire thickness of the lower passivation sub-layer 131 (e.g., up to 20 percent less). Either way, the thickness of the lower passivation sub-layer 131 at least partially determines the dielectric thickness under the recessed SFP region 191 of the field plate 190 (FIGS. 1 and 3H).

According to an embodiment, the lower passivation sub-layer 131 is formed from a dielectric material that has a very low or negligible etch rate when exposed to the etch chemistry that will be subsequently used to etch the upper passivation sub-layer 133 (e.g., as described later in conjunction with FIG. 3G). For example, and according to some embodiments, the lower passivation sub-layer 131 may be formed from silicon nitride ($Si_3N_4$, including silicon-rich or silicon-poor compositions thereof) using low pressure chemical vapor deposition (LPCVD), although layer 131 alternatively may be formed from another dielectric material and/or using a different deposition method (e.g., atomic layer deposition (ALD), sputtering, physical vapor deposition (PVD), plasma-enhanced chemical vapor deposition (PECVD), metal organic CVD (MOCVD), molecular beam epitaxy (MBE), inductively coupled plasma (ICP) deposition, electron cyclotron resonance (ECR) deposition, or other suitable techniques).

According to an embodiment, the upper passivation sub-layer 133 is formed directly on the lower passivation sub-layer 131. According to various embodiments, the upper passivation sub-layer 133 may have a thickness in a range of about 100 angstroms to about 1000 angstroms, although layer 133 may be thinner or thicker, as well.

According to an embodiment, and as indicated above, the upper passivation sub-layer 133 is formed from a dielectric material that has a very high etch rate, in comparison with the lower passivation sub-layer 131, when exposed to the etch chemistry that will be subsequently used to etch the upper passivation sub-layer 133 (e.g., as described later in conjunction with block 218 and FIG. 3G). For example, and according to some embodiments, the upper passivation sub-layer 133 may be formed from aluminum oxide ($Al_2O_3$) or aluminum nitride (AlN) using sputtering, ALD or plasma enhanced atomic layer deposition (PEALD), although layer 133 alternatively may be formed from another dielectric material (e.g., $HfO_2$) and/or using a different deposition method (e.g., PVD, PECVD, MOCVD, MBE, ICP deposition, ECR deposition, or other suitable techniques).

Figure 3B:
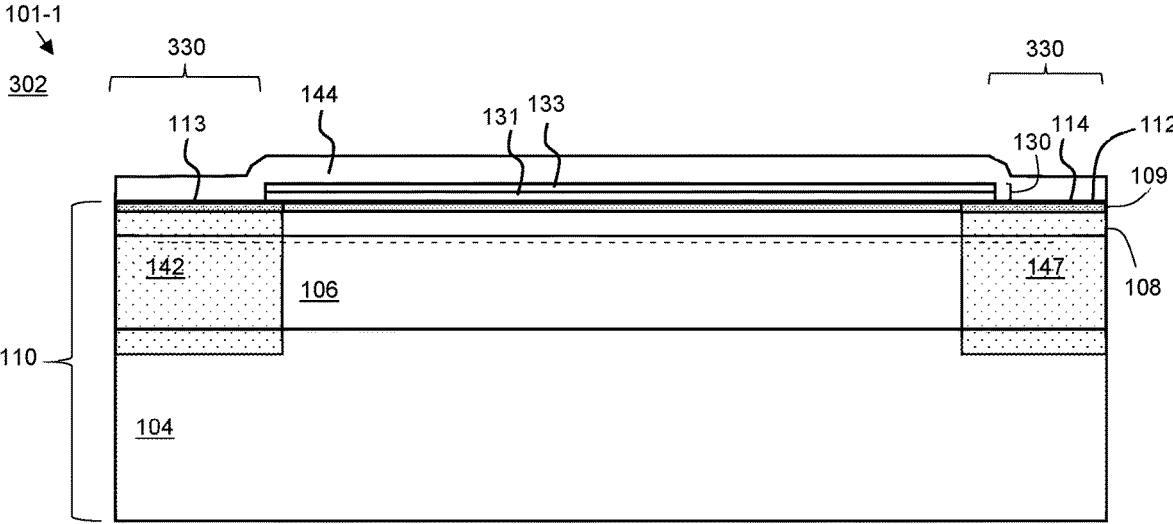

Referring now to FIGS. 1, 2, and 3B, in block 206 and fabrication stage 302 (FIG. 3B), openings 330 for the source and drain Ohmic contacts (e.g., contacts 141, 146, FIG. 1, not shown in FIG. 3) are formed in the surface passivation layer 130 over the source and drain implants 142, 147 (FIG. 1) using sequential selective etching processes. For example, to form the openings 330, a photoresist layer (not illustrated) may be deposited over the surface passivation layer 130, and photoresist openings may be formed over the locations where the openings 330 in the surface passivation layer 130 are to be formed (including over the source and drain implants 142, 147, FIG. 1). The upper and lower passivation sub-layers 133, 131 may then be etched sequentially through the resist openings.

For example, multiple dry and/or wet etch technique(s) may be used to etch the openings 330 through the upper and lower passivation sub-layers 133, 131. For example, the openings 330 may be formed using reactive ion etching (RIE), inductively coupled plasma (ICP) etching, electron cyclotronic resonance (ECR) etching, and wet chemical etching, according to various embodiments.

In various embodiments, the etchant used to etch the upper passivation sub-layer 133 (e.g., $Al_2O_3$ or AlN) may selectively etch through the upper passivation sub-layer 133 and then stop on the lower passivation sub-layer 131. In various embodiments, etching the upper passivation sub-layer 133 may include wet and/or dry etch techniques. Suitable wet-etch chemistries for etching through the upper passivation sub-layer 133 may include, for example but not by way of limitation, piranha etch (i.e., a solution of sulfuric acid and hydrogen peroxide), potassium hydroxide (KOH), ammonium hydroxide ($NH_4OH+$), or another suitable wet-etch chemistry. In other embodiment(s), dry etching of the upper passivation sub-layer 133 may include dry etching using suitable techniques (e.g., RIE, ICP, or ECR) in conjunction chlorine-based chemistry such as $Cl_2$, tetrachloromethane ($CCl_4$), boron trichloride ($BCl_3$), or other suitable dry-etch chemistries. In some embodiments requiring very precise etching, thermal or plasma atomic layer etching (ALE) may be employed using, for example, niobium pentafluoride ($NbF_5$) and carbon tetrachloride ($CCl_4$) or tin acetylacetonate $Sn(acac)_2$ and HF-pyridine).

The lower passivation sub-layer 131 is etched after the etching process for the upper passivation sub-layer 133 has completed. A different etch process and/or etch chemistry may be used to etch the lower passivation sub-layer 131 from the etch process and/or etch chemistry that was used to etch the upper passivation sub-layer 133. In various embodiments, the etchant used to etch the lower passivation sub-layer 131 (e.g., $Si_3N_4$ or other stoichiometries) may selectively etch through the lower passivation sub-layer 131 and then stop on the upper surface 112 of the semiconductor substrate 110. In various embodiments, etching the lower passivation sub-layer 131 may include wet and/or dry etch techniques. Suitable wet-etch chemistries for etching through the lower passivation sub-layer 131 may include, for example but not by way of limitation, hydrofluoric acid (HF), buffered HF, or other suitable wet etchant(s). Suitable dry etching techniques may use, for example but not by way of limitation, one or more of sulphur hexafluoride ($SF_6$), carbon tetrafluoride ($CF_4$) or other suitable chemistries, according to an embodiment.

In some embodiments, such as those described above, the etch of sub-layers 133, 131 may be performed in two or more steps, such as by first etching the upper passivation sub-layer 133 and stopping on the lower passivation sub-layer 131, before switching chemistry to etch the lower passivation sub-layer 131 and stop on the upper surface 112 of the semiconductor substrate 110. In other embodiments, a suitable etch chemistry (e.g., $SF_6$) may etch both upper and lower passivation sub-layers 133, 131, and stop on the surface 112 of the semiconductor substrate 110.

Once formed, the openings 330 in the surface passivation layer 130 may extend across upper surface 112 from the source and drain electrodes 140, 145 (FIG. 1) into the portion 101-1 of the device 100 where the gate 160 and field plate 190 eventually will be formed. Accordingly, as shown in FIG. 3B, portions 113, 114 of the upper surface 112 of the semiconductor substrate 110 are exposed through the openings 330 on either side of the patterned surface passivation layer 130.

Further, in block 206, a conductive layer 144 is formed on or over the surface passivation layer 130, the portions of the upper surface 112 of the substrate 110 that are exposed over the source and drain implants 142, 147 (FIG. 1), and the additional exposed portions 113, 114 of the upper surface 112 of the substrate 110 that extend between the source and drain implants 142, 147 and the surface passivation layer 130.

According to various embodiments, the conductive layer 144 is formed from one or more etchable metal materials that are suitable for forming an Ohmic contact in conjunction with the source and drain implants 142, 147 (FIG. 1). For example, in some embodiments, the conductive layer 144 may include one or more material layers selected from titanium (Ti), titanium aluminum (TiAl), titanium tungsten (TiW), titanium-tungsten nitride (TiWN) or other suitable materials or layer stacks thereof. In some embodiments, if desired for etch selectivity during subsequent steps (e.g., as will be described later in conjunction with blocks 212, 218 and FIGS. 3E, 3G), a thin layer of gold (not illustrated) may be deposited on top of the conductive layer 144 to function as an etch stop. Upon deposition of the conductive layer 144 or at a later time, an annealing process (e.g., rapid thermal annealing) may be used to alloy the Ohmic contact metal of layer 144. When the constituent layer(s) of conductive layer 144 have been deposited and annealed, the conductive layer 144 forms an Ohmic contact with the source and drain regions 142, 147 (FIG. 1).

According to various embodiments, the conductive layer 144 is formed directly on the upper passivation sub-layer 133. In various embodiments, the conductive layer 144 may be deposited by evaporation, sputtering, PVD, or other suitable deposition techniques. For example, the conductive layer 144 may have a thickness in a range of about 10 nanometers (nm) to about 1 micron, although layer 144 may be thinner or thicker, as well.

In block 208 and fabrication stage 303 (FIG. 3C), a selective etch process is used to pattern and etch the conductive layer 144 to form the GFP alignment structures 162, 163 and the SFP alignment structures 192, 193. More specifically, photoresist layer 366 is applied over the conductive layer 144, and a first mask is used to pattern the photoresist layer 366 to expose portions of the conductive layer 144 through openings (not numbered) in the photoresist layer 366. The conductive layer 144 is then etched through the photoresist openings to remove the exposed portions all the way to the upper surface of the surface passivation layer 130 (i.e., the surface of layer 133). For example, in an embodiment, a plasma etch using $Cl_2+CF_4$, $BCl_3+CF_4$, $SF_6+O_2$ or $CF_4+O_2$ plasma may be used to etch the conductive layer 144, while stopping on the surface passivation layer 130. According to an embodiment, the etch selectivity between the conductive layer 144 and the underlying upper passivation sub-layer 133 is >50:2 (e.g., when the conductive layer 144 includes TiW and the upper passivation sub-layer 133 includes $Al_2O_3$).

Figure 3C:
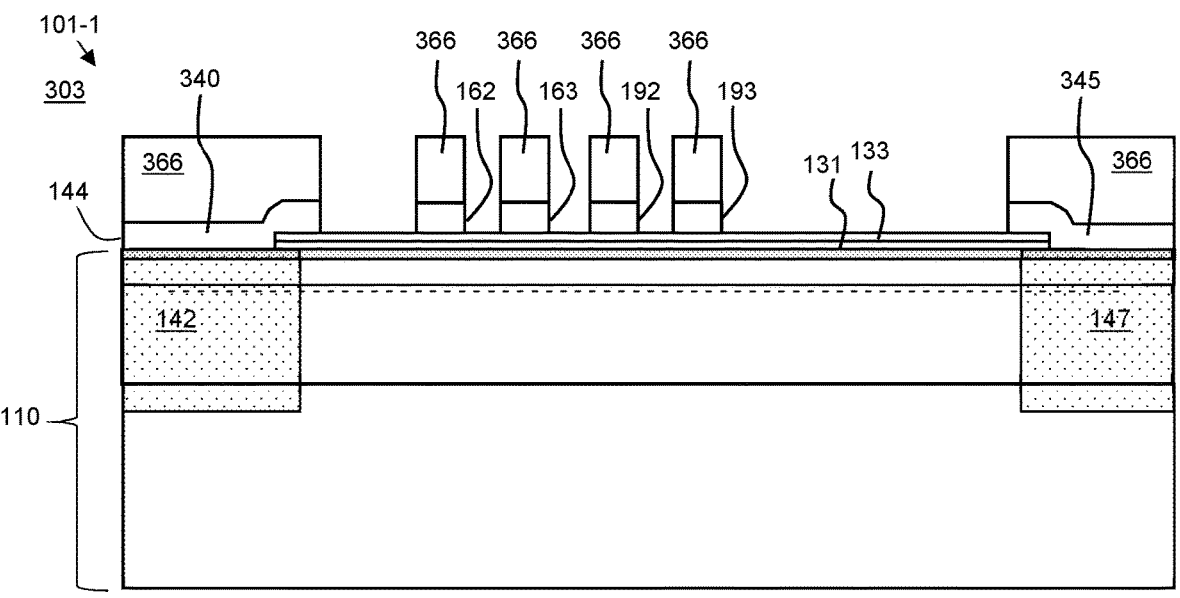
Figure 3D:
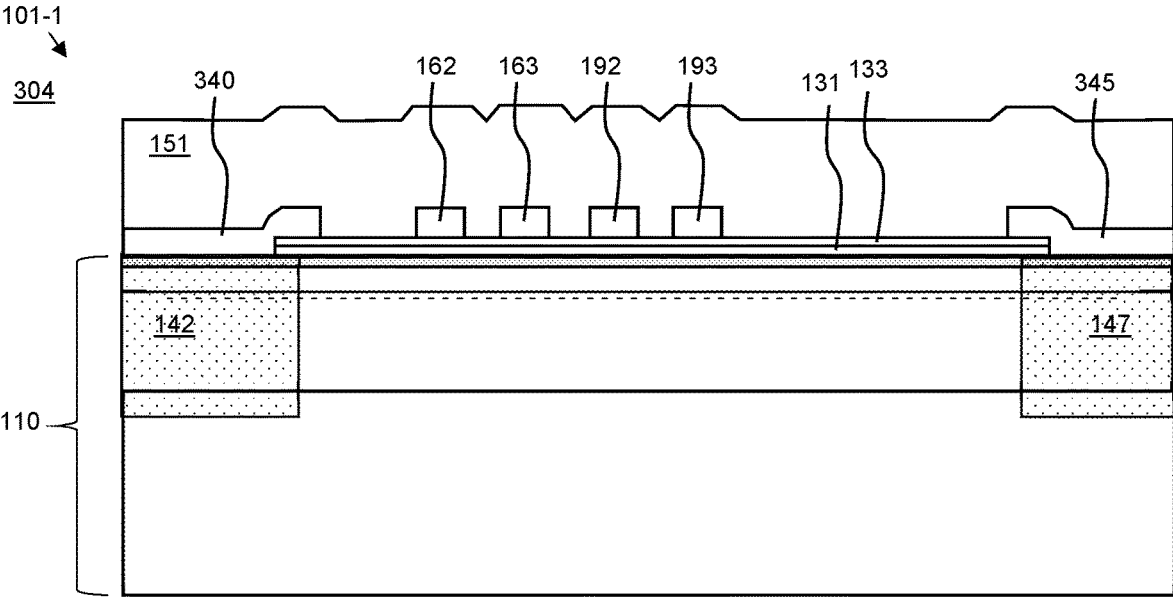

The selective etch process results in the formation of the conductive GFP and SFP alignment structures 162, 163, 192, 193. In addition, as clearly seen in FIG. 1, the selective etch process also results in the formation of a first conductive extension 340 that extends from a first end of the surface passivation layer 130 to overlie the source implant 142 (FIG. 1), and a second conductive extension 345 that extends from a second end of the surface passivation layer 130 to overlie the drain implant 147 (FIG. 1). The portions of extensions 340 and 345 that overlie the source and drain implants 142, 147 correspond to the source and drain contacts 141, 146 (FIG. 1), respectively. As shown in FIG. 3C, the first and second conductive extensions 340, 345 may be formed to lap up over the source-side and drain-side ends, respectively, of the surface passivation layer 130.

Once the selective etch process has been completed, the photoresist 366 is removed. In an embodiment, the photoresist layer 366 may be configured in a lift-off profile, wherein the openings of the photoresist layer 366 have a retrograde profile, allowing the metal not deposited into resist openings to "lift off" when dissolved in solvents.

As will be discussed in more detail below, because a single mask (i.e., the above-referenced "first mask") was used to define the GFP alignment structures 162, 163 and the SFP alignment structures 192, 193, these structures 162, 163, 192, 193 ensure that the gate channel 161 (FIGS. 1 and 3G) and the later-formed recessed SFP region 191 (FIGS. 1 and 3H) are "self-aligned" with each other despite minor misalignments between the first mask used in this fabrication stage 303 to define the locations of the GFP alignment structures 162, 163 and the SFP alignment structures 192, 193 with subsequently utilized masks used in fabrication stages 305 (FIG. 3E) and 307 (FIG. 3G) to define openings for the gate structure 161 and the source field plate 190, respectively.

In block 210 and fabrication stage 304 (FIG. 3D), a first dielectric layer 151 (e.g., ILD0) is deposited over the source and drain contact extensions 340, 345, the GFP and SFP alignment structures 162, 163, 192, 193, and exposed portions of surface passivation layer 130 (i.e., exposed portions of layer 133). According to an embodiment, the dielectric material used for the first dielectric layer 151 is different from the material used in the upper passivation sub-layer 133. Preferably, the dielectric material used for the first dielectric layer 151 is a low-k dielectric material, which may be selected from tetraethyl orthosilicate (TEOS), $SiO_2$, organo-silicate glass, porous $SiO_2$, SiON, and other suitable materials. In embodiments in which the upper passivation sub-layer 133 is not formed from $Al_2O_3$ or AlN, the first dielectric layer 151 may be formed from $Al_2O_3$ or AlN. The first dielectric layer 151 may be formed using one or more of LPCVD, ALD, sputtering, PVD, PECVD, MOCVD, MBE, ICP deposition, ECR deposition, or other suitable techniques. In various embodiments, the first dielectric layer 151 may have a thickness in a range of about 0.1 microns to about 0.5 microns, although layer 151 may be thinner or thicker, as well.

In block 212 and fabrication stage 305 (FIG. 3E), a selective etch process is used to pattern and etch a gate opening through the first dielectric layer 151 and all passivation sub-layers 131, 133 of the surface passivation layer 130, while stopping on the top surface 112 of the semiconductor substrate 110. More specifically, photoresist layer 367 is applied over the first dielectric layer 151, and the photoresist layer 367 is processed and patterned to form an opening 360 that has a first side 361 aligned with GFP alignment structure 162 and a second side 362 aligned with GFP alignment structure 163. The first side 361 has a bottom edge 364 that may terminate anywhere along the top surface of GFP alignment structure 162, and the second side 362 has a bottom edge 365 that may terminate anywhere along the top surface of GFP alignment structure 163. Accordingly, the mask used to pattern photoresist layer 367 may be slightly mis-aligned with the mask that was used in fabrication stage 303 (FIG. 3C) to pattern photoresist layer 366, without affecting the ultimate location of the later-formed gate channel 161 (FIG. 3F). In other words, the edges 364, 365 of the opening 360 may shift left or right, in the perspective of FIG. 3E, across the top surfaces of GFP alignment structures 162, 163 without affecting the location of the later-formed gate channel 161. As long at the edges 364, 365 land on the top surfaces of the GFP alignment structures 162, 163, the gate channel 161 will be properly aligned.

The portions of first dielectric layer 151 and all passivation sub-layers 133, 131 of the surface passivation layer 130 that are sequentially exposed through opening 360 are then sequentially etched through opening 360 to remove the exposed portions of the layers 151, 133, 131. The etching process continues until the portion of the surface passivation layer 130 that is exposed between GFP alignment structures 162 and 163 is removed. According to an embodiment, the etching process continues until a portion upper surface 112 of the substrate 110 between the GFP alignment structures 162, 163 is reached (e.g., the surface of cap layer 109). At this point, the upper surface 112 of the semiconductor substrate 110, sidewalls of the GFP alignment structures 162, 163, and sidewalls 165, 167 of the etched-through lower and upper passivation sub-layers 131, 133 are exposed in the opening 360.

Multiple dry and/or wet etch technique(s) may be used sequentially to etch openings through the first dielectric layer 151 and through the upper and lower passivation sub-layers 133, 131. In some embodiments, and particularly for thicker layers such as layers 151 and 154, a dry etch may be preferable over a wet etch because the dry etch enables anisotropic etching. For example, the layers 151, 133, 131 may be etched using reactive ion etching (RIE), inductively coupled plasma (ICP) etching, electron cyclotronic resonance (ECR) etching, and wet chemical etching, according to various embodiments. Suitable dry etching techniques for etching layer 151 may use, for example but not by way of limitation, one or more of sulphur hexafluoride ($SF_6$), carbon tetrafluoride ($CF_4$), a combination of $SF_6$ and $C_4F_8$, di-carbon hexafluoride ($C_2F_6$) and $H_2$, combinations thereof, or other suitable chemistries, according to an embodiment.

In various embodiments, the etchant used to etch the upper passivation sub-layer 133 (e.g., $Al_2O_3$ or AlN) may selectively etch through the upper passivation sub-layer 133 and then stop on the lower passivation sub-layer 131. Suitable wet-etch chemistries and dry etching techniques for etching through the upper passivation sub-layer 133 were described above in conjunction with fabrication stage 302 (FIG. 3B), and those chemistries and techniques apply to this etching process as well.

The lower passivation sub-layer 131 may be etched after the etching process for the upper passivation sub-layer 133 has completed. A different etch process and/or etch chemistry may be used to etch the lower passivation sub-layer 131 from the etch process and/or etch chemistry that was used to etch the upper passivation sub-layer 133. Suitable wet-etch chemistries and dry etching techniques for etching through the lower passivation sub-layer 131 were described above in conjunction with fabrication stage 302 (FIG. 3B), and those chemistries and techniques apply to this etching process as well.

In some embodiments, such as those described above, the etch of layers 151, 133, 131 may be performed in multiple steps, such as by first etching the first dielectric layer 151 and stopping on the upper passivation sub-layer 133, before switching chemistry to etch the upper passivation sub-layer 133 and stop on the lower passivation sub-layer 131, before again switching chemistry to etch the lower passivation sub-layer 131 and stop on the upper surface 112 of the semiconductor substrate 110. In other embodiments, a suitable etch chemistry (e.g., $SF_6$) may etch multiple ones of layers 151, 133, 131 and stop on the surface 112 of the semiconductor substrate 110.

In block 214 and fabrication stage 306 (FIG. 3F), the gate electrode 160 (or gate metal stack) is formed by depositing one or more layers of gate metal into opening 360 using, for example, metal evaporation processes. During the deposition process, the patterned photoresist layer 367 (FIG. 3E) may be used as a mask to prevent the gate metal from depositing in other regions in a lift-off process.

For example, depositing gate metal to form the gate electrode 160 may include depositing a multi-layer stack that includes one or more metal layers and/or other suitable materials, according to various embodiments. In some embodiments, a first layer within a multi-layer stack used to form the gate electrode 160 may include a metal that provides a good Schottky barrier (e.g., nickel (Ni) or another suitable metal), followed by a diffusion barrier layer (e.g., platinum (Pt) or another suitable metal). The remainder of the gate electrode 160 may be formed from gold (Au), copper (Cu), or other suitable metals. The first layer of gate metal may contact the portion of the top surface 112 of the semiconductor substrate 110 located between the GFP alignment structures 162, 163. In addition, the gate metal layers may contact exposed sidewalls 165, 167 (FIG. 3E) of the lower and upper passivation sub-layers 131, 133, exposed sidewalls and top surfaces of the GFP alignment structures 162, 163, and sidewalls of the opening in the first dielectric layer 151. It may be noted at this point that the upper and lower passivation sub-layers 131, 133 are present on both the source-side and the drain-side of the gate electrode 160. The first gate metal layer defines the gate channel 161 (i.e., the intersection between the gate electrode 160 and the substrate 110). After forming the gate electrode 160, photoresist layer 367 is removed.

In block 216 and fabrication stage 307 (FIG. 3G), a second dielectric layer 154 (e.g., ILD1) is deposited over the first dielectric layer 151 and the gate electrode 160. The first and second dielectric layers 151, 154 together comprise the "additional" dielectric layers 150 of FIG. 1. In various embodiments, the dielectric material used for the second dielectric layer 154 may be the same or different from the dielectric material used for the first dielectric layer 151. Preferably, the dielectric material used for the second dielectric layer 154 is a low-k dielectric material, which may be selected from TEOS, $SiO_2$, organo-silicate glass, porous $SiO_2$, $Si_3N_4$, SiON, $HfO_2$, $Al_2O_3$ or AlN, and other suitable materials. The second dielectric layer 154 may be formed using one or more of LPCVD, ALD, sputtering, PVD, PECVD, MOCVD, MBE, ICP deposition, ECR deposition, or other suitable techniques. In various embodiments, the second dielectric layer 154 may have a thickness in a range of about 0.2 microns to about 2.0 microns, although layer 154 may be thinner or thicker, as well.

In addition, in block 218, a selective etch process is used to pattern and etch a field plate opening through the first and second dielectric layers 151, 154 and the upper passivation sub-layer 133 of the surface passivation layer 130, while leaving the lower passivation sub-layer 131 essentially intact (i.e., the etching processes stop on layer 131). Simultaneously, openings through portions of the first and second dielectric layers 151, 154 overlying the source and drain Ohmic contacts 141, 146 (FIG. 1) are etched to facilitate forming conductive vias for source and drain electrodes 140, 145 (FIG. 1) in the following fabrication stage (stage 308, FIG. 3H) corresponding to block 220.

More specifically, photoresist layer 368 is applied over the second dielectric layer 154, and the photoresist layer 368 is processed and patterned to form an opening 396 that has a first side 391 aligned with SFP alignment structure 192 and a second side 392 aligned with SFP alignment structure 193. The first side 391 has a bottom edge 397 that may terminate anywhere along the top surface of SFP alignment structure 192, and the second side 392 has a bottom edge 398 that may terminate anywhere along the top surface of SFP alignment structure 193. Accordingly, the mask used to pattern photoresist layer 368 may be slightly mis-aligned with the mask that was used in fabrication stage 303 (FIG. 3C) to pattern photoresist layer 366, without affecting the ultimate location of the later-formed recessed SFP region 191 of the source field plate 190 (FIG. 3H). In other words, the edges 397, 398 of the opening 396 may shift left or right, in the perspective of FIG. 3G, across the top surfaces of SFP alignment structures 192, 193 without affecting the location of the later-formed recessed SFP region 191 of the source field plate 190. As long at the edges 397, 398 land on the top surfaces of the SFP alignment structures 192, 193, the recessed SFP region 191 will be properly aligned.

The portions of second and first dielectric layers 154, 151 and the upper passivation sub-layer 133 that are sequentially exposed through opening 390 are sequentially etched through opening 390 to remove the exposed portions of the layers 154, 151, 133. The etching process continues until the portion of the upper passivation sub-layer 133 that is exposed between SFP alignment structures 192 and 193 is removed. According to an embodiment, the etching process continues until a portion 395 of the upper surface of the lower passivation sub-layer 131 between the SFP alignment structures 192, 193 is reached (i.e., the etching process stops on lower passivation sub-layer 131). At this point, sidewalls 196 of the upper passivation sub-layer 133 are exposed in the opening 396.

This process results in an unfilled field plate via 396 over and between the SFP alignment structures 192, 193, with the portion 395 of the lower passivation sub-layer 131 defining the bottom extent of the via 396. Starting at the bottom of the unfilled field plate via 396, the via sidewalls include exposed sidewalls 196 of the etched-through upper passivation sub-layer 133, exposed sidewalls of the SFP alignment structures 192, 193, exposed portions of the upper surfaces of the SFP alignment structures, and exposed sidewalls of the first and second dielectric layers 151, 154. It may be noted at this point that the portion 395 of the exposed surface of the lower passivation sub-layer 131 defines a "recessed" portion of the unfilled field plate via 396 (i.e., surface 395 is recessed with respect to the upper surface of surface passivation layer 130, or the upper surface of upper passivation sub-layer 133).

Multiple dry and/or wet etch technique(s) may be used sequentially to etch openings through the second and first dielectric layers 154, 151 and through the upper passivation sub-layer 133. For example, the layers 154, 151, 133 may be etched using RIE, ICP etching, ECR etching, and wet chemical etching, according to various embodiments. Suitable wet-etch chemistries and dry etching techniques for etching through the layers 154, 151, 133 were described above in conjunction with fabrication stages 302 (FIG. 3B) and 305 (FIG. 3E), and those chemistries and techniques apply to this etching process as well.

In some embodiments, the etch of layers 154, 151, 133 may be performed in multiple steps, such as by first etching the second and first dielectric layers 154 and 151 and stopping on (or minimally etching) the upper passivation layer 133, before switching chemistry to etch the upper passivation layer 133 and stop on the lower passivation layer 131. In other embodiments, a suitable etch chemistry may etch all of layers 154, 151, 133. Either way, because etch selectivity is not perfect, a small amount of recess may occur into the lower passivation layer 131 (i.e., a small amount of the upper portion of the lower passivation layer 131 may be etched).

In block 220 and fabrication stage 308 (FIG. 3H), the photoresist 368 (FIG. 3G) is removed and source and drain metallization 148, 149 are deposited, resulting in the recessed SFP region 191 and the conductive field plate via 194, which connects with additional overlying source metallization 148. Further, the source metallization 148 is deposited so that it extends from the conductive field plate via 194 over the second dielectric layer 154 to the source contact 141. This completes the formation of the source-connected field plate 190, which includes the recessed SFP region 191, and the SFP alignment structures 192, 193.

For example, depositing the source and drain metallization 148, 149 may include depositing a multi-layer stack that includes one or more metal layers and/or other suitable materials, according to various embodiments. In some embodiments, a first layer within a multi-layer stack used to form the source and drain metallization 148, 149 (and thus the source field plate 190) may include an adhesion layer (e.g., TiW or another suitable material), and additional layers may include gold (Au) and other suitable metals. The first layer of source metallization 148 contacts the portion 395 (FIG. 3G) of the upper surface of the lower passivation sub-layer 131 between the SFP alignment structures 192, 193 (e.g., the top surface of passivation sub-layer 133) located between the SFP alignment structures 192, 193. In addition, the source metallization 148 contacts exposed sidewalls 196 (FIG. 3G) of the upper passivation sub-layer 133, exposed sidewalls and top surfaces of the SFP alignment structures 192, 193, and sidewalls of the opening 396 in the first and second dielectric layers 151, 154. The portion of the source metallization 148 that is disposed on the portion 395 (FIG. 3G) of the lower passivation sub-layer 131 defines the recessed SFP region 191. In an embodiment, the photoresist layer(s) (not illustrated) used to deposit the source and drain metallization 148, 149 may be configured in a lift-off profile, wherein the openings of the photoresist layer(s) have a retrograde profile, allowing the metal not deposited into resist openings to "lift off" when dissolved in solvents.

At this point, in block 222, the device 100 may be completed by depositing the final passivation layers 170 and 180 (FIG. 1). For example, passivation layer 170 may be formed from $Si_3N_4$ or another suitable material, and passivation layer 180 may be formed from polybenzoxazoles (PBO) or another suitable material. Passivation layers 170, 180 may be deposited, for example, using one or more of LPCVD, ALD, sputtering, PVD, PECVD, MOCVD, MBE, ICP deposition, ECR deposition, or other suitable techniques.

Embodiment 2 (FIGS. 4A-H)

FIG. 2 will be used again to describe fabrication steps for an alternate embodiment of GaN HFET 100 in FIG. 1. These fabrication steps are shown in detail in FIGS. 4A-H (collectively FIG. 4). More specifically, FIG. 4, which includes FIGS. 4A-H includes cross-sectional, side views of an embodiment of portion 101-2 of GaN HFET device 100 during a sequence of fabrication steps. It should be noted that portion 101-2 corresponds to portion 101 of FIG. 1, where the "−2" indicates that this is a second embodiment of portion 101. The most notable differences between portion 101-1 (FIG. 3) and 101-2 (FIG. 4) are that, for portion 101-2, the surface passivation layer 430 includes three passivation sub-layers 131-133 (rather than two), and prior to forming the GFP and SFP alignment structures 162, 163, 192, 193, an etch stop layer 444 is deposited over the conductive layer 144. These differences will be discussed in more detail below.

Referring initially to FIGS. 1 and 2, fabrication of this alternate embodiment of GaN HFET device 100 begins, in block 202, by providing a semiconductor substrate 110 in which Ohmic source and drain implants (e.g., source and drain implants 142, 147) have already been formed. Details associated with providing the semiconductor substrate 110 and forming the Ohmic source and drain implants were discussed in detail above in conjunction with the description of forming portion 101-1 and Embodiment 1. In the interest of conciseness, those details are not repeated here, but instead those details are intended to be incorporated here into the description of forming portion 101-2 and this Embodiment 2. Briefly, providing the semiconductor substrate 110 includes providing a host substrate 102, and forming various semiconductor layers (e.g., a nucleation layer (not shown), a buffer layer 104, a channel layer 106, a barrier layer 108, and optionally a cap layer 109) on or over an upper surface 103 of the host substrate 102. Embodiments of the method may optionally include forming doped (e.g., ion-implanted) source and drain regions 142 and 147 (FIG. 1), as also discussed above in conjunction with block 202 and Embodiment 1.

Figure 3E:
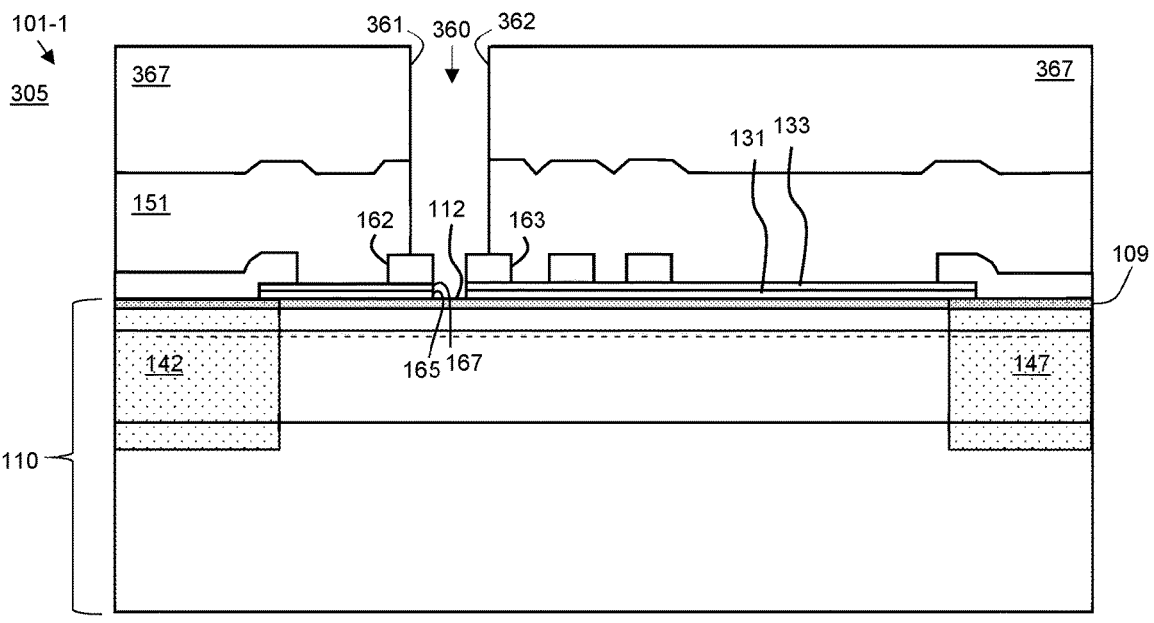
Figure 3F:
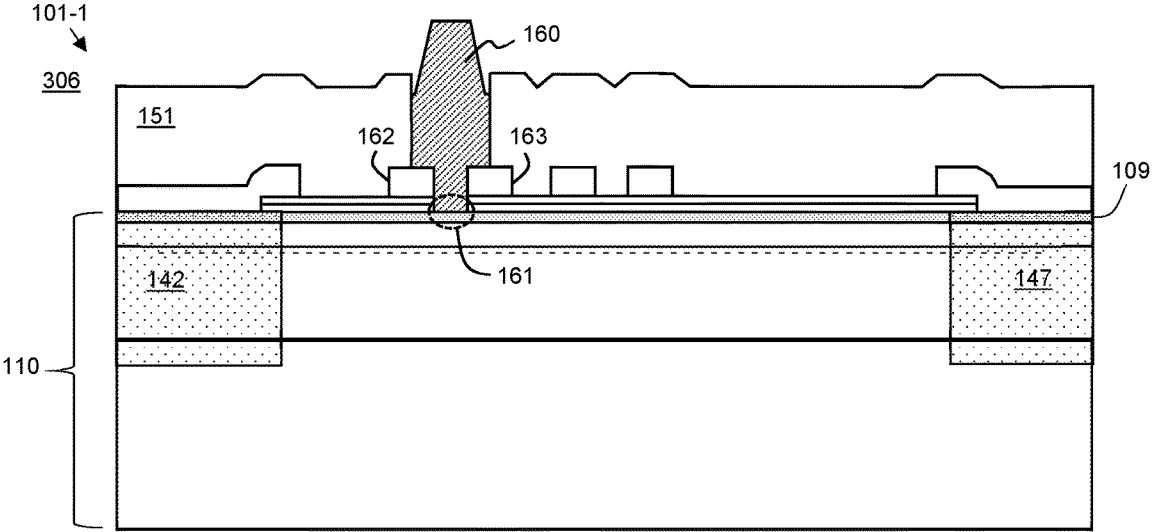
Figure 3G:
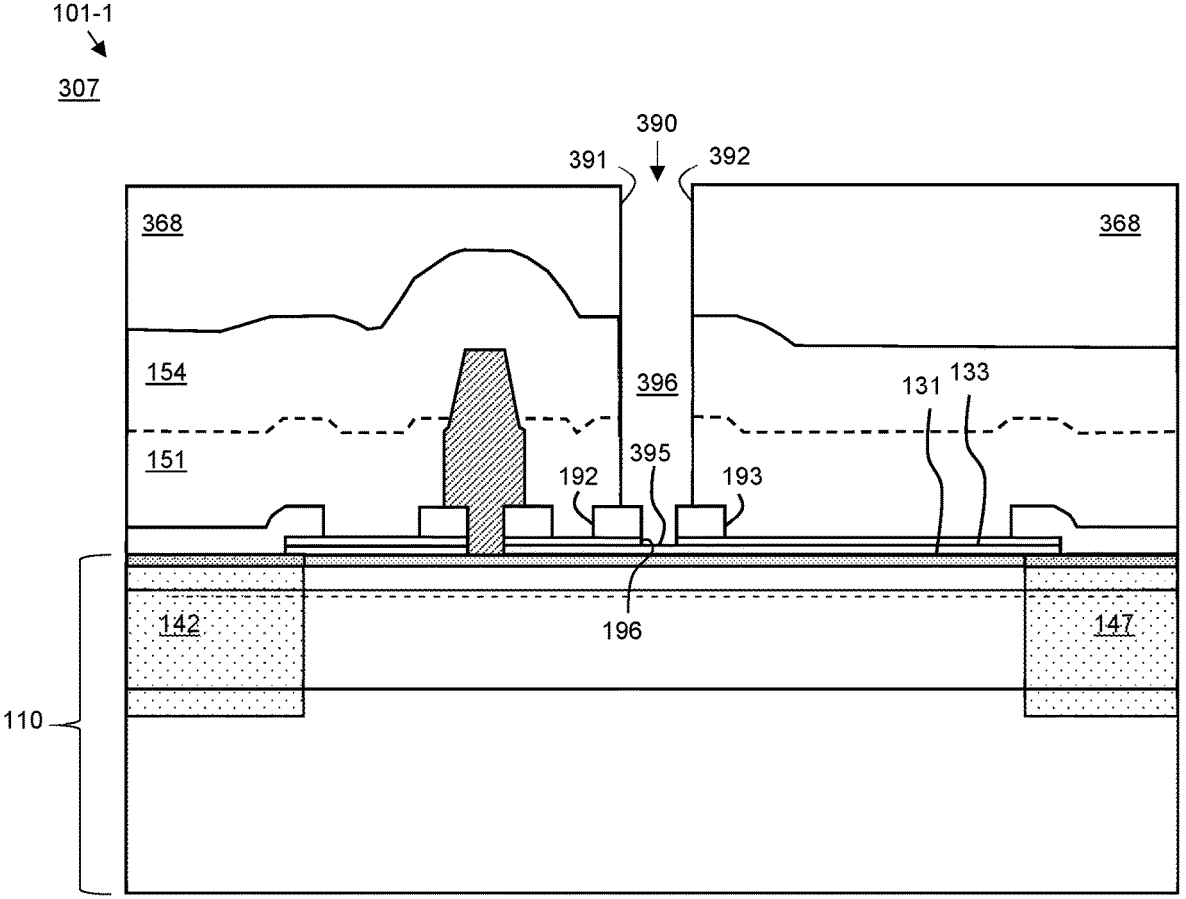
Figure 3H:
Figure 3H:
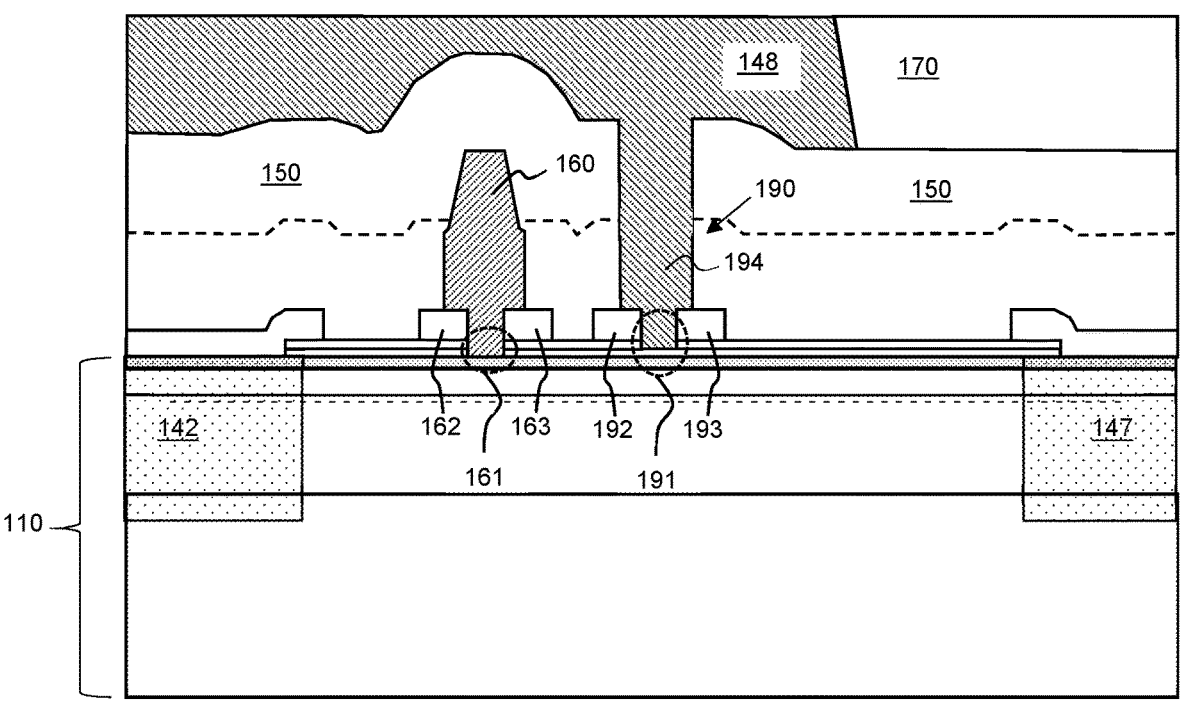
Figure 4A:
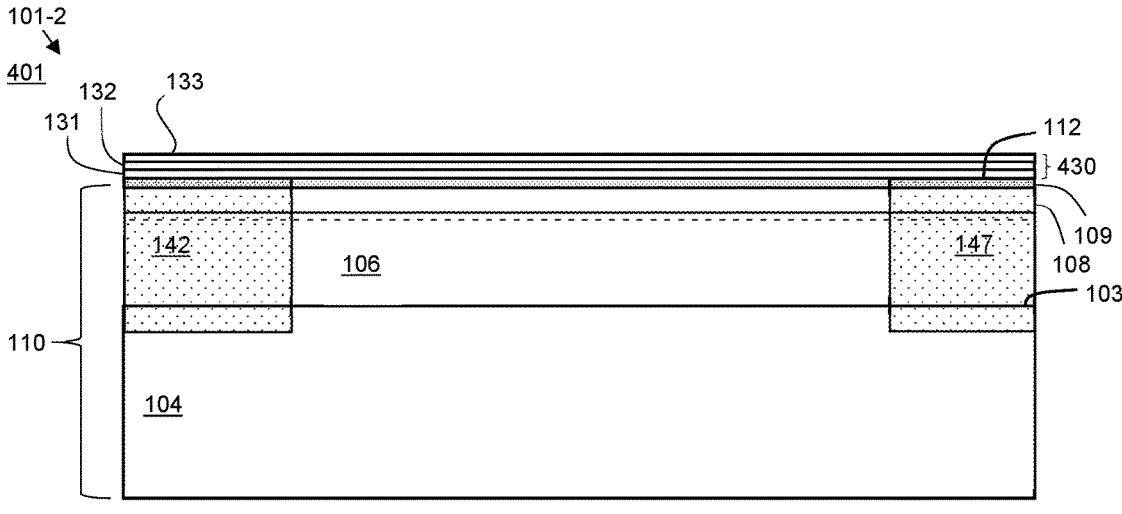
FIGS. 4A, 4B, 4C, 4D, 4E, 4F, 4G, and 4H (collectively FIG. 4) are cross-sectional, side views of another embodiment of an HFET device during a sequence of fabrication steps, according to another fabrication embodiment.

Referring now to FIGS. 2 and 4A, in block 204 and fabrication stage 401 (FIG. 4A), a surface passivation layer 430 is formed on the upper surface 112 of the semiconductor substrate 110. According to an embodiment, the surface passivation layer 430 includes at least three passivation sub-layers 131, 132, 133, which may be referred to as lower, intermediate, and upper passivation sub-layers 131, 132, 133, respectively. In some embodiments, such as that shown in FIG. 4A, surface passivation layer 430 includes three passivation sub-layers 131, 132, 133. In an alternate embodiment (e.g., as described in conjunction with FIG. 3), surface passivation layer 430 may include only two passivation sub-layers 131, 133 (e.g., the intermediate passivation layer 132 may be excluded). According to an embodiment, the surface passivation layer 430 may have a total thickness (including the thicknesses of all three layers 131, 132, 133) of between about 200 angstroms and about 1000 angstroms, although other thicknesses may be used.

The lower, intermediate, and upper passivation sub-layers 131, 132, 133 are formed from different materials that enable etch selectivity (i.e., layers 131-133 are etchable using different etch chemistries). In particular, as described below, the intermediate passivation sub-layer 132 will function as an etch stop when etching through the upper passivation sub-layer 133, and the lower passivation sub-layer 131 will function as an etch stop when etching through the intermediate passivation sub-layer 132. According to various embodiments, the materials of layers 131-133 are high-k dielectric materials to provide high dielectric voltage withstand capability for a low equivalent oxide thickness.

The lower passivation sub-layer 131 is formed directly on the upper surface 112 of the semiconductor substrate 110 (e.g., on cap layer 109, if included, or on barrier layer 108 if cap layer 109 is excluded). According to various embodiments, the lower passivation sub-layer 131 may have a thickness in a range of about 100 angstroms to about 500 angstroms, although layer 131 may be thinner or thicker, as well. In some embodiments, the portion of the lower passivation sub-layer 131 that is present between the recessed SFP region 191 of the SFP 190 and the upper surface 112 of the substrate 110 has a thickness that essentially is the entire thickness of the lower passivation sub-layer 131. In other embodiments, a relatively small depth (e.g., up to 20 percent) of the upper surface of the lower passivation sub-layer 131 may be etched away during the processes of etching dielectric material of the intermediate passivation sub-layer 132, and accordingly, the portion of the lower passivation sub-layer 131 that is present between the recessed SFP region 191 of the SFP 190 and the upper surface 112 of the substrate 110 may have a thickness that is less than the entire thickness of the lower passivation sub-layer 131 (e.g., up to 20 percent less). Either way, the thickness of the lower passivation sub-layer 131 at least partially determines the dielectric thickness under the recessed SFP region 191 of the field plate 190 (FIGS. 1 and 4H).

According to an embodiment, the lower passivation sub-layer 131 is formed from a dielectric material that has a very low or negligible etch rate when exposed to the etch chemistry that will be subsequently used to etch the intermediate passivation sub-layer 132 (e.g., as described later in conjunction with FIG. 4G). For example, and according to some embodiments, the lower passivation sub-layer 131 may be formed from silicon nitride ($Si_3N_4$, including silicon-rich or silicon-poor compositions thereof). The lower passivation sub-layer 131 may be formed using deposition techniques described in conjunction with forming the lower passivation dielectric layer 131 in FIG. 3, and that description is incorporated here.

According to an embodiment, the intermediate passivation sub-layer 132 may be formed directly on the lower passivation sub-layer 132. The intermediate passivation sub-layer 132 may be relatively thin, with a thickness in a range of about 10 angstroms to about 200 angstroms, although layer 132 may be thinner or thicker, as well. According to an embodiment, the intermediate passivation sub-layer 132 is formed from a dielectric material that has a very low or negligible etch rate when exposed to the etch chemistry that will be subsequently used to etch the upper passivation sub-layer 133 (e.g., as described later in conjunction with FIG. 4G). For example, and according to some embodiments, the intermediate passivation sub-layer 132 may be formed from silicon dioxide ($SiO_2$). The intermediate passivation sub-layer 131 may be formed using LPCVD, although layer 132 alternatively may be formed from another dielectric material and/or using a different deposition method (e.g., ALD, sputtering, PVD, PECVD, MOCVD, MBE, ICP deposition, ECR deposition, or other suitable techniques).

According to an embodiment, the upper passivation sub-layer 133 is formed directly on the intermediate passivation sub-layer 132. According to various embodiments, the upper passivation sub-layer 133 may have a thickness in a range of about 100 angstroms to about 1000 angstroms, although layer 133 may be thinner or thicker, as well. According to an embodiment, and as indicated above, the upper passivation sub-layer 133 is formed from a dielectric material that has a very high etch rate, in comparison with the intermediate passivation sub-layer 132, when exposed to the etch chemistry that will be subsequently used to etch the upper passivation sub-layer 133 (e.g., as described later in conjunction with block 218 and FIG. 4G). For example, and according to some embodiments, the upper passivation sub-layer 133 may be formed from aluminum oxide ($Al_2O_3$) or aluminum nitrate (AlN) using ALD, PEALD or sputtering, although layer 133 alternatively may be formed from another dielectric material (e.g., $HfO_2$) and/or using a different deposition method (e.g., PVD, PECVD, MOCVD, MBE, ICP deposition, ECR deposition, or other suitable techniques).

Figure 4B:
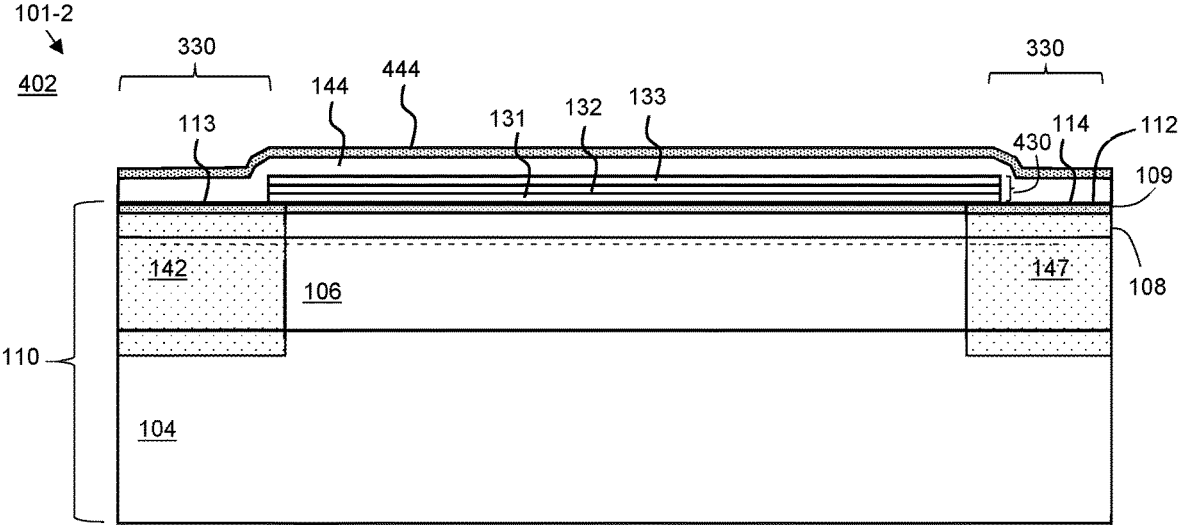
Figure 4C:
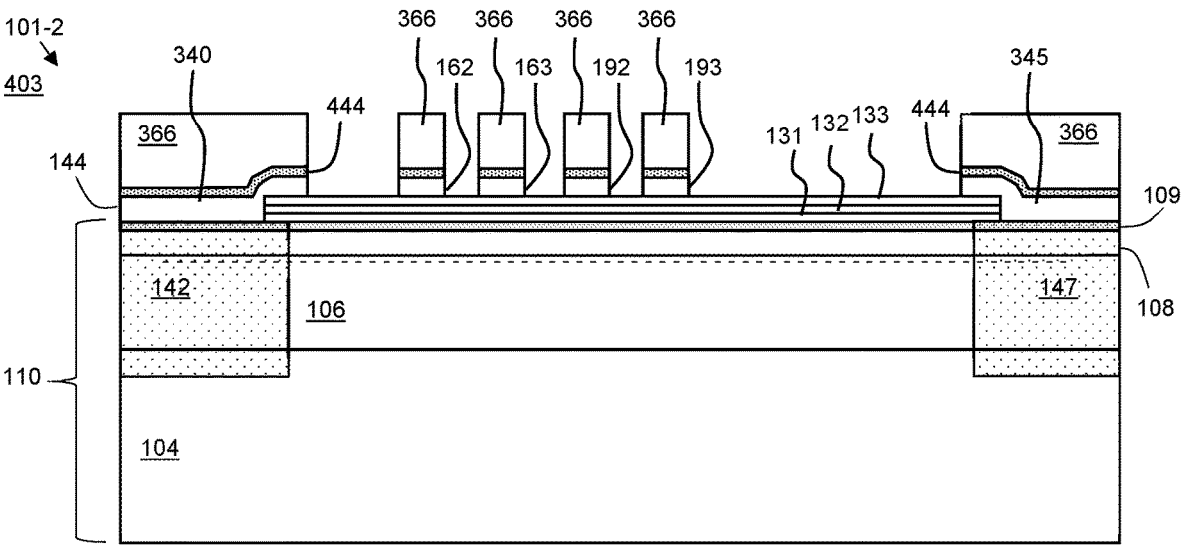
Figure 4D:
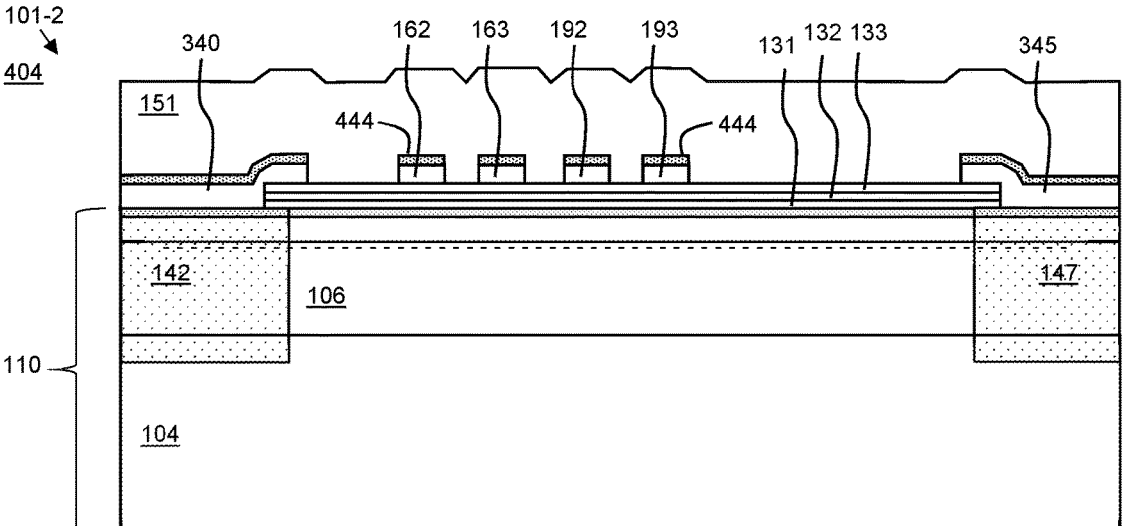
Figure 4E:
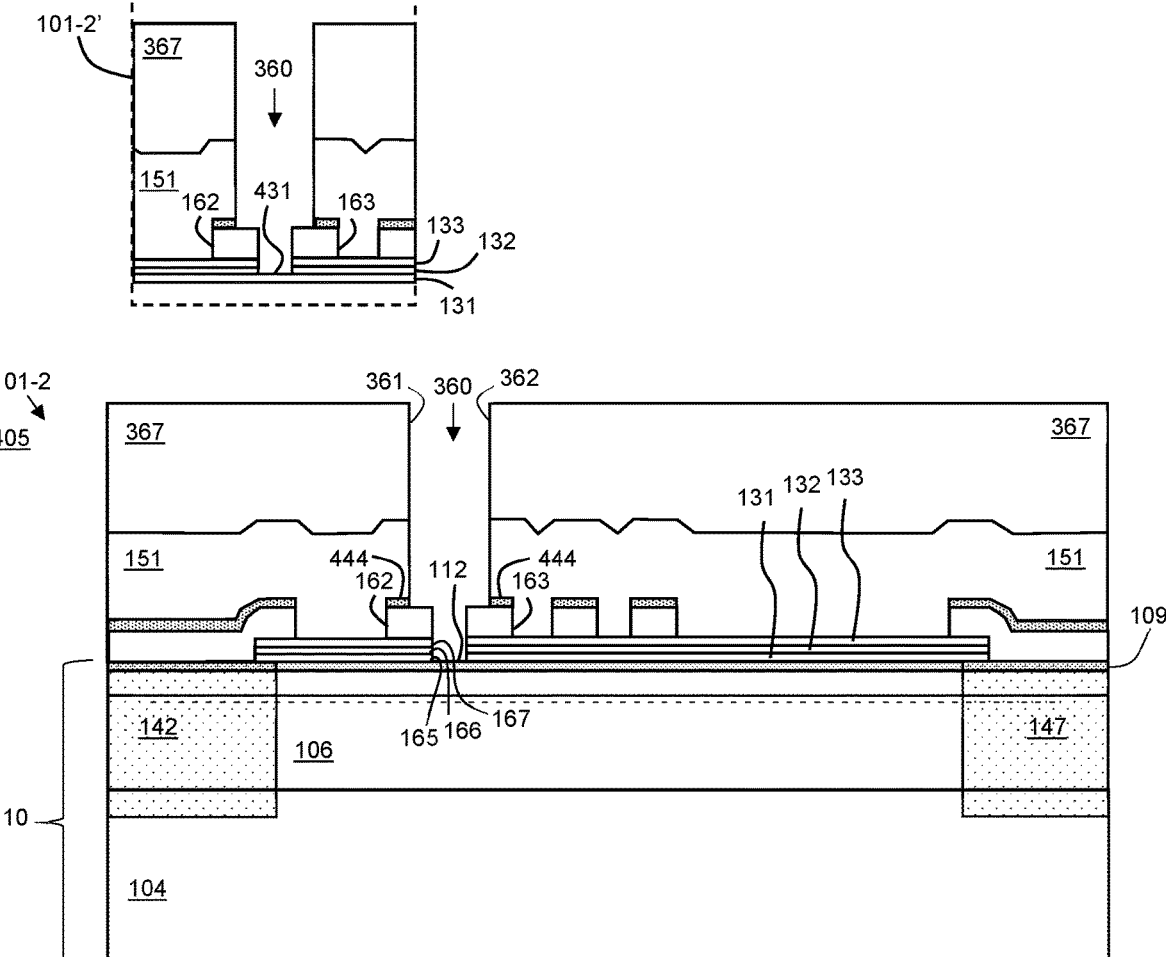
Figure 4F:
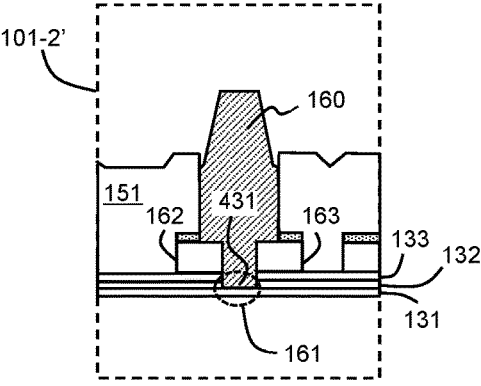
Figure 4F:
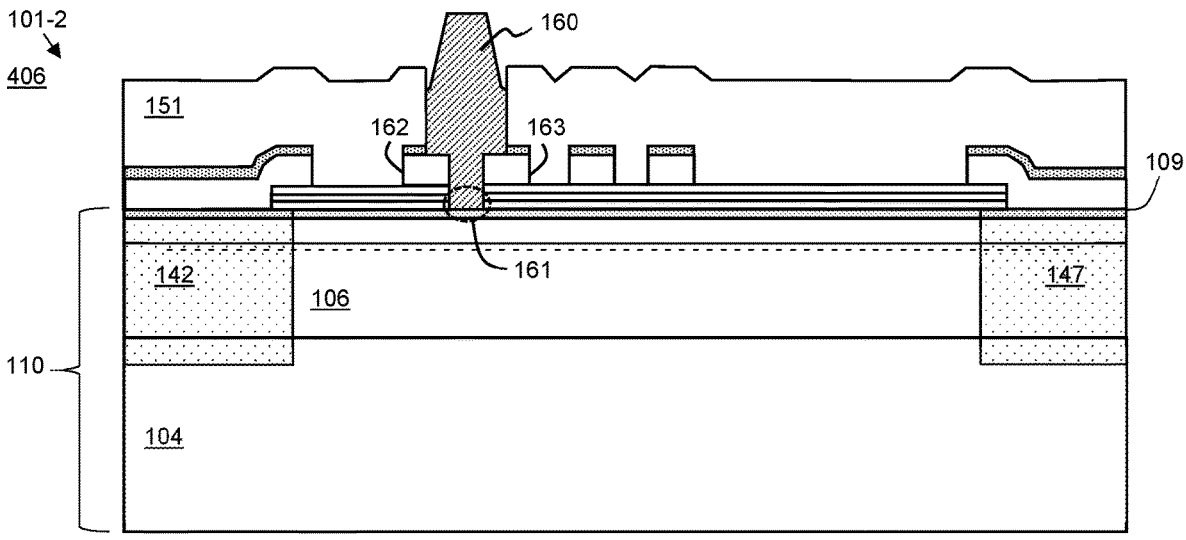

Referring now to FIGS. 1, 2, and 4B, in block 206 and fabrication stage 402 (FIG. 4B), openings 330 for the source and drain Ohmic contacts (e.g., contacts 141, 146, FIG. 1, not shown in FIG. 4) are formed in the surface passivation layer 430 over the source and drain implants 142, 147 (FIG. 1). In various embodiments, multiple dry and/or wet etch technique(s) may be used to etch the openings 330 through the upper, intermediate, and lower passivation sub-layers 133, 132, 131. For example, the openings 330 may be formed using RIE, ICP etching, ECR etching, and wet chemical etching, according to various embodiments.

In various embodiments, the etchant used to etch the upper passivation sub-layer 133 (e.g., $Al_2O_3$ or AlN) may selectively etch through the upper passivation sub-layer 133 and then stop on the intermediate passivation sub-layer 132. In various embodiments, etching the upper passivation sub-layer 133 may include wet and/or dry etch techniques. Suitable wet-etch chemistries for etching through the upper passivation sub-layer 133 may include, for example but not by way of limitation, piranha etch, KOH, or another suitable wet-etch chemistry. In other embodiment(s), dry etching of the upper passivation sub-layer 133 may include dry etching using suitable techniques (e.g., RIE, ICP, or ECR) in conjunction chlorine-based chemistry such as $Cl_2$, $CCl_4$, $BCl_3$, or other suitable dry-etch chemistries.

The intermediate passivation sub-layer 132 is etched after the etching process for the upper passivation sub-layer 133 has completed. A different etch process and/or etch chemistry may be used to etch the intermediate passivation sub-layer 132 from the etch process and/or etch chemistry that was used to etch the upper passivation sub-layer 133. In various embodiments, the etchant used to etch the intermediate passivation sub-layer 132 (e.g., $SiO_2$) may selectively etch through the intermediate passivation sub-layer 132 and then stop on the lower passivation sub-layer 131. In various embodiments, etching the intermediate passivation sub-layer 132 may include wet and/or dry etch techniques. Suitable wet-etch chemistries for etching through the intermediate passivation sub-layer 132 may include, for example but not by way of limitation, HF, buffered HF, buffered oxide etch (BOE), or other suitable wet etchant(s). Suitable dry etching techniques may use, for example but not by way of limitation, one or more of $BCl_3$, $SF_6$, di-carbon hexafluoride ($C_2F_6$), $CF_4$, tri-fluoromethane ($CHF_3$) or other suitable chemistries, according to an embodiment.

The lower passivation sub-layer 131 is etched after the etching process for the intermediate passivation sub-layer 132 has completed. A different etch process and/or etch chemistry may be used to etch the lower passivation sub-layer 131 from the etch process and/or etch chemistry that was used to etch the intermediate passivation sub-layer 132. In various embodiments, the etchant used to etch the lower passivation sub-layer 131 (e.g., $Si_3N_4$ or other stoichiometries) may selectively etch through the lower passivation sub-layer 131 and then stop on the upper surface 112 of the semiconductor substrate 110. In various embodiments, etching the lower passivation sub-layer 131 may include wet and/or dry etch techniques. Suitable wet-etch chemistries for etching through the lower passivation sub-layer 131 may include, for example but not by way of limitation, HF, buffered HF, or other suitable wet etchant(s). Suitable dry etching techniques may use, for example but not by way of limitation, one or more of $SF_6$, $CF_4$, or other suitable chemistries, according to an embodiment.

In some embodiments, such as those described above, the etch of layers 133, 132, 131 may be performed in multiple steps, such as by first etching the upper passivation sub-layer 133 and stopping on the intermediate passivation sub-layer 132, before switching chemistries to etch the intermediate passivation sub-layer 132 and stopping on the lower passivation sub-layer 131, and before again switching chemistry to etch the lower passivation sub-layer 131 and stop on the upper surface 112 of the semiconductor substrate 110. In other embodiments, a suitable etch chemistry (e.g., $SF_6$) may etch both upper, intermediate, and lower passivation sub-layers 133, 132, 131, and stop on the surface 112 of the semiconductor substrate 110.

Once formed, the openings 330 in the surface passivation layer 430 may extend across upper surface 112 from the ultimate locations of the later-formed source and drain electrodes 140, 145 (FIG. 1) into the portion 101 of the device 100 where the gate 160 and field plate 190 eventually will be formed. Accordingly, as shown in FIG. 4B, portions 113, 114 of the upper surface 112 of the semiconductor substrate 110 are exposed through the openings 330 on either side of the patterned surface passivation layer 430.

Further, in block 206, a conductive layer 144 is formed on or over the surface passivation layer 430, the portions of the upper surface 112 of the substrate 110 that are exposed over the source and drain implants 142, 147 (FIG. 1), and the additional exposed portions 113, 114 of the upper surface 112 of the substrate 110 that extend between the source and drain implants 142, 147 and the surface passivation layer 430. Suitable materials (e.g., Ti, TiAl, TiW, etc.) and other characteristics of the conductive layer 144, along with methods for depositing and annealing the conductive layer 144, are described above in conjunction with FIG. 3B, and those details are incorporated here.

According to an embodiment, one or more etch stop layers 444 are deposited on the conductive layer 144. According to an embodiment, the etch stop layers 444 include a layer of silicon dioxide ($SiO_2$) deposited on the conductive layer 144, and a layer of aluminum oxide ($Al_2O_3$) deposited on the silicon dioxide etch stop layer. The etch stop layers 444 may be deposited using LPCVD, ALD, sputtering, PVD, PECVD, MOCVD, MBE, ICP deposition, ECR deposition, or other suitable techniques). According to an embodiment, each of the etch stop layers 444 may have a thickness in a range of about 100 angstroms to about 300 angstroms, although the layers may be thinner or thicker, as well.

In block 208 and fabrication stage 403 (FIG. 4C), a selective etch process is used to pattern and etch the etch stop layer 444 and the conductive layer 144 to form the GFP alignment structures 162, 163 and the SFP alignment structures 192, 193. More specifically, photoresist layer 366 is applied over the etch stop layer 444, and a mask is used to pattern the photoresist layer 366 to expose portions of the etch stop layer 444 through openings (not numbered) in the photoresist layer 366. The etch stop layer 444 and the conductive layer 144 are then sequentially etched through the photoresist openings to remove the exposed portions all the way to the upper surface of the surface passivation layer 430 (i.e., the surface of layer 133). For example, in an embodiment, a plasma etch using octafluorocyclobutane ($C_4F_8$) plasma may be used to etch the aluminum oxide portion of the etch stop layer 444, and a plasma etch using $SF_6$ and $C_4F_8$ plasma may be used to etch the underlying silicon dioxide portion of the etch stop layer 444. Further, a plasma etch using $Cl_2+CF_4$, $BCl_3+CF_4$, or $CF_4+O_2$, or $SF_6$ and $O_2$ plasma may be used to etch the conductive layer 144, while stopping on the surface passivation layer 430.

The selective etch process results in the formation of the conductive GFP and SFP alignment structures 162, 163, 192, 193, along with conductive extensions 340, 345 that extend from the surface passivation layer 430 to overlie the source and drain implants 142, 147 (FIG. 1), respectively. Once the selective etch process has been completed, the photoresist 366 is removed.

In block 210 and fabrication stage 404 (FIG. 4D), a first dielectric layer 151 (e.g., ILD0) is deposited over the source and drain contact extensions 340, 345, the GFP and SFP alignment structures 162, 163, 192, 193, and exposed portions of surface passivation layer 430 (i.e., exposed portions of layer 133). Suitable materials (e.g., TEOS, $SiO_2$, organosilicate glass, porous $SiO_2$, $Si_3N_4$, SiON, $HfO_2$, $Al_2O_3$, AlN, etc.) and other characteristics of the first dielectric layer 151, along with methods for depositing the first dielectric layer 151, are described above in conjunction with FIG. 3D, and those details are incorporated here.

In block 212 and fabrication stage 405 (FIG. 4E), a selective etch process is used to pattern and etch a gate opening. According to some embodiments, the gate opening is etched through the first dielectric layer 151, the etch stop layer 444, and all passivation sub-layers 131-133 of the surface passivation layer 430, while stopping on the top surface 112 of the semiconductor substrate 110. According to other embodiments in which the device is a MISFET and as shown in the callout 101-2' in the upper left corner of FIG. 4E, the gate opening is etched through the first dielectric layer 151, the etch stop layer 444, and the upper and intermediate passivation sub-layers 133, 132 of the surface passivation layer 430, while stopping on the lower passivation sub-layer 131 (i.e., a gate insulator 431 is formed from a portion of the lower passivation sub-layer 131 that remains when the process of etching the gate opening has completed). In either embodiment, photoresist layer 367 is applied over the first dielectric layer 151, and the photoresist layer 367 is processed and patterned to form an opening 360 that has a first side 361 aligned with GFP alignment structure 162 and a second side 362 aligned with GFP alignment structure 163. The first side 361 has a bottom edge (not numbered) that may terminate anywhere along the top surface of GFP alignment structure 162, and the second side 362 has a bottom edge (not numbered) that may terminate anywhere along the top surface of GFP alignment structure 163.

The portions of first dielectric layer 151, the etch stop layer(s) 444, and the passivation sub-layers 133, 132, 131 that are sequentially exposed through opening 360 are then sequentially etched through opening 360 to remove the exposed portions of the layers 151, 444, 133, 132, 131. According to some embodiments, the etching process continues until some or all of the portion of the surface passivation layer 430 that is exposed between GFP alignment structures 162 and 163 is removed. According to some embodiments, the etching process continues until a portion of the upper surface 112 of the substrate 110 between the GFP alignment structures 162, 163 is reached (e.g., the surface of cap layer 109). At this point, the upper surface 112 of the semiconductor substrate 110, sidewalls of the GFP alignment structures 162, 163, and sidewalls 165, 166, 167 of the etched-through lower, intermediate, and upper passivation sub-layers 131, 132, 133 are exposed in the opening 360. According to other embodiments (e.g., when the device is a MISFET), and as shown in callout 101-2', the etching process continues until a gate insulator 431 formed from a portion of the lower passivation sub-layer 131 is exposed between the GFP alignment structures 162, 163, at which point the etching process is terminated.

Multiple dry and/or wet etch technique(s) may be used sequentially to etch openings through the first dielectric layer 151, through the etch stop layer(s) 444, and through the upper, intermediate, and lower passivation sub-layers 133, 132, 131. The first dielectric layer 151 may be etched using chemistries and techniques described in detail in conjunction with FIG. 3E, and those details are incorporated here. The etch stop layer(s) 444 may be etched using chemistries and techniques described in detail in conjunction with FIG. 4C, and those details are incorporated here. The upper, intermediate, and lower passivation sub-layers 133, 132, 131 may be sequentially etched using chemistries and techniques described in detail in conjunction with FIG. 4B, and those details are incorporated here.

In some embodiments, such as those described above, the etch of layers 151, 444, 133, 132, 131 may be performed in multiple steps, such as by first etching the dielectric layer 151 and stopping on the etch stop layer 444, before switching chemistry to etch the etch stop layer 444 and stopping on the upper passivation sub-layer 133, before again switching chemistries to etch the upper passivation sub-layer 133 and stopping on the intermediate passivation sub-layer 132, before again switching chemistries to etch the intermediate passivation sub-layer 132 and stopping on the lower passivation sub-layer 131, and before again switching chemistry to etch the lower passivation sub-layer 131 and stop on the upper surface 112 of the semiconductor substrate 110. In other embodiments, suitable etch chemistries and techniques may be used to etch multiple layers, rather than stopping on each of layers 444, 133, 132, 131 and the surface 112 of the semiconductor substrate 110.

In block 214 and fabrication stage 406 (FIG. 4F), the gate electrode 160 (or gate metal stack) is formed by depositing one or more layers of gate metal into opening 360, and the first gate metal layer defines the gate channel 161. The gate metal layers may contact exposed sidewalls 165, 166, 167 (FIG. 4E) of the lower, intermediate, and upper passivation sub-layers 131, 132, 133, exposed sidewalls and top surfaces of the GFP alignment structures 162, 163, and sidewalls of the opening in the first dielectric layer 151. The gate electrode 161 may be formed, for example, using techniques and materials described in detail in conjunction with FIG. 3F, and those details are incorporated here. After forming the gate electrode 160, photoresist layer 367 is removed.

In block 216 and fabrication stage 407 (FIG. 4G), a second dielectric layer 154 (e.g., ILD1) is deposited over the first dielectric layer 151 and the gate electrode 160, thus forming the "additional" dielectric layers 150 of FIG. 1. The second dielectric layer 154 may be formed from materials and using methods described in detail in conjunction with FIG. 3G, and those details are incorporated here.

In addition, in block 218, a selective etch process is used to pattern and etch a field plate opening through the first and second dielectric layers 151, 154, the etch stop layer 444, and the upper and intermediate passivation sub-layers 133, 132 of the surface passivation layer 430, while leaving the lower passivation sub-layer 131 essentially intact (i.e., the etching processes stop on layer 131). Simultaneously, openings through portions of the first and second dielectric layers 151, 154 overlying the source and drain Ohmic contacts 141, 146 (FIG. 1) are etched to facilitate forming conductive vias for source and drain electrodes 140, 145 (FIG. 1) in the following fabrication stage (stage 408, FIG. 4H) corresponding to block 220.

More specifically, photoresist layer 368 is applied over the second dielectric layer 154, and the photoresist layer 368 is processed and patterned to form an opening 396 that has a first side 391 aligned with SFP alignment structure 192 and a second side 392 aligned with SFP alignment structure 193. The first side 391 has a bottom edge 397 that may terminate anywhere along the top surface of SFP alignment structure 192, and the second side 392 has a bottom edge 398 that may terminate anywhere along the top surface of SFP alignment structure 193.

The portions of second and first dielectric layers 154, 151, the etch stop layer 444, and the upper and intermediate passivation sub-layers 133, 132 that are sequentially exposed through opening 390 are sequentially etched through opening 390 to remove the exposed portions of the layers 154, 151, 444, 133, 132. In some embodiments, the etching process continues until the portions of the upper and intermediate passivation sub-layers 133, 132 that are exposed between SFP alignment structures 192 and 193 are removed. According to such embodiments, the etching process continues until a portion 395 of the upper surface of the lower passivation sub-layer 131 between the SFP alignment structures 192, 193 is reached (i.e., the etching process stops on lower passivation sub-layer 131). This process results in an unfilled field plate via 396 over and between the SFP alignment structures 192, 193, with the portion 395 of the lower passivation sub-layer 131 defining the bottom extent of the via 396. Starting at the bottom of the unfilled field plate via 396, the via sidewalls include exposed sidewalls 195, 196 of the etched-through intermediate and upper passivation sub-layers 132, 133, exposed sidewalls of the SFP alignment structures 192, 193, exposed portions of the upper surfaces of the SFP alignment structures, and exposed sidewalls of the first and second dielectric layers 151, 154. The portion 395 of the exposed surface of the lower passivation sub-layer 131 defines a recessed portion of the unfilled field plate via 396 (i.e., surface 395 is recessed with respect to the upper surface of surface passivation layer 430, or the upper surface of upper passivation sub-layer 133). The second and first dielectric layers 154, 151 may be sequentially etched using chemistries and techniques described in detail in conjunction with etching layer 151 in FIG. 4E, and the upper and intermediate passivation sub-layers 133, 132 may be sequentially etched using chemistries and techniques described in detail in conjunction with FIG. 4B, and those details are incorporated here.

Figure 4G:
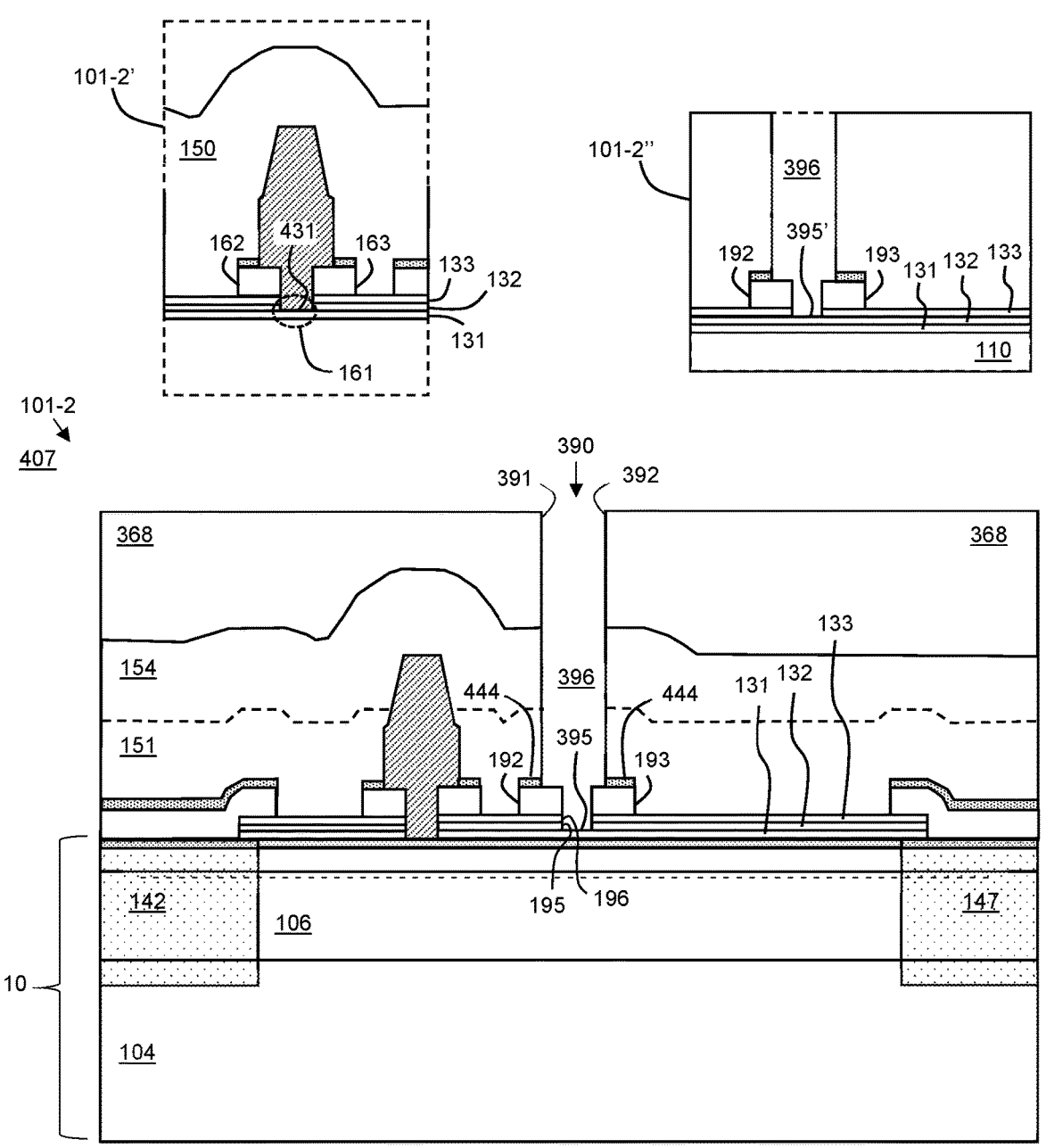
Figure 4H:
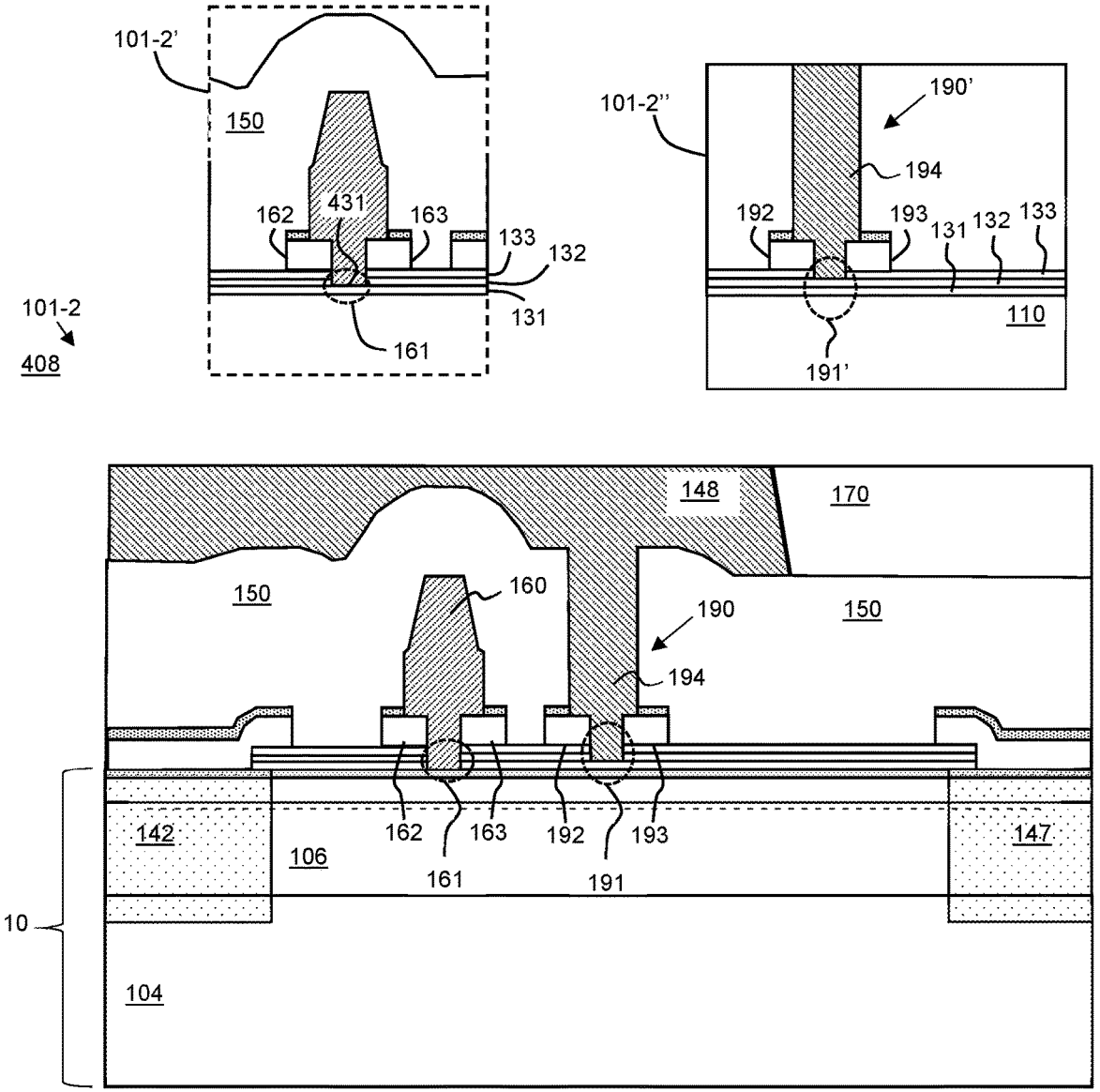

In some alternate embodiments, the intermediate passivation sub-layer 132 may define the bottom extent of the unfilled field plate via 396, as shown in callout 101-2″ in the upper right corner of FIG. 4G. In such an embodiment, portions of the second and first dielectric layers 154, 151, the etch stop layer 444, and the upper passivation sub-layer 133 that are sequentially exposed through opening 390 are sequentially etched through opening 390 to remove the exposed portions of the layers 154, 151, 444, 133. In such embodiments, the etching process continues until the portion of the upper passivation sub-layer 133 that is exposed between SFP alignment structures 192 and 193 is removed, and the intermediate passivation sub-layer 132 is not etched. In such embodiments, starting at the bottom of the unfilled field plate via 396, the via sidewalls include exposed sidewalls (not numbered) of the etched-through upper passivation sub-layer 133, exposed sidewalls of the SFP alignment structures 192, 193, exposed portions of the upper surfaces of the SFP alignment structures, and exposed sidewalls of the first and second dielectric layers 151, 154. As shown in the callout 101-2″, the portion 395′ of the exposed surface of the intermediate passivation sub-layer 132 defines a recessed portion of the unfilled field plate via 396. The alternate embodiment shown in callout 101-2″ may be used both in devices that do not include a gate insulator and in devices (e.g., MISFETs) that do include a gate insulator (e.g., gate insulator 431 in callout 101-2′). Either way, the gate electrode 160 extends deeper into the passivation layer 430 than the subsequently-formed conductive field plate does (i.e., the gate electrode 160 is recessed with respect to the subsequently-formed conductive field plate 190, 190′). In other MISFET embodiments, gate insulator 431 and recessed field plate dielectric 395 both may be formed by the lower surface passivation sub-layer 131, resulting in a cascode MISFET structure.

In block 220 and fabrication stage 408 (FIG. 4H), the photoresist 368 (FIG. 4G) is removed and source and drain metallization 148, 149 are deposited, resulting in the recessed SFP region 191 and the conductive field plate via 194, which connects with additional overlying source metallization 148. Further, the source metallization 148 is deposited so that it extends from the conductive field plate via 194 over the second dielectric layer 154 to the source contact 141. This completes the formation of the source-connected field plate 190, which includes the recessed SFP region 191, and the SFP alignment structures 192, 193. As indicated above, a bottom extent of the recessed SFP region 191 may contact the lower passivation sub-layer 131, and exposed sidewalls 195, 196 of the etched-through intermediate and upper passivation sub-layers 132, 133, in some embodiments. In other embodiments, such as shown in the callout 101-2″ in the upper right corner of FIG. 4H, the bottom extent of the recessed SFP region 191 may contact the intermediate passivation sub-layer 131. The source and drain metallization 148, 149 may be formed, for example, using techniques and materials described in detail in conjunction with FIG. 3H, and those details are incorporated here. At this point, in block 222, the device 100 may be completed by depositing the final passivation layers 170 and 180 (FIG. 1), as described above in conjunction with FIG. 3, and those details are incorporated here.

Embodiment 3 (FIGS. 5A-H)

FIG. 2 will be used again to describe fabrication steps for an alternate embodiment of GaN HFET 100 in FIG. 1. These fabrication steps are shown in detail in FIGS. 5A-H (collectively FIG. 5). More specifically, FIG. 5, which includes FIGS. 5A-H includes cross-sectional, side views of an embodiment of portion 101-3 of GaN HFET device 100 during a sequence of fabrication steps. It should be noted that portion 101-3 corresponds to portion 101 of FIG. 1, where the "-3" indicates that this is a third embodiment of portion 101. The most notable differences between portion 101-2 (FIG. 4) and 101-3 (FIG. 5) are that, in forming portion 101-3, an etch stop layer 544 is deposited after the SFP and GFP alignment regions 162, 163, 192, 193 have been formed. This difference will be discussed in more detail below.

Referring initially to FIGS. 1 and 2, fabrication of this alternate embodiment of GaN HFET device 100 begins, in block 202, by providing a semiconductor substrate 110 in which Ohmic source and drain implants (e.g., source and drain implants 142, 147) have already been formed. Details associated with providing the semiconductor substrate 110 and forming the Ohmic source and drain implants were discussed in detail above in conjunction with the description of forming portion 101-1 and Embodiment 1. In the interest of conciseness, those details are not repeated here, but instead those details are intended to be incorporated here into the description of forming portion 101-3 and this Embodiment 3. Briefly, providing the semiconductor substrate 110 includes providing a host substrate 102, and forming various semiconductor layers (e.g., a nucleation layer (not shown), a buffer layer 104, a channel layer 106, a barrier layer 108, and optionally a cap layer 109) on or over an upper surface 103 of the host substrate 102. Embodiments of the method may optionally include forming doped (e.g., ion-implanted) source and drain regions 142 and 147 (FIG. 1), as also discussed above in conjunction with block 202 and Embodiment 1.

Referring now to FIGS. 2 and 5A, in block 204 and fabrication stage 501 (FIG. 5A), a surface passivation layer 430 is formed on the upper surface 112 of the semiconductor substrate 110. According to an embodiment, the surface passivation layer 430 includes at least three passivation sub-layers 131, 132, 133 (e.g., lower, intermediate, and upper passivation sub-layers 131, 132, 133, respectively). In some embodiments, such as that shown in FIG. 5A, surface passivation layer 430 includes three passivation sub-layers 131, 132, 133. In an alternate embodiment (e.g., as described in conjunction with FIG. 3), surface passivation layer 430 may include only two passivation sub-layers 131, 133 (e.g., the intermediate passivation layer 132 may be excluded). Details regarding the materials, deposition methods, and other characteristics for a two-layer surface passivation layer 130 were described in detail in conjunction with FIG. 3A, and details regarding the materials, deposition methods, and other characteristics for a three-layer surface passivation layer 430 were described in detail in conjunction with FIG. 4A, and those descriptions are incorporated here.

Referring now to FIGS. 1, 2, and 5B, in block 206 and fabrication stage 502 (FIG. 5B), openings 330 for the source and drain Ohmic contacts (e.g., contacts 141, 146, FIG. 1, not shown in FIG. 5) are formed in the surface passivation layer 430 over the source and drain implants 142, 147 (FIG. 1). Forming the openings 330 includes sequentially etching the upper, intermediate, and lower passivation sub-layers 133, 132, 131. The upper, intermediate, and lower passivation sub-layers 133, 132, 131 may be sequentially etched using chemistries and techniques described in detail in conjunction with FIG. 4B, and those details are incorporated here.

Again, once formed, the openings 330 in the surface passivation layer 430 may extend across upper surface 112 from the ultimate locations of the later-formed source and drain electrodes 140, 145 (FIG. 1) into the portion 101 of the device 100 where the gate 160 and field plate 190 eventually will be formed. Accordingly, as shown in FIG. 5B, portions 113, 114 of the upper surface 112 of the semiconductor substrate 110 are exposed through the openings 330 on either side of the patterned surface passivation layer 430.

Further, in block 206, a conductive layer 144 is formed on or over the surface passivation layer 430, the portions of the upper surface 112 of the substrate 110 that are exposed over the source and drain implants 142, 147 (FIG. 1), and the additional exposed portions 113, 114 of the upper surface 112 of the substrate 110 that extend between the source and drain implants 142, 147 and the surface passivation layer 430. Suitable materials (e.g., Ti, TiAl, TiW, etc.) and other characteristics of the conductive layer 144, along with methods for depositing and annealing the conductive layer 144, are described above in conjunction with FIG. 3B, and those details are incorporated here.

In block 208 and fabrication stage 503 (FIG. 5C), a selective etch process is used to pattern and etch the conductive layer 144 to form the GFP alignment structures 162, 163 and the SFP alignment structures 192, 193. More specifically, photoresist layer 366 is applied over conductive layer 144, and a mask is used to pattern the photoresist layer 366 to expose portions of the conductive layer 144 through openings (not numbered) in the photoresist layer 366. The conductive layer 144 is then etched through the photoresist openings to remove the exposed portions all the way to the upper surface of the surface passivation layer 430 (i.e., the surface of layer 133). The conductive layer 144 may be etched using chemistries and techniques described in detail in conjunction with FIG. 3C, and those details are incorporated here.

The selective etch process results in the formation of the conductive GFP and SFP alignment structures 162, 163, 192, 193, along with conductive extensions 340, 345 that extend from the surface passivation layer 430 to overlie the source and drain implants 142, 147 (FIG. 1), respectively. Once the selective etch process has been completed, the photoresist 366 is removed.

In block 210 and fabrication stage 504 (FIG. 5D), one or more etch stop layers 544 and a first dielectric layer 151 (e.g., ILD0) are sequentially deposited over the source and drain contact extensions 340, 345, the GFP and SFP alignment structures 162, 163, 192, 193, and exposed portions of surface passivation layer 430 (i.e., exposed portions of layer 133). Etch stop layer(s) 544 may be formed from the same or different material layers as etch stop layer(s) 444 discussed in conjunction with FIG. 4. Suitable materials, deposition techniques, and other characteristics of the etch stop layer(s) 544 are described above in conjunction with etch stop layer(s) 444, FIG. 4B, and those details are incorporated here. Further, suitable materials (e.g., TEOS, SiO$_2$, organo-silicate glass, porous SiO$_2$, Si$_3$N$_4$, SiON, HfO$_2$, Al$_2$O$_3$, AlN, etc.) and other characteristics of the first dielectric layer 151, along with methods for depositing the first dielectric layer 151, are described above in conjunction with FIG. 3D, and those details are incorporated here.

In block 212 and fabrication stage 505 (FIG. 5E), a selective etch process is used to pattern and etch a gate opening. According to some embodiments, the gate opening is etched through the first dielectric layer 151, the etch stop layer 544, and all passivation sub-layers 131-133 of the surface passivation layer 430, while stopping on the top surface 112 of the semiconductor substrate 110. According to other embodiments in which the device is a MISFET and as shown in the callout 101-3' in the upper left corner of FIG. 5E, the gate opening is etched through the first dielectric layer 151, the etch stop layer 544, and the upper and intermediate passivation sub-layers 133, 132 of the surface passivation layer 430, while stopping on the lower passivation sub-layer 131 (i.e., a gate insulator 431 is formed from a portion of the lower passivation sub-layer 131 that remains when the process of etching the gate opening has completed). In either embodiment, photoresist layer 367 is applied over the first dielectric layer 151, and the photoresist layer 367 is processed and patterned to form an opening 360 that has a first side 361 aligned with GFP alignment structure 162 and a second side 362 aligned with GFP alignment structure 163. The first side 361 has a bottom edge (not numbered) that may terminate anywhere along the top surface of GFP alignment structure 162, and the second side 362 has a bottom edge (not numbered) that may terminate anywhere along the top surface of GFP alignment structure 163.

The portions of first dielectric layer 151, the etch stop layer(s) 544, and all passivation sub-layers 133, 132, 131 of the surface passivation layer 430 that are sequentially exposed through opening 360 are then sequentially etched through opening 360 to remove the exposed portions of the layers 151, 544, 133, 132, 131. According to some embodiments, the etching process continues until some or all of the portion of the surface passivation layer 430 that is exposed between GFP alignment structures 162 and 163 is removed. According to some embodiments, the etching process continues until a portion of the upper surface 112 of the substrate 110 between the GFP alignment structures 162, 163 is reached (e.g., the surface of cap layer 109). According to other embodiments (e.g., when the device is a MISFET), and as shown in callout 101-3', the etching process continues until a gate insulator 431 formed from a portion of the lower passivation sub-layer 131 is exposed between the GFP alignment structures 162, 163, at which point the etching process is terminated.

Multiple dry and/or wet etch technique(s) may be used sequentially to etch openings through the first dielectric layer 151, through the etch stop layer(s) 544, and through the upper, intermediate, and lower passivation sub-layers 133, 132, 131. The first dielectric layer 151, the etch stop layer 544, and the upper, intermediate, and lower passivation sub-layers 133, 132, 131 may be sequentially etched using chemistries and techniques described in detail in conjunction with FIGS. 4B and 4E, and those details are incorporated here.

In block 214 and fabrication stage 506 (FIG. 5F), the gate electrode 160 (or gate metal stack) is formed by depositing one or more layers of gate metal into opening 360, and the first gate metal layer defines the gate channel 161. The gate electrode 160 may be formed, for example, using techniques and materials described in detail in conjunction with FIG. 3F, and those details are incorporated here. After forming the gate electrode 160, photoresist layer 367 is removed.

In block 216 and fabrication stage 507 (FIG. 5G), a second dielectric layer 154 (e.g., ILD1) is deposited over the first dielectric layer 151 and the gate electrode 160, thus forming the "additional" dielectric layers 150 of FIG. 1. The second dielectric layer 154 may be formed from materials and using methods described in detail in conjunction with FIG. 3G, and those details are incorporated here.

In addition, in block 218, a selective etch process is used to pattern and etch a field plate opening through the first and second dielectric layers 151, 154, the etch stop layer 544, and the upper and intermediate passivation sub-layers 133, 132 of the surface passivation layer 430, while leaving the lower passivation sub-layer 131 essentially intact (i.e., the etching processes stop on layer 131). Simultaneously, openings through portions of the first and second dielectric layers 151, 154 overlying the source and drain Ohmic contacts 141, 146 (FIG. 1) are etched to facilitate forming conductive vias for source and drain electrodes 140, 145 (FIG. 1) in the following fabrication stage (stage 508, FIG. 5H) corresponding to block 220.

More specifically, photoresist layer 368 is applied over the second dielectric layer 154, and the photoresist layer 368 is processed and patterned to form an opening 396 that has a first side 391 aligned with SFP alignment structure 192 and a second side 392 aligned with SFP alignment structure 193. The first side 391 has a bottom edge 397 that may terminate anywhere along the top surface of SFP alignment structure 192, and the second side 392 has a bottom edge 398 that may terminate anywhere along the top surface of SFP alignment structure 193.

The portions of second and first dielectric layers 154, 151, the etch stop layer 544, and the upper and intermediate passivation sub-layers 133, 132 that are sequentially exposed through opening 390 are sequentially etched through opening 390 to remove the exposed portions of the layers 154, 151, 544, 133, 132. The etching process continues until the portions of the upper and intermediate passivation sub-layers 133, 132 that are exposed between SFP alignment structures 192 and 193 are removed. According to an embodiment, the etching process continues until a portion 395 of the upper surface of the lower passivation sub-layer 131 between the SFP alignment structures 192, 193 is reached (i.e., the etching process stops on lower passivation sub-layer 131). This process results in an unfilled field plate via 396 over and between the SFP alignment structures 192, 193, with the portion 395 of the lower passivation sub-layer 131 defining the bottom extent of the via 396. Starting at the bottom of the unfilled field plate via 396, the via sidewalls include exposed sidewalls (not numbered) of the etched-through intermediate and upper passivation sub-layers 132, 133, exposed sidewalls of the SFP alignment structures 192, 193, exposed portions of the upper surfaces of the SFP alignment structures, and exposed sidewalls of the first and second dielectric layers 151, 154. The portion 395 of the exposed surface of the lower passivation sub-layer 131 defines a recessed portion of the unfilled field plate via 396 (i.e., surface 395 is recessed with respect to the upper surface of surface passivation layer 430, or the upper surface of upper passivation sub-layer 133). The second and first dielectric layers 154, 151 may be sequentially etched using chemistries and techniques described in detail in conjunction with etching layer 151 in FIG. 4E, and the upper and intermediate passivation sub-layers 133, 132 may be sequentially etched using chemistries and techniques described in detail in conjunction with FIG. 4B, and those details are incorporated here.

In other embodiments, as indicated in callout 101-3" in the upper right corner of FIG. 5G, only the upper passivation sub-layer 133 is etched, and the portion 395' of the exposed surface of the intermediate passivation sub-layer 132 defines a recessed portion of the unfilled field plate via 396. The alternate embodiment shown in callout 101-3" may be used both in devices that do not include a gate insulator and in devices (e.g., MISFETs) that do include a gate insulator (e.g., gate insulator 431 in callout 101-3'). Either way, the gate electrode 160 extends deeper into the passivation layer 430 than the subsequently-formed conductive field plate does (i.e., the gate electrode 160 is recessed with respect to the subsequently-formed conductive field plate 190, 190'). In other MISFET embodiments, gate insulator 431 and recessed field plate dielectric 395 both may be formed by the lower surface passivation sub-layer 131, resulting in a cascode MISFET structure.

In block 220 and fabrication stage 508 (FIG. 5H), the photoresist 368 (FIG. 5G) is removed and source and drain metallization 148, 149 are deposited, resulting in the recessed SFP region 191 and the conductive field plate via 194, which connects with additional overlying source metallization 148. Further, the source metallization 148 is deposited so that it extends from the conductive field plate via 194 over the second dielectric layer 154 to the source contact 141. This completes the formation of the source-connected field plate 190, which includes the recessed SFP region 191, and the SFP alignment structures 192, 193. As indicated above, a bottom extent of the recessed SFP region 191 may contact the lower passivation sub-layer 131, in some embodiments. In other embodiments, such as shown in the callout 101-3' in the upper right corner of FIG. 5H, the bottom extent of the recessed SFP region 191 may contact the intermediate passivation sub-layer 131. The source and drain metallization 148, 149 may be formed, for example, using techniques and materials described in detail in conjunction with FIG. 3H, and those details are incorporated here. At this point, in block 222, the device 100 may be completed by depositing the final passivation layers 170 and 180 (FIG. 1), as described above in conjunction with FIG. 3, and those details are incorporated here.

Embodiment 4 (FIGS. 6A-H)

FIG. 2 will be used again to describe fabrication steps for an alternate embodiment of GaN HFET 100 in FIG. 1. These fabrication steps are shown in detail in FIGS. 6A-H (collectively FIG. 6). More specifically, FIG. 6, which includes FIGS. 6A-H includes cross-sectional, side views of an embodiment of portion 101-4 of GaN HFET device 100 during a sequence of fabrication steps. It should be noted that portion 101-4 corresponds to portion 101 of FIG. 1, where the "–4" indicates that this is a fourth embodiment of portion 101. The most notable differences between portion 101-1 (FIG. 3) and 101-4 (FIG. 6) are that, in forming portion 101-4, a refractory metal layer 644 is deposited on the surface passivation layer 130 to form a diffusion barrier for the Ohmic anneal process. This difference will be discussed in more detail below.

Referring initially to FIGS. 1 and 2, fabrication of this alternate embodiment of GaN HFET device 100 begins, in block 202, by providing a semiconductor substrate 110, in this case without pre-formed Ohmic source and drain implants. Details associated with providing the semiconductor substrate 110 were discussed in detail above in conjunction with the description of forming portion 101-1 and Embodiment 1. In the interest of conciseness, those details are not repeated here, but instead those details are intended to be incorporated here into the description of forming portion 101-4 and this Embodiment 4. Briefly, providing the semiconductor substrate 110 includes providing a host substrate 102, and forming various semiconductor layers (e.g., a nucleation layer (not shown), a buffer layer 104, a channel layer 106, a barrier layer 108, and optionally a cap layer 109) on or over an upper surface 103 of the host substrate 102.

Referring now to FIGS. 2 and 6A, in block 204 and fabrication stage 601 (FIG. 6A), a surface passivation layer 130 is formed on the upper surface 112 of the semiconductor substrate 110. According to an embodiment, the surface passivation layer 130 includes at least two passivation sub-layers 131, 133 (e.g., lower and upper passivation sub-layers 131, 133, respectively). In some embodiments, such as that shown in FIG. 6A, surface passivation layer 130 includes two passivation sub-layers 131, 133. In an alternate embodiment (e.g., as described in conjunction with FIG. 4), surface passivation layer 130 may include three passivation sub-layers 131, 132, 133. Details regarding the materials, deposition methods, and other characteristics for a two-layer surface passivation layer 130 were described in detail in conjunction with FIG. 3A, and that description is incorporated here.

After forming the surface passivation layer 130, a refractory metal layer 644 is deposited on the upper surface of the surface passivation layer 130 to form a diffusion barrier for the subsequently-performed Ohmic contact anneal. In various embodiments, the refractory metal layer 644 may be formed from TiW, TiN, TaN, TiWN, tungsten (W), or other suitable materials. The thickness of the refractory metal layer 644 may be between about 20 angstroms and about 1000 angstroms, although other thicknesses may be used.

Referring now to FIGS. 1, 2, and 6B-1, in block 206 and fabrication stage 602 (FIG. 6B-1), openings 330 for the source and drain Ohmic contacts (e.g., contacts 141, 146, FIG. 1, not shown in FIG. 6) are formed in the surface passivation layer 130 at source and drain sides of the channel. Forming the openings 330 includes sequentially etching the refractory metal layer 644 and the upper and lower passivation sub-layers 133, 131. According to an embodiment, a plasma etch using $Cl_2+CF_4$, $BCl_3+CF_4$, or $CF_4+O_2$, or $SF_6$ and $O_2$ plasma may be used to etch the refractory metal layer 644, while stopping on the surface passivation layer 130. The upper, and lower passivation sub-layers 133, 131 may be sequentially etched using chemistries and techniques described in detail in conjunction with FIG. 3B, and those details are incorporated here.

Again, once formed, the openings 330 in the surface passivation layer 130 may extend across upper surface 112 from the ultimate locations of the later-formed source and drain electrodes 140, 145 (FIG. 1) into the portion 101 of the device 100 where the gate 160 and field plate 190 eventually will be formed. Accordingly, as shown in FIG. 6B-1, portions 113, 114 of the upper surface 112 of the semiconductor substrate 110 are exposed through the openings 330 on either side of the patterned surface passivation layer 130.

Further, in block 206, and according to some embodiments, a conductive layer 144 (e.g., an Ohmic metal layer) is formed on or over the surface passivation layer 130, the refractory metal layer 644, and the exposed portions of the upper surface 112 of the substrate 110. The conductive layer 144 should be formed from an Ohmic metal that is suitable for forming an Ohmic contact under high temperature anneal. Desirably, this annealing process (e.g., rapid thermal annealing) may be performed at this point to form an alloyed Ohmic contact between conductive layer 144 and the semiconductor surface in surface passivation opening 330.

For example, the conductive layer 144 may be formed from titanium-aluminum-gold (TiAlAu) or other previously-discussed suitable materials. According to some embodiments, it may be desirable for the conductive layer 144 to include gold, which enables layer 144 to function as a hard mask during subsequent etching processes (e.g., as described below in conjunction with FIG. 6C-2). Methods for depositing and annealing the conductive layer 144, are described above in conjunction with FIG. 3B, and those details are incorporated herein. As indicated above, the refractory metal layer 644 functions as a diffusion barrier during a subsequently-performed annealing process that is optimized to form alloyed Ohmic contacts.

In block 208 and fabrication stage 603 (FIG. 6C-1), according to some embodiments, a selective etch process is used to pattern and etch the conductive layer 144 and the refractory metal layer 644 to form the GFP alignment structures 162, 163 and the SFP alignment structures 192, 193. More specifically, photoresist layer 366 is applied over conductive layer 144, and a mask is used to pattern the photoresist layer 366 to expose portions of the conductive layer 144 through openings (not numbered) in the photoresist layer 366. The conductive layer 144 and the refractory metal layer 644 are then etched through the photoresist openings to remove the exposed portions all the way to the upper surface of the surface passivation layer 130 (i.e., the surface of layer 133). The conductive layer 144 may be etched using suitable wet or preferably dry etch techniques suitable for the materials used for layer 144.

In one embodiment, a timed ion mill etch process may be employed, which leverages the underlying refractory metal layer 644 to provide an over-etch margin for this non selective process. Subsequently, the remaining refractory metal layer 644 may be etched using techniques described in detail in conjunction with FIG. 3C, and those details are incorporated herein. According to an embodiment, a plasma etch using $Cl_2+CF_4$, $BCl_3+CF_4$, or $CF_4+O_2$, or $SF_6$ and $O_2$ plasma may be used to etch the refractory metal layer 644, while stopping on the surface passivation layer 130. According to an embodiment, the etch selectivity between the refractory metal layer 644 and the underlying upper passivation sub-layer 133 is >50:2 (e.g., when the refractory metal layer 644 includes TiW and the upper passivation sub-layer 133 includes $Al_2O_3$).

The selective etch process results in the formation of the conductive GFP and SFP alignment structures 162, 163, 192, 193, along with conductive extensions 340, 345 that extend from the surface passivation layer 130 to overlie the source and drain implants 142, 147 (FIG. 1), respectively. Once the selective etch process has been completed, the photoresist 366 is removed.

As described above, embodiments of performing blocks 206 and 208 include blanket deposition of the conductive layer 144 (block 206 and FIG. 6B-1), and a subtractive etch process (block 208 and FIG. 6C-1) to form the GFP and SFP alignment structures 162, 163, 192, 193. According to an alternate embodiment, as indicated in FIGS. 6B-2 and 6C-2, an additive deposition process (e.g., using a lift-off process) instead may be performed to form the GFP and SFP alignment structures 162, 163, 192, 193.

More specifically, after fabrication stage 601 (FIG. 6A), and referring first to FIG. 6B-2, in block 206 and alternate fabrication stage 602', openings 330 for the source and drain Ohmic contacts (e.g., contacts 141, 146, FIG. 1, not shown in FIG. 6) are formed in the surface passivation layer 130 at source and drain sides of the channel, as described above in conjunction with fabrication stage 602 (FIG. 6B-1). After forming the openings 330 in the surface passivation layer 130, photoresist 664 is applied to the upper surface of refractory metal layer 644 and exposed portions of the upper surface of substrate 110, and photoresist 664 is patterned to include first and second openings 665, 667. The first openings 665 overlie the previously-formed openings 330, while extending over the source-side and drain-side ends of the stacked passivation and refractory metal layers 130, 644.

The second openings 667 correspond to the locations of the to-be-formed GFP and SFP alignment structures 162, 163, 192, 193. At this point, conductive layer 144 is deposited through openings 665 over the exposed portions of the upper surface 112 of the substrate 110, and through openings 667 over the exposed portions of the refractory metal layer 644. Photoresist 664 and portions of the conductive layer 144 that deposit on the surfaces of the photoresist 664 are then removed using a lift-off process.

Referring next to FIG. 6C-2, in block 208 and alternate fabrication stage 603', exposed portions of the refractory metal layer 644 are then removed. As indicated previously, conductive layer 144 may be a gold-containing layer, which enables the portions of conductive layer 144 that overlie the refractory metal layer 644 to function as a hard mask while etching the exposed portions of the refractory metal layer 644. According to an embodiment, a plasma etch using $Cl_2+CF_4$, $BCl_3+CF_4$, or $CF_4+O_2$, or $SF_6$ and $O_2$ plasma may be used to etch the refractory metal layer 644, while stopping on the surface passivation layer 130. Upon conclusion of this etching process, the GFP and SFP alignment structures 162, 163, 192, 193 (with underlying portions of the refractory metal layer 644) have been formed.

Regardless of whether subtractive or additive processes are used to form the GFP and SFP alignment structures 162, 163, 192, 193, the process continues in block 210 and fabrication stage 604 (FIG. 6D), by depositing a first dielectric layer 151 (e.g., ILD0) over the source and drain contact extensions 340, 345, the GFP and SFP alignment structures 162, 163, 192, 193, and exposed portions of surface passivation layer 130 (i.e., exposed portions of layer 133). Suitable materials (e.g., TEOS, $SiO_2$, organo-silicate glass, porous $SiO_2$, $Si_3N_4$, SiON, $HfO_2$, $Al_2O_3$, AlN, etc.) and other characteristics of the first dielectric layer 151, along with methods for depositing the first dielectric layer 151, are described above in conjunction with FIG. 3D, and those details are incorporated here. Desirably, at this point, an annealing process (e.g., rapid thermal annealing) may be performed to alloy the Ohmic contact metal of layer 144. Once conductive layer 144 has been annealed, portions of the conductive layer 144 form Ohmic source and drain contacts 141, 146 (FIG. 1). In other embodiments, the annealing process may be performed at a different stage of fabrication. As mentioned above, in other embodiments that use the subtractive process described in conjunction with FIGS. 6B-1 and 6B-2, annealing the Ohmic metal is preferably performed directly following deposition of conductive layer 144 in fabrication stage 602.

In block 212 and fabrication stage 605 (FIG. 6E), a selective etch process is used to pattern and etch a gate opening through the first dielectric layer 151 and all passivation sub-layers 131, 133 of the surface passivation layer 130, while stopping on the top surface 112 of the semiconductor substrate 110. More specifically, photoresist layer 367 is applied over the first dielectric layer 151, and the photoresist layer 367 is processed and patterned to form an opening 360 that has a first side 361 aligned with GFP alignment structure 162 and a second side 362 aligned with GFP alignment structure 163. The first side 361 has a bottom edge (not numbered) that may terminate anywhere along the top surface of GFP alignment structure 162, and the second side 362 has a bottom edge (not numbered) that may terminate anywhere along the top surface of GFP alignment structure 163.

The portions of first dielectric layer 151 and the passivation sub-layers 133, 131 of the surface passivation layer 130 that are sequentially exposed through opening 360 are then sequentially etched through opening 360 to remove the exposed portions of the layers 151, 133, 131. The etching process continues until the portion of the surface passivation layer 130 that is exposed between GFP alignment structures 162 and 163 is removed. According to an embodiment, the etching process continues until a portion upper surface 112 of the substrate 110 between the GFP alignment structures 162, 163 is reached (e.g., the surface of cap layer 109).

Multiple dry and/or wet etch technique(s) may be used sequentially to etch openings through the first dielectric layer 151 and through the upper and lower passivation sub-layers 133, 131. The first dielectric layer 151 and the upper and lower passivation sub-layers 133, 131 may be sequentially etched using chemistries and techniques described in detail in conjunction with FIGS. 3B and 3E, and those details are incorporated herein.

In block 214 and fabrication stage 606 (FIG. 6F), the gate electrode 160 (or gate metal stack) is formed by depositing one or more layers of gate metal into opening 360, and the first gate metal layer defines the gate channel 161. The gate electrode 161 may be formed, for example, using techniques and materials described in detail in conjunction with FIG. 3F, and those details are incorporated herein. After forming the gate electrode 160, photoresist layer 367 is removed.

In block 216 and fabrication stage 607 (FIG. 6G), a second dielectric layer 154 (e.g., ILD1) is deposited over the first dielectric layer 151 and the gate electrode 160, thus forming the "additional" dielectric layers 150 of FIG. 1. The second dielectric layer 154 may be formed from materials and using methods described in detail in conjunction with FIG. 3G, and those details are incorporated here.

In addition, in block 218, a selective etch process is used to pattern and etch a field plate opening through the first and second dielectric layers 151, 154 and the upper passivation sub-layer 133 of the surface passivation layer 130, while leaving the lower passivation sub-layer 131 essentially intact (i.e., the etching processes stop on layer 131). Simultaneously, openings through portions of the first and second dielectric layers 151, 154 overlying the source and drain Ohmic contacts 141, 146 (FIG. 1) are etched to facilitate forming conductive vias for source and drain electrodes 140, 145 (FIG. 1) in the following fabrication stage (stage 608, FIG. 6H) corresponding to block 220.

More specifically, photoresist layer 368 is applied over the second dielectric layer 154, and the photoresist layer 368 is processed and patterned to form an opening 396 that has a first side 391 aligned with SFP alignment structure 192 and a second side 392 aligned with SFP alignment structure 193. The first side 391 has a bottom edge 397 that may terminate anywhere along the top surface of SFP alignment structure 192, and the second side 392 has a bottom edge 398 that may terminate anywhere along the top surface of SFP alignment structure 193.

The portions of second and first dielectric layers 154, 151 and the upper passivation sub-layer 133 that are sequentially exposed through opening 390 are sequentially etched through opening 390 to remove the exposed portions of the layers 154, 151, 133. The etching process continues until the portion of the upper passivation sub-layer 133 that is exposed between SFP alignment structures 192 and 193 is removed. According to an embodiment, the etching process continues until a portion 395 of the upper surface of the lower passivation sub-layer 131 between the SFP alignment structures 192, 193 is reached (i.e., the etching process stops on lower passivation sub-layer 131). This process results in an unfilled field plate via 396 over and between the SFP alignment structures 192, 193, with the portion 395 of the lower passivation sub-layer 131 defining the bottom extent of the via 396. Starting at the bottom of the unfilled field plate via 396, the via sidewalls include exposed sidewalls (not numbered) of the etched-through upper passivation sub-layer 133, exposed sidewalls (not numbered) of the etched-through refractory metal layer 644, exposed sidewalls of the SFP alignment structures 192, 193, exposed portions of the upper surfaces of the SFP alignment structures, and exposed sidewalls of the first and second dielectric layers 151, 154. The portion 395 of the exposed surface of the lower passivation sub-layer 131 defines a recessed portion of the unfilled field plate via 396 (i.e., surface 395 is recessed with respect to the upper surface of surface passivation layer 430, or the upper surface of upper passivation sub-layer 133). The second and first dielectric layers 154, 151 may be sequentially etched using chemistries and techniques described in detail in conjunction with etching layer 151 in FIG. 3E, and the upper passivation sub-layer 133 may be etched using chemistries and techniques described in detail in conjunction with FIG. 3B, and those details are incorporated herein.

In block 220 and fabrication stage 608 (FIG. 6H), the photoresist 368 (FIG. 6G) is removed and source and drain metallization 148, 149 are deposited, resulting in the recessed SFP region 191 and the conductive field plate via 194, which connects with additional overlying source metallization 148. Further, the source metallization 148 is deposited so that it extends from the conductive field plate via 194 over the second dielectric layer 154 to the source contact 141. This completes the formation of the source-connected field plate 190, which includes the recessed SFP region 191, and the SFP alignment structures 192, 193. The source and drain metallization 148, 149 may be formed, for example, using techniques and materials described in detail in conjunction with FIG. 3H, and those details are incorporated herein. At this point, in block 222, the device 100 may be completed by depositing the final passivation layers 170 and 180 (FIG. 1), as described above in conjunction with FIG. 3, and those details are incorporated herein.

Embodiment 5 (FIGS. 7A-H)

FIG. 2 will be used again to describe fabrication steps for an alternate embodiment of GaN HFET 100 in FIG. 1. These fabrication steps are shown in detail in FIGS. 7A-H (collectively FIG. 7). More specifically, FIG. 7, which includes FIGS. 7A-H includes cross-sectional, side views of an embodiment of portion 101-5 of GaN HFET device 100 during a sequence of fabrication steps. It should be noted that portion 101-5 corresponds to portion 101 of FIG. 1, where the "-5" indicates that this is a fifth embodiment of portion 101. The most notable differences between portion 101-1 (FIG. 3) and 101-5 (FIG. 7) are that, in forming portion 101-5, a dielectric step structure 730 is deposited on the surface passivation layer 130 prior to forming the SFP alignment structures 192, 793, and the drain-side SFP alignment structure 793 extends from the surface passivation layer 130 up onto an upper surface of the dielectric step structure 730. Including the dielectric step structure 730 enables a different dielectric thickness to be established under the drain-side SFP alignment structure 793, which may have the beneficial effect of reducing the electric field around the SFP alignment structures 192, 193 to enhance reliability and the dielectric voltage withstand capability.

Referring initially to FIGS. 1 and 2, fabrication of this alternate embodiment of GaN HFET device 100 begins, in block 202, by providing a semiconductor substrate 110 in which Ohmic source and drain implants (e.g., source and drain implants 142, 147) have already been formed. Details associated with providing the semiconductor substrate 110 and forming the Ohmic source and drain implants were discussed in detail above in conjunction with the description of forming portion 101-1 and Embodiment 1. In the interest of conciseness, those details are not repeated here, but instead those details are intended to be incorporated here into the description of forming portion 101-5 and this Embodiment 5. Briefly, providing the semiconductor substrate 110 includes providing a host substrate 102, and forming various semiconductor layers (e.g., a nucleation layer (not shown), a buffer layer 104, a channel layer 106, a barrier layer 108, and optionally a cap layer 109) on or over an upper surface 103 of the host substrate 102. Embodiments of the method may optionally include forming doped (e.g., ion-implanted) source and drain regions 142 and 147 (FIG. 1), as also discussed above in conjunction with block 202 and Embodiment 1.

Figure 7A:
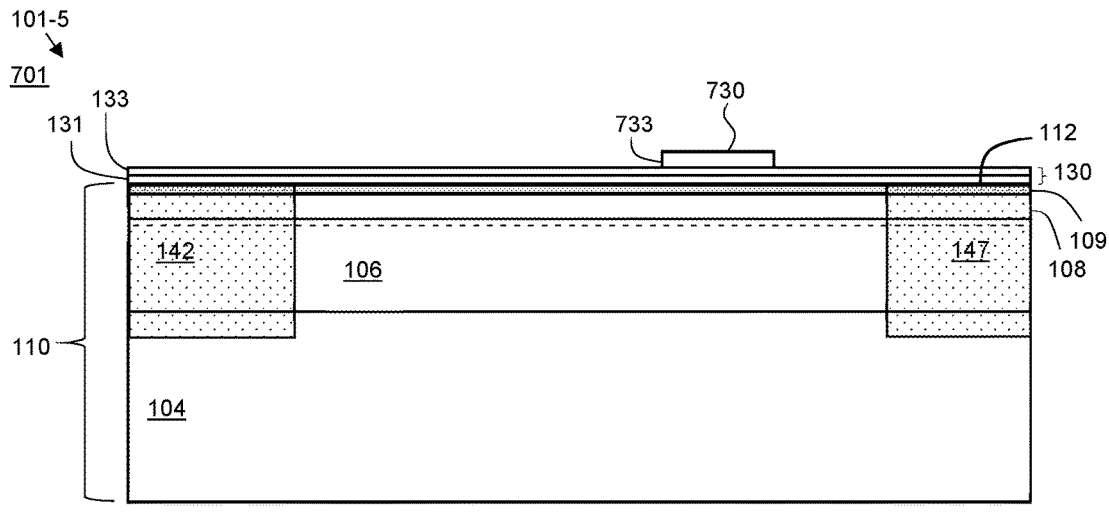
FIGS. 7A, 7B, 7C, 7D, 7E, 7F, 7G, and 7H (collectively FIG. 7) are cross-sectional, side views of another embodiment of an HFET device during a sequence of fabrication steps, according to another fabrication embodiment.

Referring now to FIGS. 2 and 7A, in block 204 and fabrication stage 701 (FIG. 7A), a surface passivation layer 130 is formed on the upper surface 112 of the semiconductor substrate 110. According to an embodiment, the surface passivation layer 130 includes at least two passivation-dielectric layers 131, 133 (e.g., lower and upper passivation-dielectric layers 131, 133, respectively). In some embodiments, such as that shown in FIG. 7A, surface passivation layer 130 includes two passivation-dielectric layers 131, 133. In an alternate embodiment (e.g., as described in conjunction with FIG. 4), surface passivation layer 130 may include three passivation-dielectric layers 131, 132, 133. Details regarding the materials, deposition methods, and other characteristics for a two-layer surface passivation layer 130 were described in detail in conjunction with FIG. 3A, and that description is incorporated here.

After forming the surface passivation layer 130, an additional dielectric layer 733 is deposited on the upper surface of the surface passivation layer 130, and patterned to form a dielectric step structure 730 on the upper surface of the surface passivation layer 130. In other embodiments, the additional dielectric layer may be formed from multiple layers (e.g., a stack of an $Al_2O_3$ layer on an $Si_3N_4$ layer). According to an embodiment, the additional dielectric layer 733 is formed from a material that is different from the material from which the upper passivation sub-layer 133 is formed. For example, when the upper passivation sub-layer 133 is formed from $Al_2O_3$, the additional dielectric layer 733 may be formed from $SiO_2$, $Si_3N_4$ (or other silicon nitride stoichiometries) or other suitable materials. According to an embodiment, the additional dielectric layer 733 (and thus the dielectric step structure 730) has a thickness in a range of about 300 angstroms to about 3000 angstroms, although the additional dielectric layer 733 (and the dielectric step structure 730) may be thinner or thicker, as well.

Figure 7B:
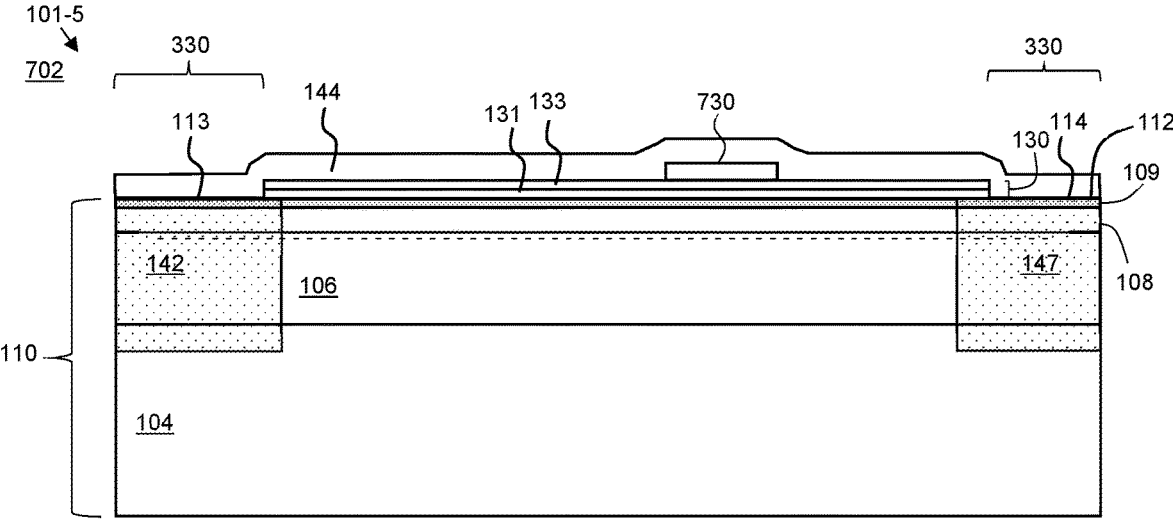

Referring now to FIGS. 1, 2, and 7B, in block 206 and fabrication stage 702 (FIG. 7B), openings 330 for the source and drain Ohmic contacts (e.g., contacts 141, 146, FIG. 1, not shown in FIG. 7) are formed in the surface passivation layer 130 over the source and drain implants 142, 147 (FIG. 1). Forming the openings 330 includes sequentially etching the upper and lower passivation-dielectric layers 133, 131. The upper, and lower passivation-dielectric layers 133, 131 may be sequentially etched using chemistries and techniques described in detail in conjunction with FIG. 3B, and those details are incorporated here.

Again, once formed, the openings 330 in the surface passivation layer 130 may extend across upper surface 112 of the substrate 110 from the ultimate locations of the later-formed source and drain electrodes 140, 145 (FIG. 1) into the portion 101 of the device 100 where the gate 160 and field plate 190 eventually will be formed. Accordingly, as shown in FIG. 7B, portions 113, 114 of the upper surface 112 of the semiconductor substrate 110 are exposed through the openings 330 on either side of the patterned surface passivation layer 130.

Further, in block 206, a conductive layer 144 is formed on or over the surface passivation layer 130 and the dielectric step structure 730, the portions of the upper surface 112 of the substrate 110 that are exposed over the source and drain implants 142, 147 (FIG. 1), and the additional exposed portions 113, 114 of the upper surface 112 of the substrate 110 that extend between the source and drain implants 142, 147 and the surface passivation layer 130. Suitable materials (e.g., Ti, TiAl, TiW, etc.) and other characteristics of the conductive layer 144, along with methods for depositing and annealing the conductive layer 144, are described above in conjunction with FIG. 3B, and those details are incorporated herein.

Figure 7C:
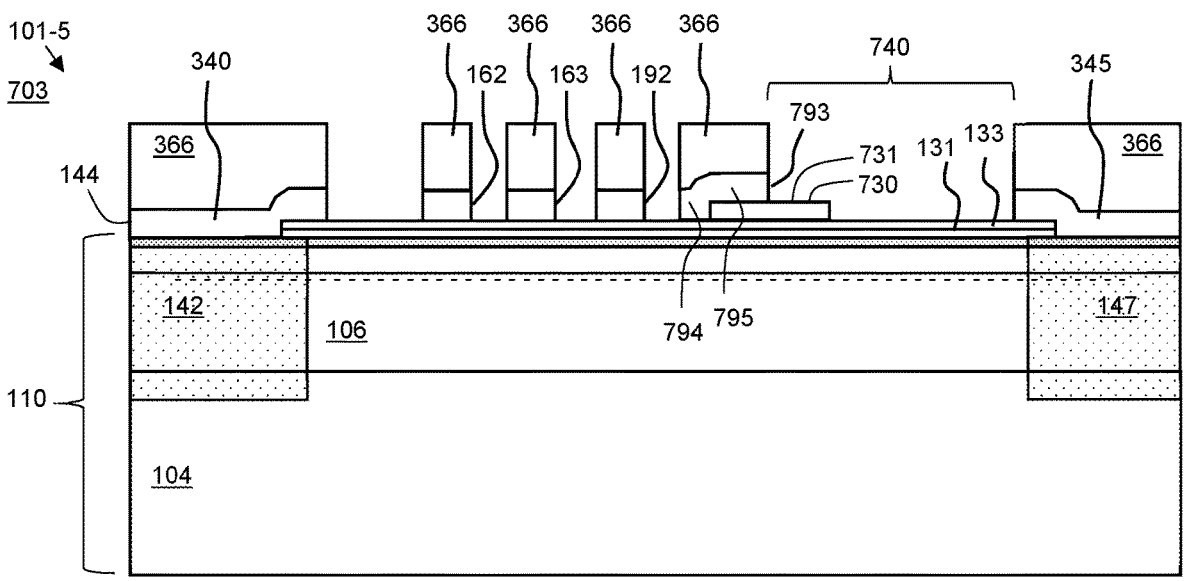
Figure 7D:
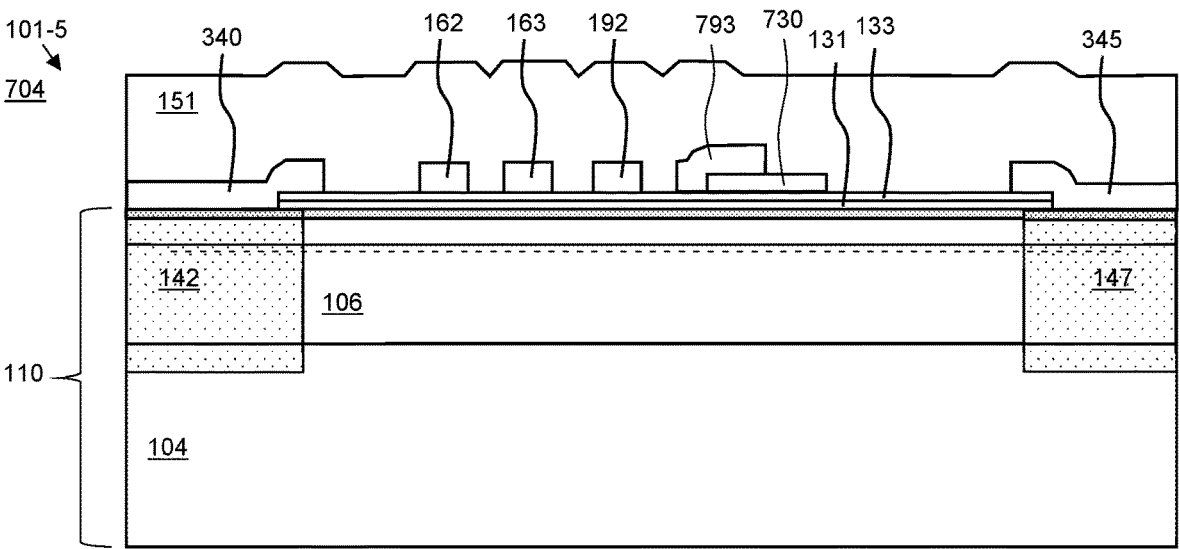
Figure 7E:
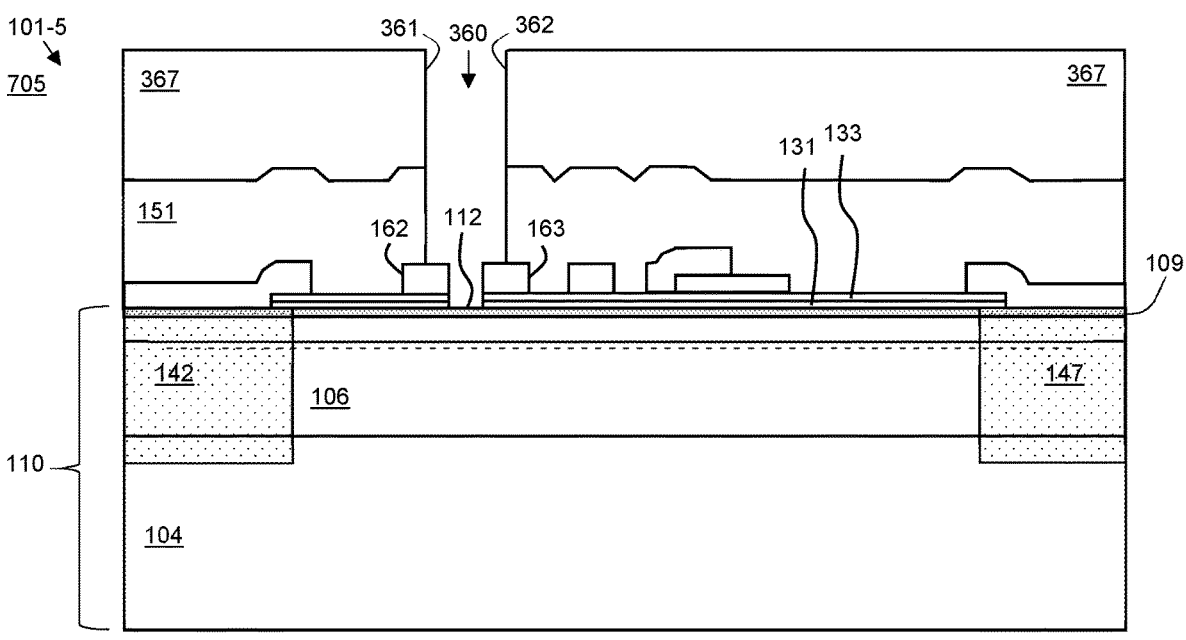
Figure 7F:
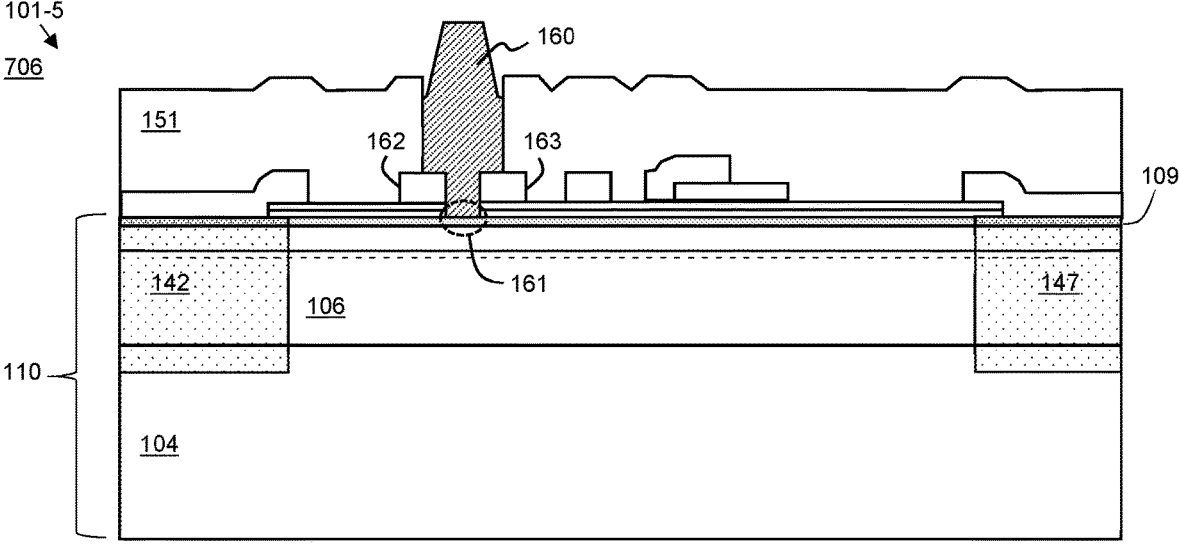
Figure 7G:
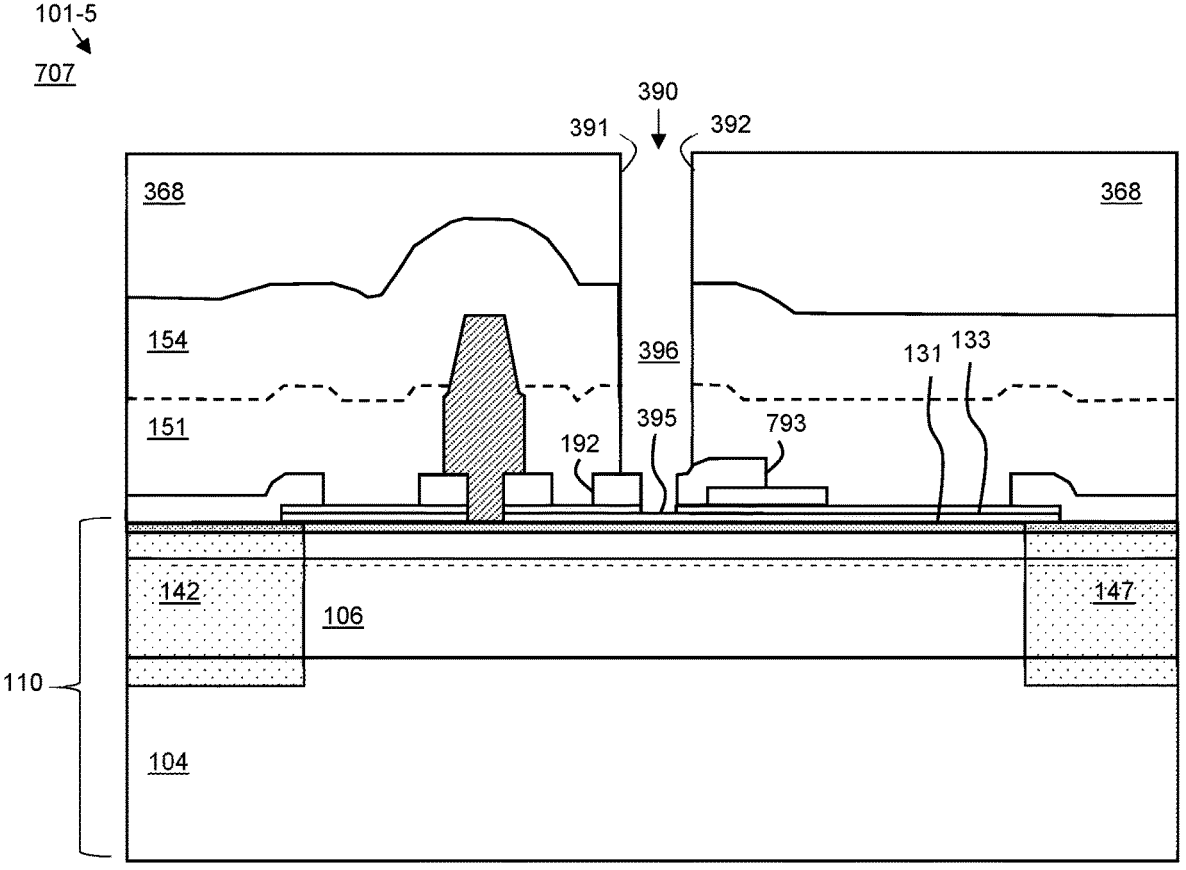
Figure 7H:
Figure 7H:
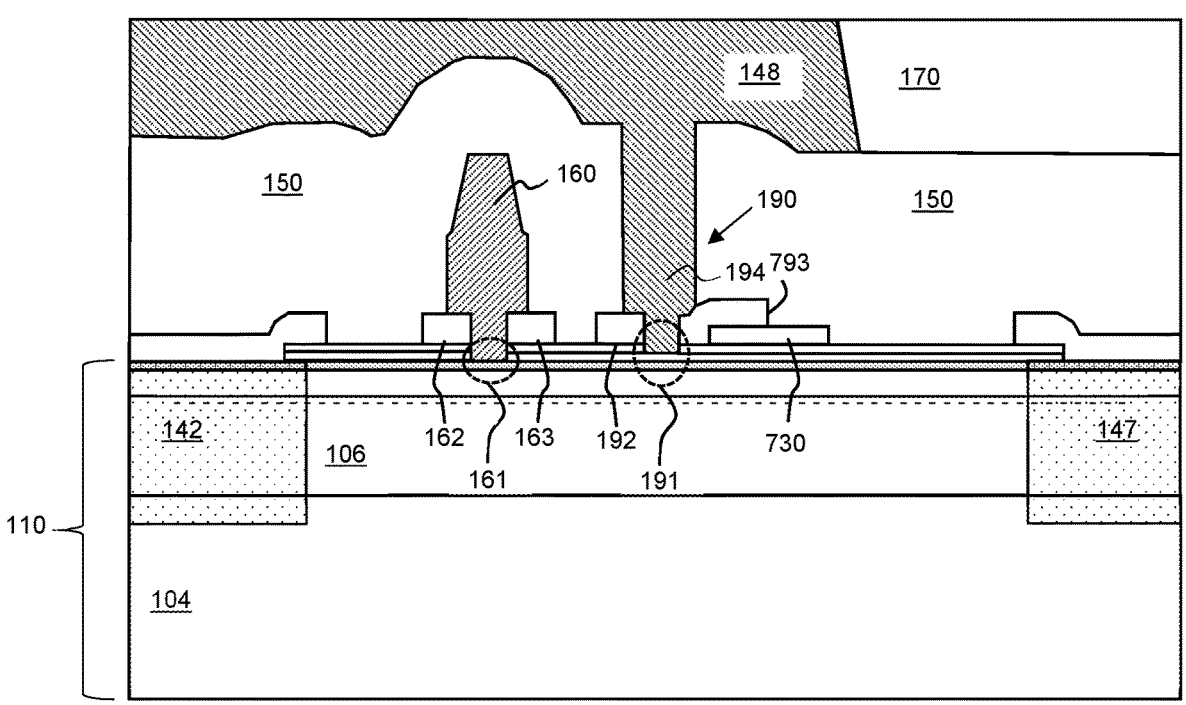

In block 208 and fabrication stage 703 (FIG. 7C), a selective etch process is used to pattern and etch the conductive layer 144 to form the GFP alignment structures 162, 163 and the SFP alignment structures 192, 793. More specifically, photoresist layer 366 is applied over conductive layer 144, and a mask is used to pattern the photoresist layer 366 to expose portions of the conductive layer 144 through openings in the photoresist layer 366. One of the openings 740 through the photoresist layer 366 exposes a portion of the conductive layer 144 that overlies a drain-side portion of the dielectric step structure 730 and a portion of the surface passivation layer 130 adjacent to the dielectric step structure 730 on the drain-side of the device. The conductive layer 144 is then etched through the photoresist openings to remove the exposed portions of the conductive layer 144 all the way to the upper surface of the surface passivation layer 130 (i.e., the surface of layer 133) or the upper surface 731 of the dielectric step structure 730. From about 10 percent to about 90 percent of the upper surface 731 of the dielectric step structure 730 is exposed through the etching process. The conductive layer 144 may be etched using chemistries and techniques described in detail in conjunction with FIG. 3C, and those details are incorporated herein. In some embodiments, the etch chemistry used for etching conductive layer 144 may be selective to the dielectric material used for step structure 730, such that the exposed portion is mostly retained as shown in FIG. 7C. In other embodiments, the etch may have low selectivity between materials used for conductive layer 144 and dielectric step structure 730, such that the exposed portion is removed during the etch stopping on the surface passivation layer 130 (not shown).

The selective etch process results in the formation of the conductive GFP and SFP alignment structures 162, 163, 192, 793, along with conductive extensions 340, 345 that extend from the surface passivation layer 130 to overlie the source and drain implants 142, 147 (FIG. 1), respectively. Once formed, SFP alignment structure 793 differs from the structure of SFP alignment structure 192 in that SFP alignment structure 793 is defined by a first portion 794 on the upper surface of the surface passivation layer 130, which steps up to a second portion 795 on the upper surface 731 of the dielectric step structure 730. Once the selective etch process has been completed, the photoresist 366 is removed.

In block 210 and fabrication stage 704 (FIG. 7D), a first dielectric layer 151 (e.g., ILD0) is deposited over the source and drain contact extensions 340, 345, the GFP and SFP alignment structures 162, 163, 192, 793, and exposed portions of the dielectric step structure 730 and the surface passivation layer 130 (i.e., exposed portions of layers 733, 133). Suitable materials (e.g., TEOS, SiO₂, organo-silicate glass, porous SiO₂, Si₃N₄, SiON, HfO₂, Al₂O₃, AlN, etc.) and other characteristics of the first dielectric layer 151, along with methods for depositing the first dielectric layer 151, are described above in conjunction with FIG. 3D, and those details are incorporated here.

In block 212 and fabrication stage 705 (FIG. 7E), a selective etch process using a patterned photoresist layer 367 is performed to pattern and etch a gate opening through the first dielectric layer 151 and the surface passivation layer 130, while stopping on the top surface 112 of the semiconductor substrate 110. This process results in an opening 360 that has a first side 361 aligned with GFP alignment structure 162 and a second side 362 aligned with GFP alignment structure 163, as described previously. Sequential etching processes are continued until a portion upper surface 112 of the substrate 110 between the GFP alignment structures 162, 163 is reached (e.g., the surface of cap layer 109). The first dielectric layer 151 and the upper and lower passivation-dielectric layers 133, 131 may be sequentially etched using chemistries and techniques described in detail in conjunction with FIGS. 3B and 3E, and those details are incorporated herein.

In block 214 and fabrication stage 706 (FIG. 7F), the gate electrode 160 (or gate metal stack) is formed by depositing one or more layers of gate metal into opening 360, and the first gate metal layer defines the gate channel 161. The gate electrode 161 may be formed, for example, using techniques and materials described in detail in conjunction with FIG. 3F, and those details are incorporated herein. After forming the gate electrode 160, photoresist layer 367 is removed.

In block 216 and fabrication stage 707 (FIG. 7G), a second dielectric layer 154 (e.g., ILD1) is deposited over the first dielectric layer 151 and the gate electrode 160, thus forming the "additional" dielectric layers 150 of FIG. 1. The second dielectric layer 154 may be formed from materials and using methods described in detail in conjunction with FIG. 3G, and those details are incorporated here.

In addition, in block 218, a selective etch process using a patterned photoresist layer 368 is performed to pattern and etch a field plate opening through the first and second dielectric layers 151, 154 and the upper passivation-dielectric layer 133 of the surface passivation layer 130, while leaving the lower passivation-dielectric layer 131 essentially intact (i.e., the etching processes stop on layer 131). The etching process is performed until the portion of the upper passivation-dielectric layer 133 that is exposed between SFP alignment structures 192 and 193 is removed. Simultaneously, openings through portions of the first and second dielectric layers 151, 154 overlying the source and drain Ohmic contacts 141, 146 (FIG. 1) are etched to facilitate forming conductive vias for source and drain electrodes 140, 145 (FIG. 1) in the following fabrication stage (stage 708, FIG. 7H) corresponding to block 220.

This process results in an opening 396 that has a first side 391 aligned with SFP alignment structure 192 and a second side 392 aligned with SFP alignment structure 793. The first side 391 has a bottom edge that may terminate anywhere along the top surface of SFP alignment structure 192, and the second side 392 has a bottom edge that may terminate anywhere along the top surface of SFP alignment structure 793. The second and first dielectric layers 154, 151 may be sequentially etched using chemistries and techniques described in detail in conjunction with etching layer 151 in FIG. 3E, and the upper passivation-dielectric layer 133 may be etched using chemistries and techniques described in detail in conjunction with FIG. 3B, and those details are incorporated herein.

In block 220 and fabrication stage 708 (FIG. 7H), the photoresist 368 (FIG. 7G) is removed and source and drain metallization 148, 149 are deposited, resulting in the recessed SFP region 191 and the conductive field plate via 194, which connects with additional overlying source metallization 148. Further, the source metallization 148 is deposited so that it extends from the conductive field plate via 194 over the second dielectric layer 154 to the source contact 141. This completes the formation of the source-connected field plate 190, which includes the recessed SFP region 191, and the SFP alignment structures 192, 793. The source and drain metallization 148, 149 may be formed, for example, using techniques and materials described in detail in conjunction with FIG. 3H, and those details are incorporated herein. At this point, in block 222, the device 100 may be completed by depositing the final passivation layers 170 and 180 (FIG. 1), as described above in conjunction with FIG. 3, and those details are incorporated herein.

Embodiment 6 (FIGS. 8A-H)

FIG. 2 will be used again to describe fabrication steps for an alternate embodiment of GaN HFET 100 in FIG. 1. These fabrication steps are shown in detail in FIGS. 8A-H (collectively FIG. 8). More specifically, FIG. 8, which includes FIGS. 8A-H includes cross-sectional, side views of an embodiment of portion 101-6 of GaN HFET device 100 during a sequence of fabrication steps. It should be noted that portion 101-6 corresponds to portion 101 of FIG. 1, where the "-6" indicates that this is a sixth embodiment of portion 101. Portion 101-6 is similar or identical, in many respects, to portion 101-2 (FIG. 4). The most notable difference between portion 101-2 (FIG. 4) and 101-6 (FIG. 8) is in the difference in the configurations of gate electrode 160 (FIG. 4) and gate electrode 860 (FIG. 8). More specifically, as will be described in detail below, gate electrode 860 includes an upper portion 863, which extends over an upper surface 152 of the first dielectric layer 151. The upper portion 863 has an increased width, which may result in gate electrode 860 having a reduced gate resistance, $R_G$, when compared with the gate electrode 160 (FIG. 4).

Referring initially to FIGS. 1 and 2, fabrication of this alternate embodiment of GaN HFET device 100 begins, in block 202, by providing a semiconductor substrate 110 in which Ohmic source and drain implants (e.g., source and drain implants 142, 147) have already been formed. Details associated with providing the semiconductor substrate 110 and forming the Ohmic source and drain implants were discussed in detail above in conjunction with the description of forming portion 101-1 and Embodiment 1. In the interest of conciseness, those details are not repeated here, but instead those details are intended to be incorporated here into the description of forming portion 101-2 and this Embodiment 2. Briefly, providing the semiconductor substrate 110 includes providing a host substrate 102, and forming various semiconductor layers (e.g., a nucleation layer (not shown), a buffer layer 104, a channel layer 106, a barrier layer 108, and optionally a cap layer 109) on or over an upper surface 103 of the host substrate 102. Embodiments of the method may optionally include forming doped (e.g., ion-implanted) source and drain regions 142 and 147 (FIG. 1), as also discussed above in conjunction with block 202 and Embodiment 1.

Figure 8A:
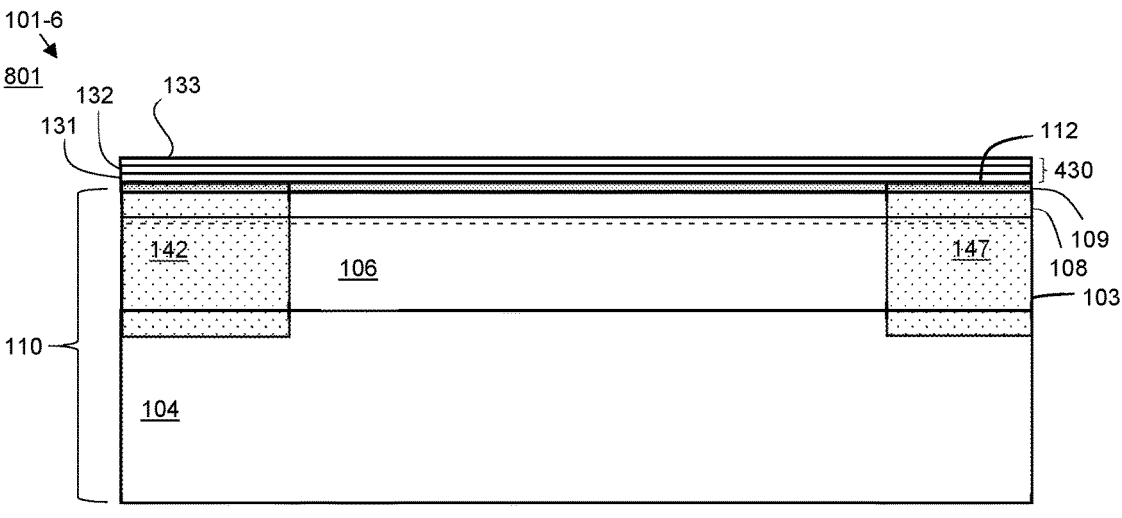
FIGS. 8A, 8B, 8C, 8D, 8E, 8F, 8G, and 8H (collectively FIG. 8) are cross-sectional, side views of another embodiment of an HFET device during a sequence of fabrication steps, according to another fabrication embodiment.

Referring now to FIGS. 2 and 8A, in block 204 and fabrication stage 801 (FIG. 8A), a surface passivation layer 430 is formed on the upper surface 112 of the semiconductor substrate 110. According to an embodiment, the surface passivation layer 430 includes at least three passivation sub-layers 131, 132, 133, which may be referred to as lower, intermediate, and upper passivation sub-layers 131, 132, 133, respectively. In some embodiments, such as that shown in FIG. 8A, surface passivation layer 430 includes three passivation sub-layers 131, 132, 133. In an alternate embodiment (e.g., as described in conjunction with FIG. 3), surface passivation layer 430 may include only two passivation sub-layers 131, 133 (e.g., the intermediate passivation layer 132 may be excluded). Details regarding the materials, deposition methods, and other characteristics for a two-layer surface passivation layer 130 were described in detail in conjunction with FIG. 3A, and details regarding the materials, deposition methods, and other characteristics for a three-layer surface passivation layer 430 were described in detail in conjunction with FIG. 4A, and those descriptions are incorporated here.

Figure 8B:
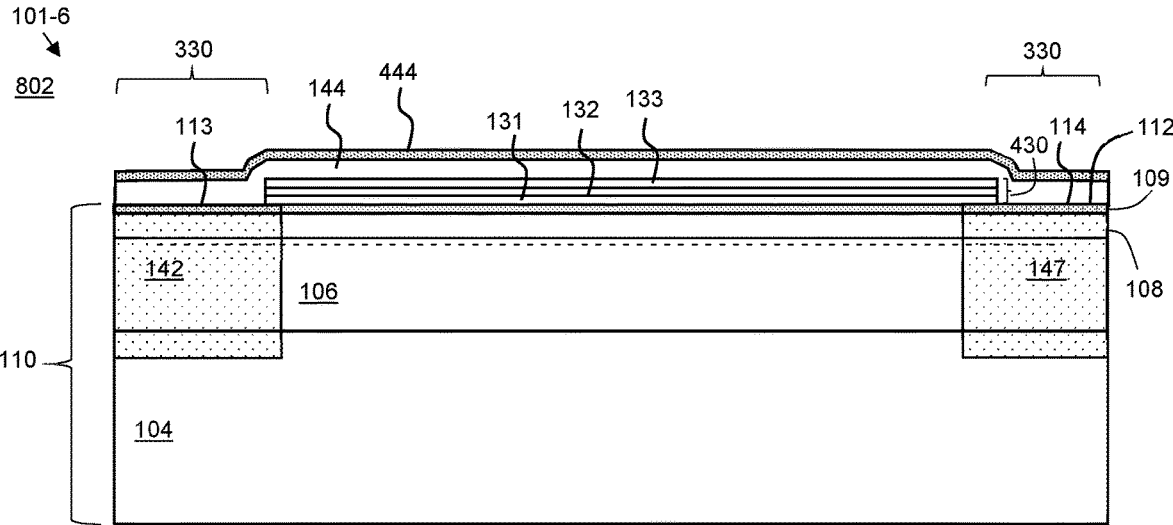
Figure 8C:
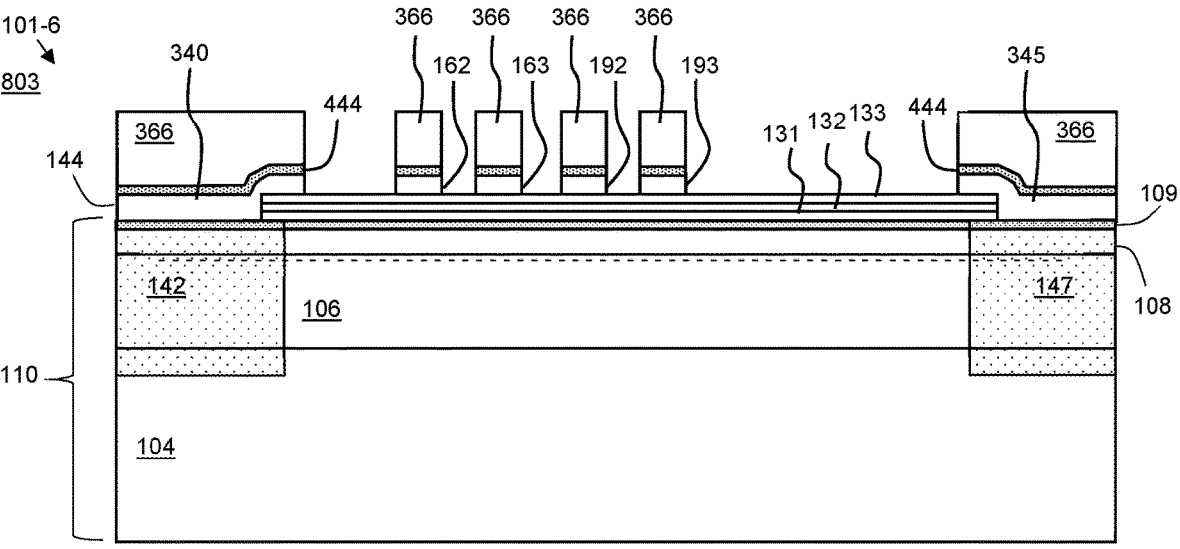
Figure 8D:
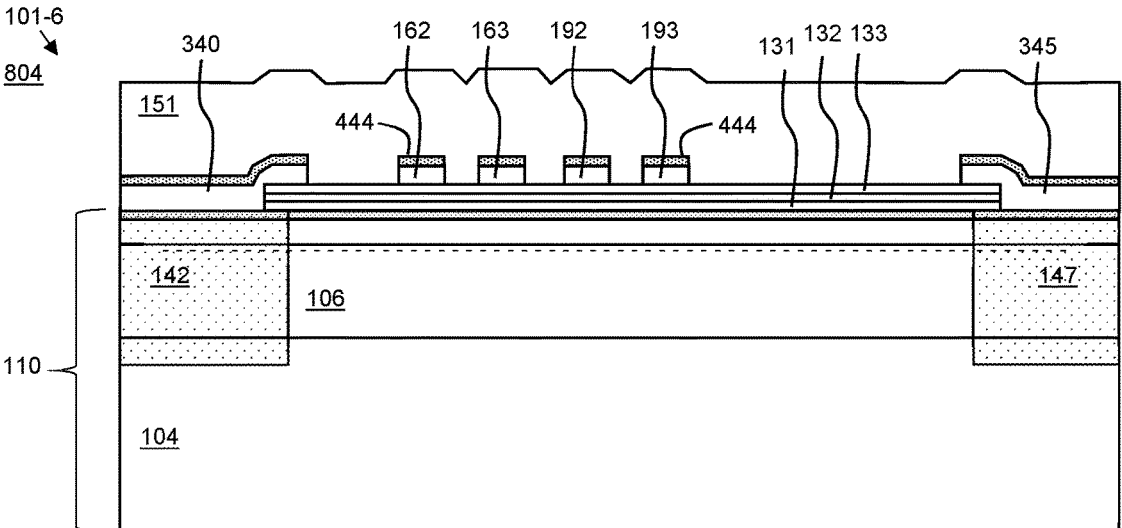

Referring now to FIGS. 1, 2, and 8B, in block 206 and fabrication stage 802 (FIG. 8B), openings 330 for the source and drain Ohmic contacts (e.g., contacts 141, 146, FIG. 1, not shown in FIG. 8) are formed in the surface passivation layer 430 over the source and drain implants 142, 147 (FIG. 1). Forming the openings 330 includes sequentially etching the upper, intermediate, and lower passivation sub-layers 133, 132, 131. The upper, intermediate, and lower passivation sub-layers 133, 132, 131 may be sequentially etched using chemistries and techniques described in detail in conjunction with FIG. 4B, and those details are incorporated here.

Again, once formed, the openings 330 in the surface passivation layer 430 may extend across upper surface 112 from the ultimate locations of the later-formed source and drain electrodes 140, 145 (FIG. 1) into the portion 101 of the device 100 where the gate 860 and field plate 190 eventually will be formed. Accordingly, as shown in FIG. 8B, portions 113, 114 of the upper surface 112 of the semiconductor substrate 110 are exposed through the openings 330 on either side of the patterned surface passivation layer 430.

Further, in block 206, a conductive layer 144 is formed on or over the surface passivation layer 430, the portions of the upper surface 112 of the substrate 110 that are exposed over the source and drain implants 142, 147 (FIG. 1), and the additional exposed portions 113, 114 of the upper surface 112 of the substrate 110 that extend between the source and drain implants 142, 147 and the surface passivation layer 430. Suitable materials (e.g., Ti, TiAl, TiW, etc.) and other characteristics of the conductive layer 144, along with methods for depositing and annealing the conductive layer 144, are described above in conjunction with FIG. 3B, and those details are incorporated here.

According to an embodiment, one or more etch stop layers 444 are deposited on the conductive layer 144. Suitable materials (e.g., SiO$_2$, Al$_2$O$_3$, etc.) and other characteristics of the etch stop layer(s) 444, along with methods for depositing the etch stop layer(s) 444, are described above in conjunction with FIG. 4B, and those details are incorporated here.

In block 208 and fabrication stage 803 (FIG. 8C), a selective etch process is used to pattern and etch the etch stop layer 444 and the conductive layer 144 to form the GFP alignment structures 162, 163 and the SFP alignment structures 192, 193. The etch stop layer 444 and the conductive layer 144 may be etched using chemistries and techniques described in detail in conjunction with FIG. 4C, and those details are incorporated here The selective etch process results in the formation of the conductive GFP and SFP alignment structures 162, 163, 192, 193, along with conductive extensions 340, 345 that extend from the surface passivation layer 430 to overlie the source and drain implants 142, 147 (FIG. 1), respectively. Once the selective etch process has been completed, the photoresist 366 is removed.

In block 210 and fabrication stage 804 (FIG. 8D), a first dielectric layer 151 (e.g., ILD0) is deposited over the source and drain contact extensions 340, 345, the GFP and SFP alignment structures 162, 163, 192, 193, and exposed portions of surface passivation layer 430 (i.e., exposed portions of layer 133). Suitable materials (e.g., TEOS, SiO$_2$, organosilicate glass, porous SiO$_2$, Si$_3$N$_4$, SiON, HfO$_2$, Al$_2$O$_3$, AlN, etc.) and other characteristics of the first dielectric layer 151, along with methods for depositing the first dielectric layer 151, are described above in conjunction with FIG. 3D, and those details are incorporated here.

In block 212 and fabrication stage 805 (FIG. 8E), a selective etch process is used using patterned photoresist 367 to pattern and etch a first gate opening 153. According to some embodiments, the first gate opening 153 is etched through the first dielectric layer 151, the etch stop layer 444, and all passivation sub-layers 131-133 of the surface passivation layer 430, while stopping on the top surface 112 of the semiconductor substrate 110. According to other embodiments in which the device is a MISFET and as shown in the callout 101-6' in the upper left corner of FIG. 8E, the gate opening is etched through the first dielectric layer 151, the etch stop layer 444, and the upper and intermediate passivation sub-layers 133, 132 of the surface passivation layer 430, while stopping on the lower passivation sub-layer 131 (i.e., a gate insulator 431 is formed from a portion of the lower passivation sub-layer 131 that remains when the process of etching the gate opening has completed). In either embodiment, the first gate opening 153 is defined by a lower portion and an upper portion. The lower portion has a first width 867, and extends from the substrate surface 112 to the upper surfaces of the GFP alignment structures 162, 163, and the intermediate portion has a second width 868 (greater than the first width 867), which extends from the upper surfaces of the GFP alignment structures 162, 163 to the upper surface 152 of the first dielectric layer 151. The first dielectric layer 151, the etch stop layer 444, and the upper, intermediate, and lower passivation sub-layers 133, 132, 131 may be sequentially etched using chemistries and techniques described in detail in conjunction with FIGS. 4B and 4E, and those details are incorporated here. Once the selective etch process has been completed, the photoresist 367 is removed.

Figure 8E:
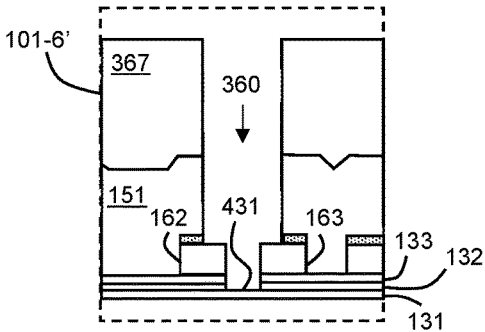
Figure 8E:
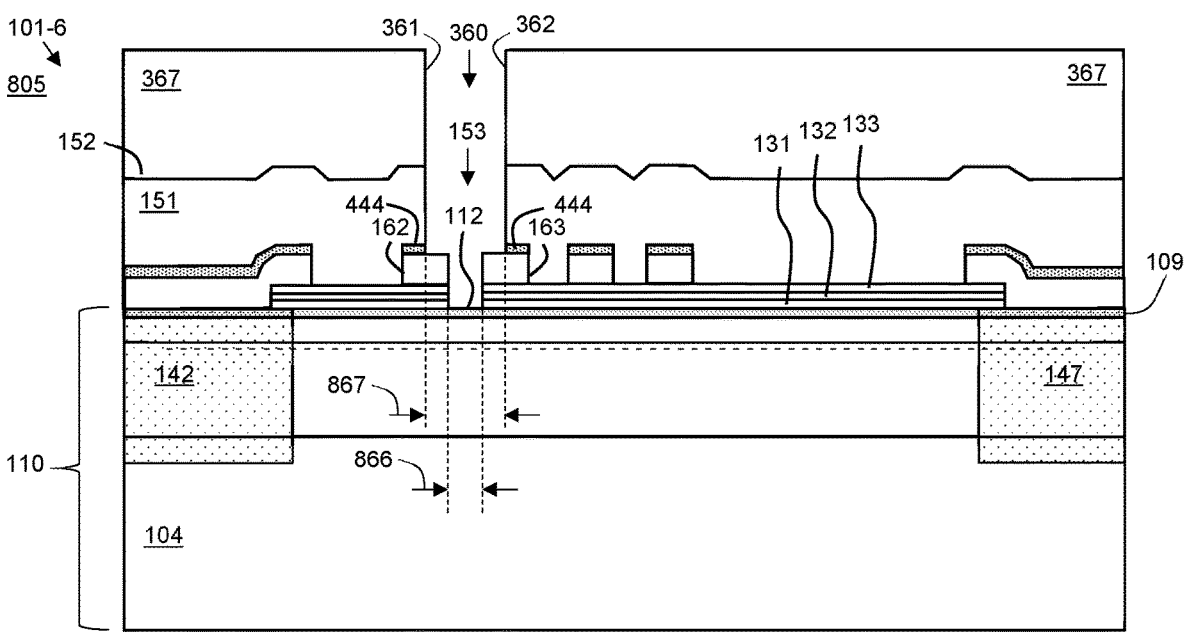
Figure 8F:
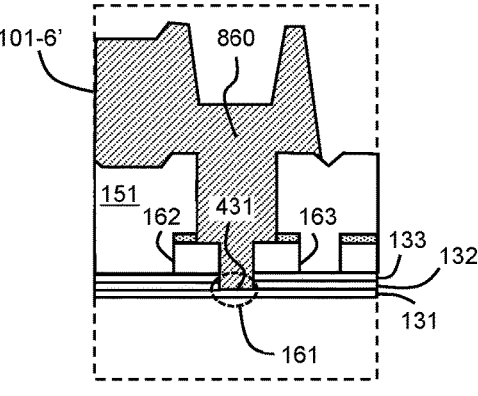
Figure 8F:
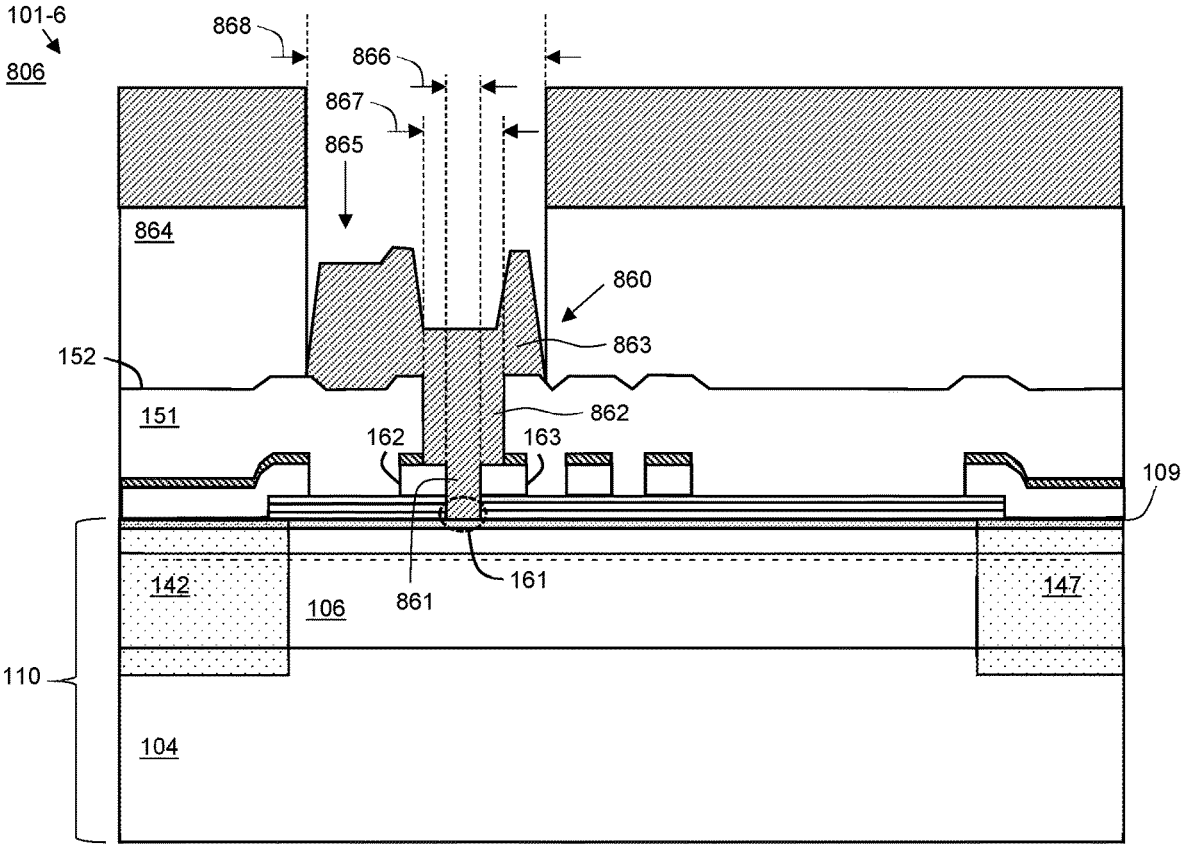

In block 214 and fabrication stage 806 (FIG. 8F), the gate electrode 860 is formed. As mentioned above, gate electrode 860 is formed to include an upper portion 863, which has an increased width 868, in comparison to embodiments of gate electrode 160 described previously. To form gate electrode 860, photoresist 864 is applied to the upper surface 152 of dielectric layer 151, and photoresist 864 is patterned to include a second gate opening 865. The second gate opening 865 in photoresist 864 has a third width 868, which is greater than the width 867 of the intermediate portion of the first gate opening 153 (FIG. 8E). Accordingly, the first gate opening 153 (FIG. 8E) and portions of the upper surface 152 of the first dielectric layer 151 on either side of the first gate opening 153 are exposed through the second gate opening 865 in photoresist 864.

The gate electrode 860 (or gate metal stack) is formed by depositing one or more layers of gate metal into the first gate opening 153 and the second gate opening 865. The first gate metal layer defines the gate channel 161, which is deposited into the lower portion of the first gate opening 153 (FIG. 8E). The first gate metal layer and/or overlying metal layers extend from the substrate surface 112 to the upper surfaces of the GFP alignment structures 162, 163 to form a lower portion 861 of the gate electrode 860, which has the first width 866. Gate metal also is deposited into the intermediate portion of the first gate opening 153 (FIG. 8E) to form an intermediate portion 862 of the gate electrode 860, which has the second width 867 (greater than the first width 866), and which extends from the upper surfaces of the GFP alignment structures 162, 163 to the upper surface 152 of the first dielectric layer 151. Finally, gate metal also is deposited into the second gate opening 865 in photoresist 864 to form an upper portion 863 of the gate electrode 860, which has the third width 868 (greater than the second width 867). The gate electrode 860 may be formed, for example, using additional techniques and materials described in detail in conjunction with FIG. 3F, and those details are incorporated here. After forming the gate electrode 860, photoresist layer 864 is removed.

As described above, the gate electrode 860 formed in fabrication stage 806 includes lower, intermediate, and upper portions 861, 862, 863 which are coupled together to form an integrally-formed gate electrode 860. In various embodiments, the first width 866 of the lower portion 861 of the gate electrode 860 is in a range of about 500 angstroms to about 5000 angstroms, the second width 867 of the intermediate portion 862 of the gate electrode 860 is in a range of about 1000 angstroms to about 5000 angstroms, and the third width 868 of the upper portion 863 of the gate electrode 860 is in a range of about 2000 angstroms to about 10,000 angstroms. For example, the third width 868 of the upper portion 863 of the gate electrode 860 may be in a range of 50 percent to 300 percent greater than the second width 867 of the gate electrode 860. The additional gate metal in gate electrode 860 may result in gate electrode 860 having a reduced gate resistance, $R_G$, when compared with the gate electrode 160 (FIG. 4).

In block 216 and fabrication stage 807 (FIG. 8G), a second dielectric layer 154 (e.g., ILD1) is deposited over the first dielectric layer 151 and the gate electrode 860, thus forming the "additional" dielectric layers 150 of FIG. 1. The second dielectric layer 154 may be formed from materials and using methods described in detail in conjunction with FIG. 3G, and those details are incorporated here.

In addition, in block 218, a selective etch process is used to pattern and etch a field plate opening through the first and second dielectric layers 151, 152, the etch stop layer 444, and the upper and intermediate passivation sub-layers 133, 132 of the surface passivation layer 430, while leaving the lower passivation sub-layer 131 essentially intact (i.e., the etching processes stop on layer 131). Simultaneously, openings through portions of the first and second dielectric layers 151, 152 overlying the source and drain Ohmic contacts 141, 146 (FIG. 1) are etched to facilitate forming conductive vias for source and drain electrodes 140, 145 (FIG. 1) in the following fabrication stage (stage 808, FIG. 8H) corresponding to block 220.

The second and first dielectric layers 154, 151 may be sequentially etched using chemistries and techniques described in detail in conjunction with etching layer 151 in FIG. 4G, and the upper and intermediate passivation sub-layers 133, 132 may be sequentially etched using chemistries and techniques described in detail in conjunction with FIG. 4B, and those details are incorporated here. In an embodiment in which the etch stop layer 444 consists of multiple layers (e.g., an $Al_2O_3$ layer over an $SiO_2$ layer), the etchant used to etch the etch stop layer 444 (e.g., $C_4F_8$ or $BCl_3$ plasma) may, for example, etch the upper layer (e.g., $Al_2O_3$) and stop on the lower layer (e.g., $SiO_2$). In such an embodiment (not shown), the lower layer (e.g., $SiO_2$) of the etch stop layer 444 may remain after the etching process is completed. In such embodiments, a separate etch step may be required to form a conductive via between source and drain metallization 148, 149 to the Ohmic contacts 141, 146 for the source electrode 140 and drain electrode 145 in FIG. 1. Ultimately, this process results in an unfilled field plate via 396 over and between the SFP alignment structures 192, 193, with the portion 395 of the lower passivation sub-layer 131 defining the bottom extent of the via 396.

Figure 8G:
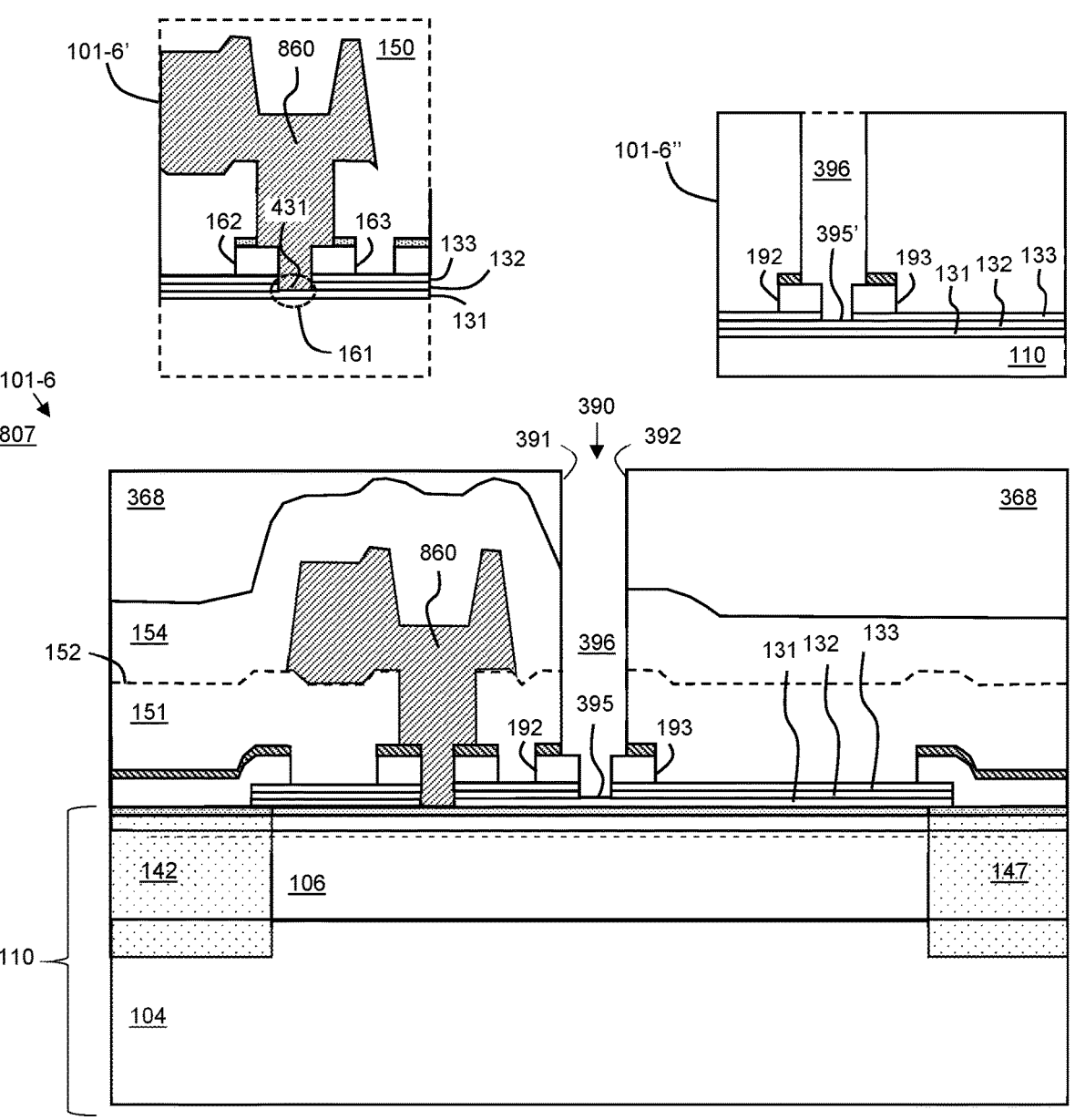
Figure 8H:
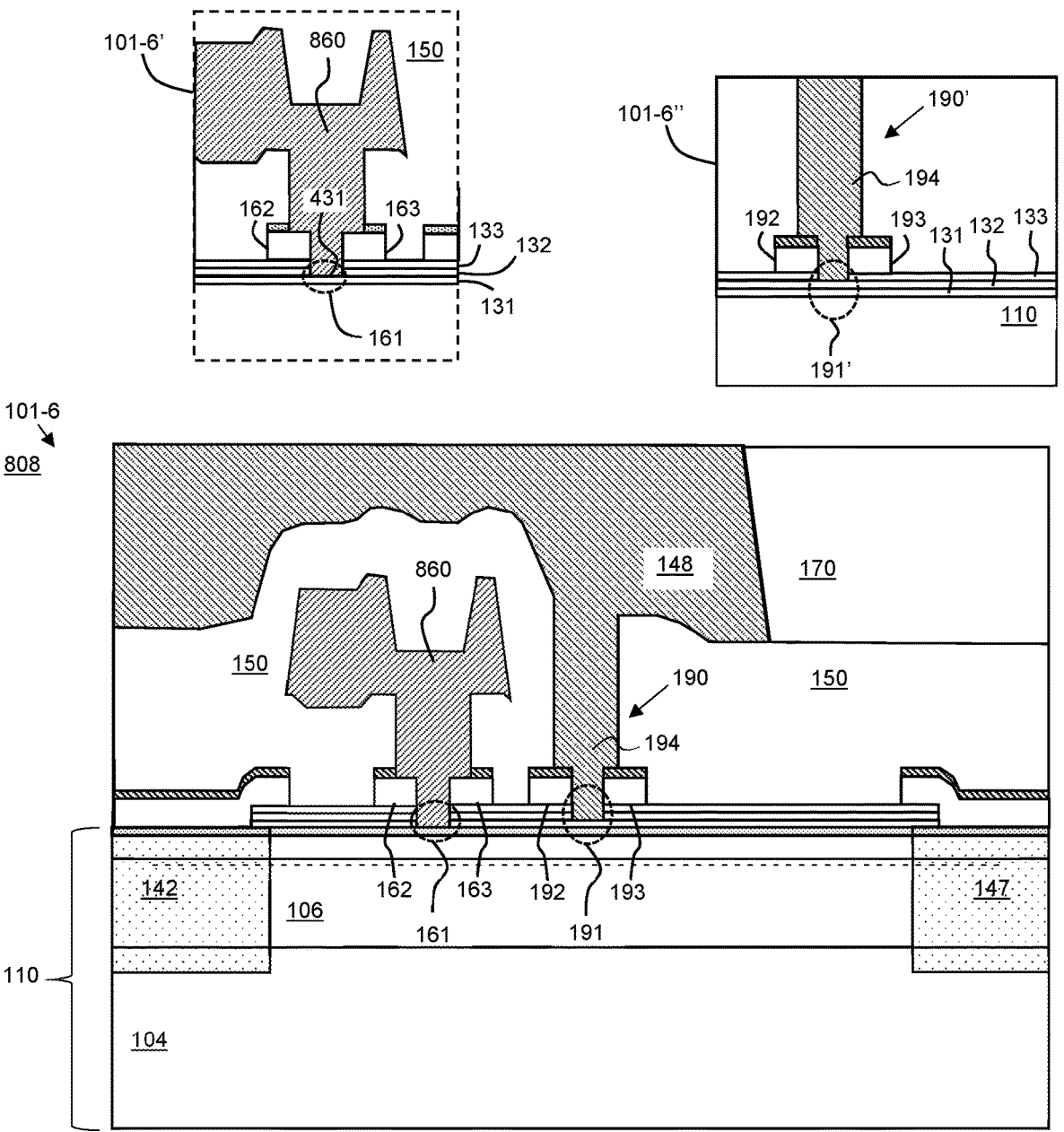

In other embodiments, as indicated in callout 101-6″ in the upper right corner of FIG. 8G, only the upper passivation sub-layer 133 is etched, and the portion 395′ of the exposed surface of the intermediate passivation sub-layer 132 defines a recessed portion of the unfilled field plate via 396. The alternate embodiment shown in callout 101-6″ may be used both in devices that do not include a gate insulator and in devices (e.g., MISFETs) that do include a gate insulator (e.g., gate insulator 431 in callout 101-6′). Either way, the gate electrode 860 extends deeper into the passivation layer 430 than the subsequently-formed conductive field plate does (i.e., the gate electrode 860 is recessed with respect to the subsequently-formed conductive field plate 190, 190′).

In block 220 and fabrication stage 808 (FIG. 8H), the photoresist 368 (FIG. 8G) is removed and source and drain metallization 148, 149 are deposited, resulting in the recessed SFP region 191 and the conductive field plate via 194, which connects with additional overlying source metallization 148. Further, the source metallization 148 is deposited so that it extends from the conductive field plate via 194 over the second dielectric layer 152 to the source contact 141. This completes the formation of the source-connected field plate 190, which includes the recessed SFP region 191, and the SFP alignment structures 192, 193. As indicated above, a bottom extent of the recessed SFP region 191 may contact the lower passivation sub-layer 131, in some embodiments. In other embodiments, such as shown in the callout 101-6′ in the upper right corner of FIG. 8H, the bottom extent of the recessed SFP region 191 may contact the intermediate passivation sub-layer 131. The source and drain metallization 148, 149 may be formed, for example, using techniques and materials described in detail in conjunction with FIG. 3H, and those details are incorporated here. At this point, in block 222, the device 100 may be completed by depositing the final passivation layers 170 and 180 (FIG. 1), as described above in conjunction with FIG. 3, and those details are incorporated here.

Embodiment 7 (FIGS. 9A-I)

FIG. 2 will be used again to describe fabrication steps for an alternate embodiment of GaN HFET 100 in FIG. 1. These fabrication steps are shown in detail in FIGS. 9A-I (collectively FIG. 9). More specifically, FIG. 9, which includes FIGS. 9A-I includes cross-sectional, side views of an embodiment of portion 101-7 of GaN HFET device 100 during a sequence of fabrication steps. It should be noted that portion 101-7 corresponds to portion 101 of FIG. 1, where the "−7" indicates that this is a seventh embodiment of portion 101. Portion 101-7 is similar or identical, in many respects, to portion 101-1 (FIG. 3). The most notable difference between portion 101-1 (FIG. 3) and 101-7 (FIG. 9) is that, in portion 101-7, sidewall spacers 962, 963 are formed on the interior sidewalls of the GFP alignment structures 162, 163 prior to etching the surface passivation layer 130 in the first gate opening 360. The sidewall spacers 962, 963 enable the gate length 966 to be reduced, in comparison with the gate lengths of previously-described embodiments (e.g., reduced to lengths that are below the capability of current lithography processes). In addition, portion 101-7 also has similarities to portion 101-3 (FIG. 5), in that an etch stop layer 544 may be utilized to protect portions of the device during various processing steps. These differences will be discussed in more detail below.

Referring initially to FIGS. 1 and 2, fabrication of this alternate embodiment of GaN HFET device 100 begins, in block 202, by providing a semiconductor substrate 110 in which Ohmic source and drain implants (e.g., source and drain implants 142, 147) have already been formed. Details associated with providing the semiconductor substrate 110 and forming the Ohmic source and drain implants were discussed in detail above in conjunction with the description of forming portion 101-1 and Embodiment 1. In the interest of conciseness, those details are not repeated here, but instead those details are intended to be incorporated here into the description of forming portion 101-7 and this Embodiment 7. Briefly, providing the semiconductor substrate 110 includes providing a host substrate 102, and forming various semiconductor layers (e.g., a nucleation layer (not shown), a buffer layer 104, a channel layer 106, a barrier layer 108, and optionally a cap layer 109) on or over an upper surface 103 of the host substrate 102. Embodiments of the method may optionally include forming doped (e.g., ion-implanted) source and drain regions 142 and 147 (FIG. 1), as also discussed above in conjunction with block 202 and Embodiment 1.

Figure 9A:
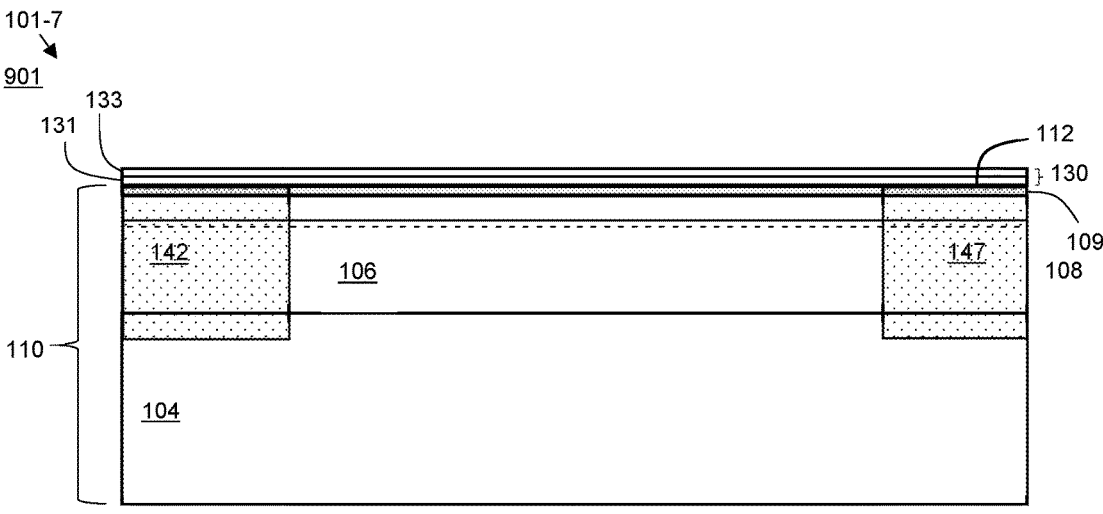
FIGS. 9A, 9B, 9C, 9D, 9E, 9F, 9G, 9H, and 9I (collectively FIG. 9) are cross-sectional, side views of another embodiment of an HFET device during a sequence of fabrication steps, according to another fabrication embodiment.

Referring now to FIGS. 2 and 9A, in block 204 and fabrication stage 901 (FIG. 9A), a surface passivation layer 130 is formed on the upper surface 112 of the semiconductor substrate 110. According to an embodiment, the surface passivation layer 130 includes at least two passivation sub-layers 131, 133 (e.g., lower and upper passivation sub-layers 131, 133, respectively). In some embodiments, such as that shown in FIG. 9A, surface passivation layer 130 includes two passivation sub-layers 131, 133. The two passivation sub-layers 131, 133 may be the same as in previously-described embodiments (e.g. Si$_3$N$_4$ in various stoichiometries for the lower sub-layer 131, and Al$_2$O$_3$ for the upper sub-layer 133). In an alternate embodiment, the two passivation sub-layers 131, 133 may include Si$_3$N$_4$ (in various stoichiometries) for the lower sub-layer 131, and SiO$_2$ for the upper sub-layer 133. In still other embodiments (e.g., as described in conjunction with FIG. 4), the passivation layer may include three passivation sub-layers 131, 132, 133 (e.g., lower, intermediate, and upper passivation sub-layers 131, 132, 133, respectively). Details regarding the materials, deposition methods, and other characteristics for a two-layer surface passivation layer 130 were described in detail in conjunction with FIG. 3A, and details regarding the materials, deposition methods, and other characteristics for a three-layer surface passivation layer 430 were described in detail in conjunction with FIG. 4A, and those descriptions are incorporated here.

Figure 9B:
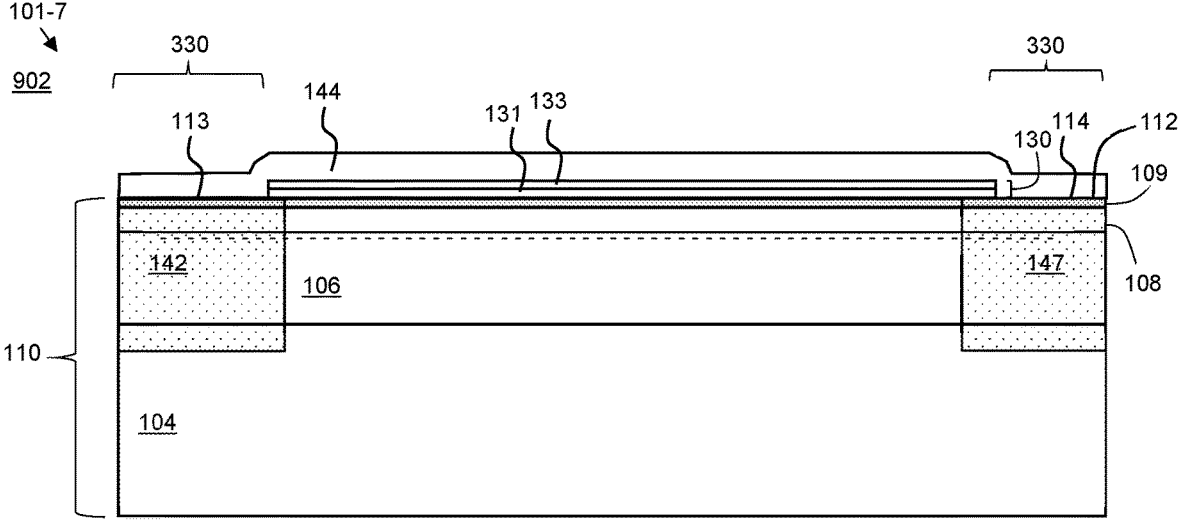
Figure 9C:
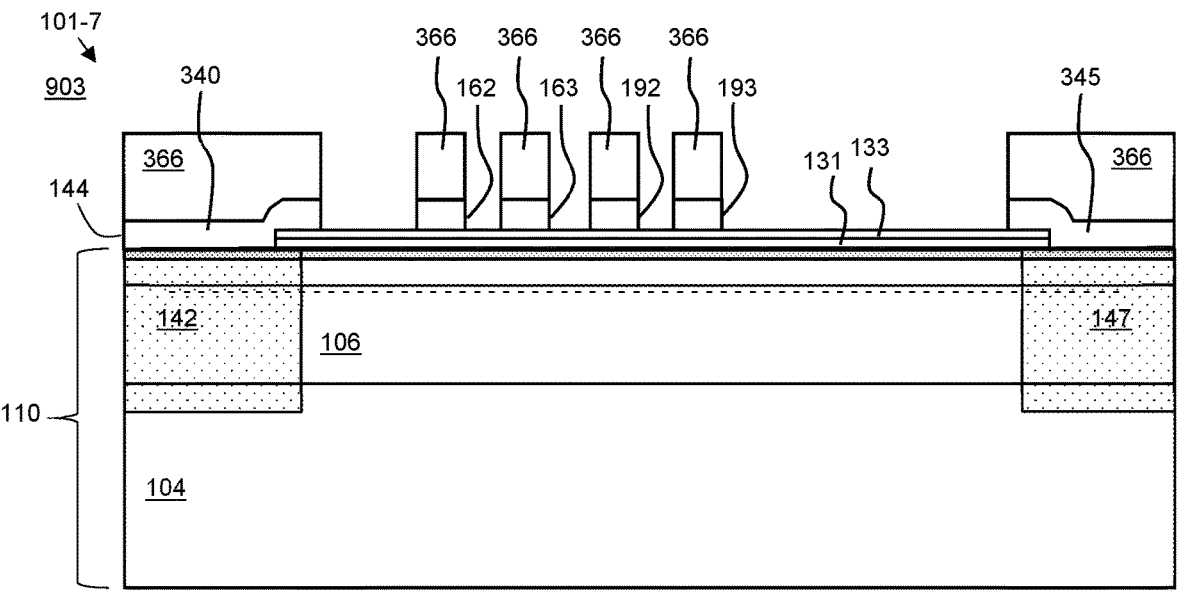
Figure 9D:
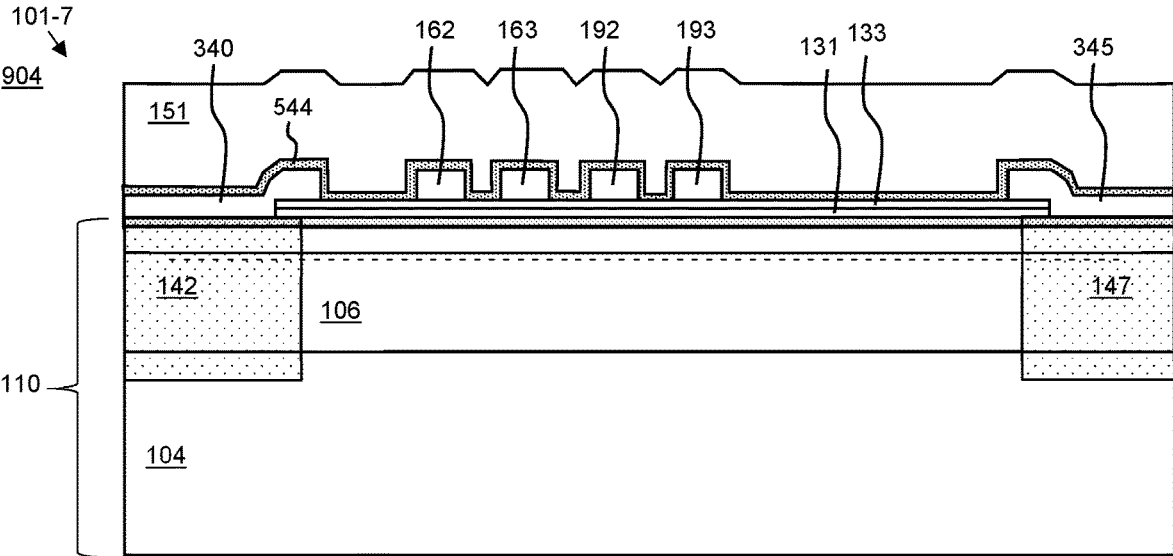
Figure 9E:
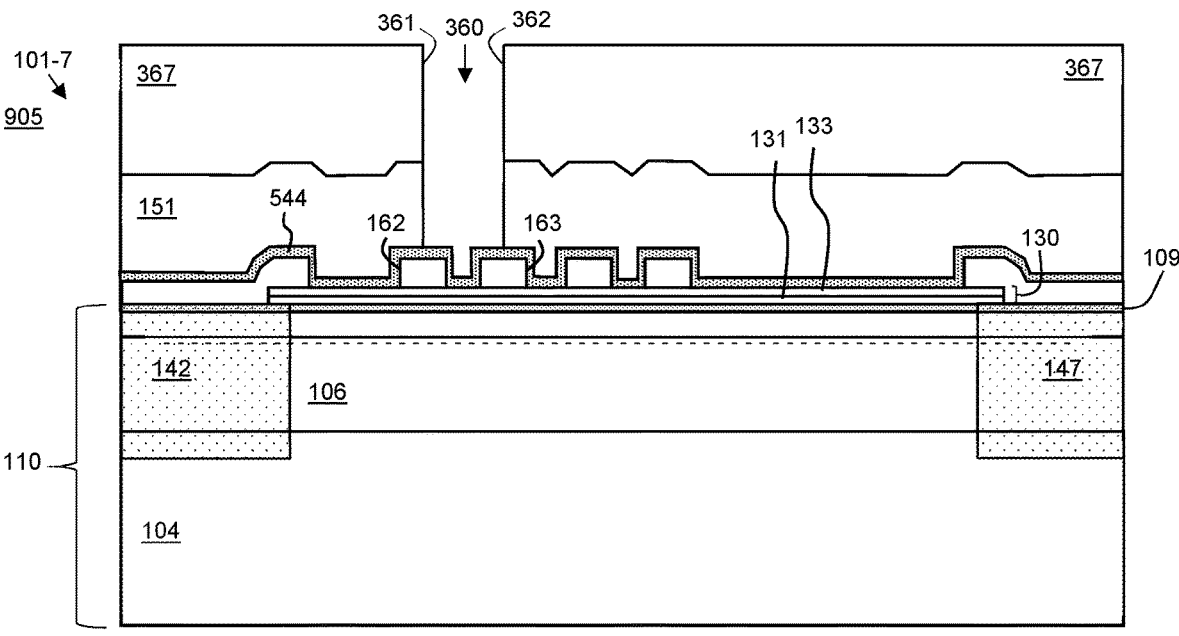
Figure 9F:
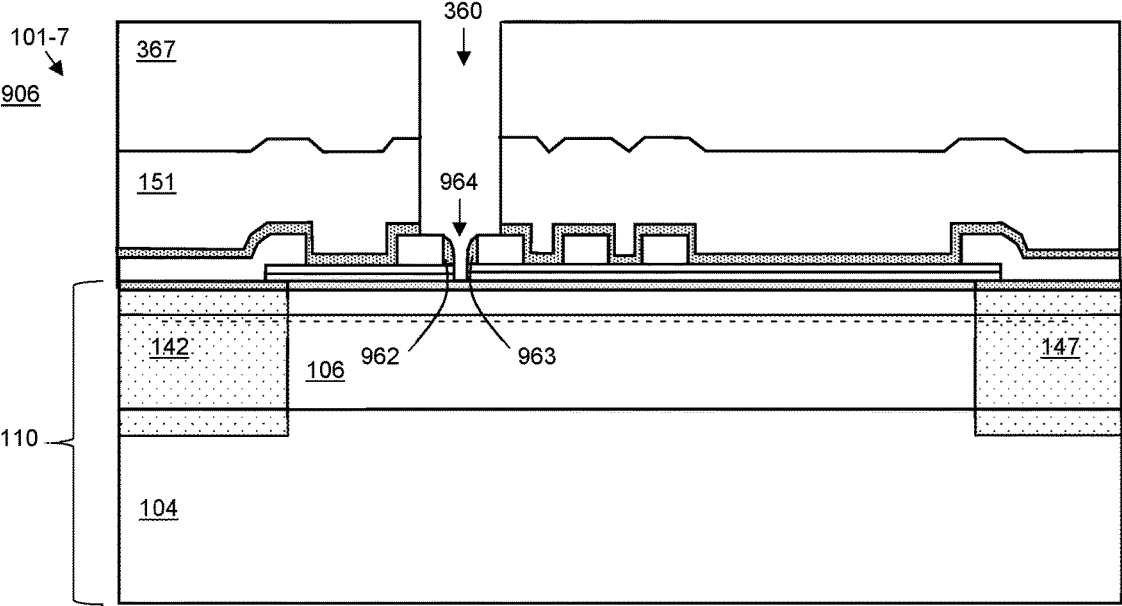
Figure 9G:
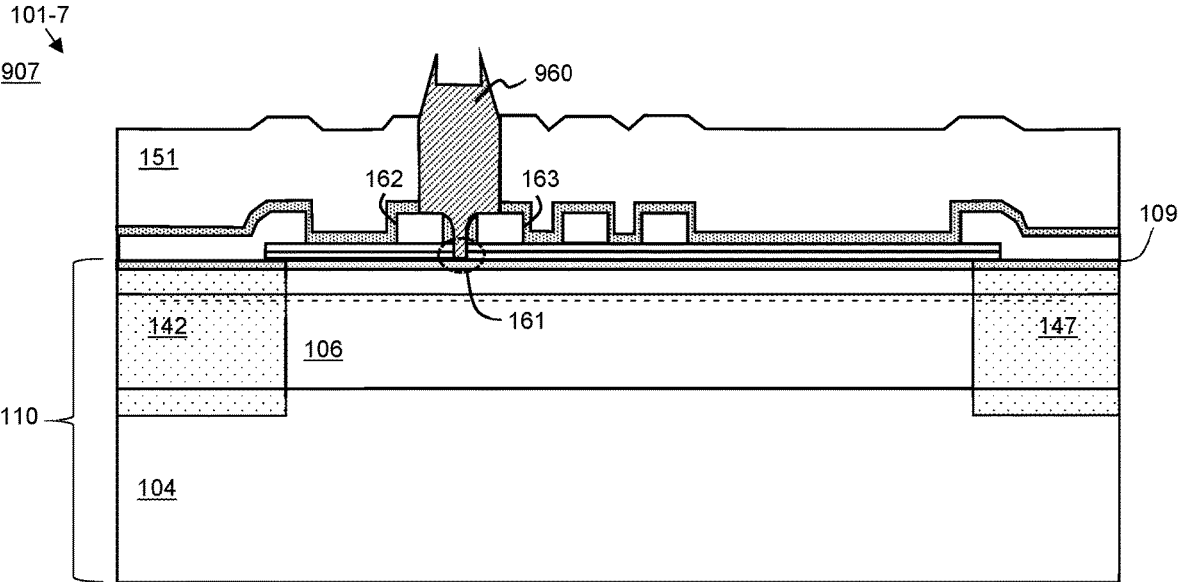
Figure 9H:
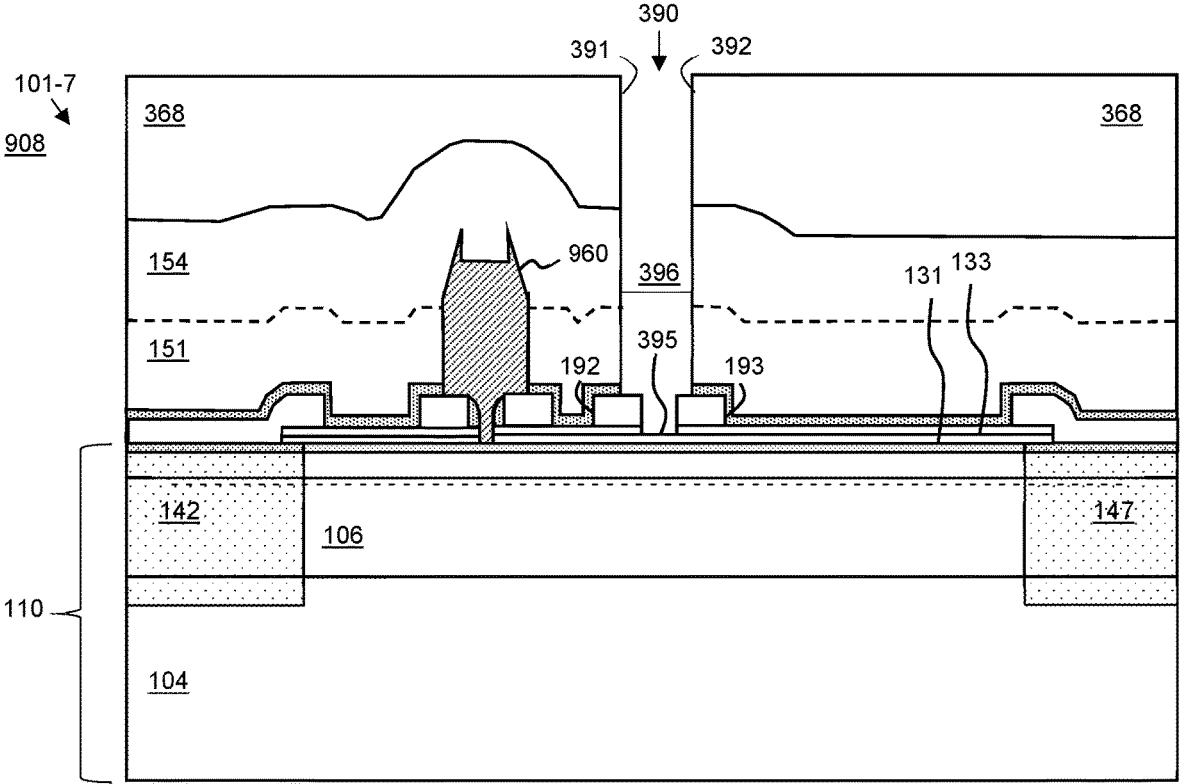
Figure 9I:
Figure 9I:
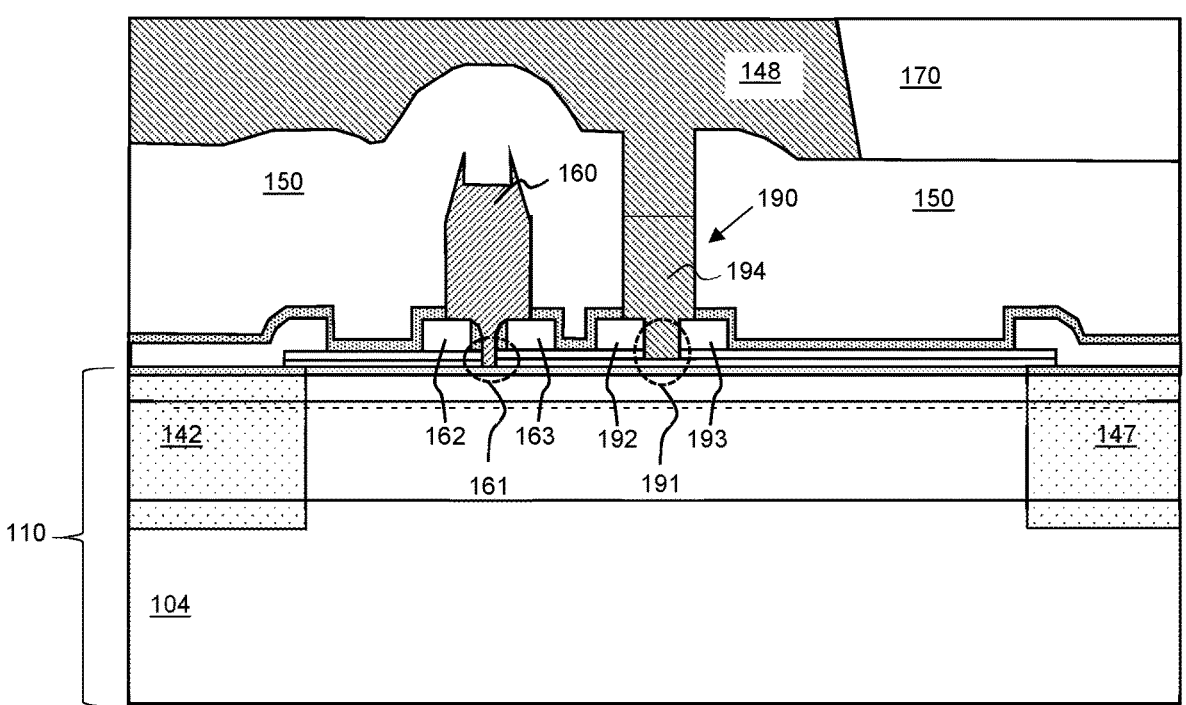

Referring now to FIGS. 1, 2, and 9B, in block 206 and fabrication stage 902 (FIG. 9B), openings 330 for the source and drain Ohmic contacts (e.g., contacts 141, 146, FIG. 1, not shown in FIG. 9) are formed in the surface passivation layer 130 over the source and drain implants 142, 147 (FIG. 1). Forming the openings 330 includes sequentially etching the upper and lower passivation sub-layers 133 131. The upper and lower passivation sub-layers 133, 131 may be sequentially etched using chemistries and techniques described in detail in conjunction with FIG. 3B, and those details are incorporated here.

Again, once formed, the openings 330 in the surface passivation layer 130 may extend across upper surface 112 from the ultimate locations of the later-formed source and drain electrodes 140, 145 (FIG. 1) into the portion 101 of the device 100 where the gate 960 and field plate 190 eventually will be formed. Accordingly, as shown in FIG. 9B, portions 113, 114 of the upper surface 112 of the semiconductor substrate 110 are exposed through the openings 330 on either side of the patterned surface passivation layer 130.

Further, in block 206, a conductive layer 144 is formed on or over the surface passivation layer 130, the portions of the upper surface 112 of the substrate 110 that are exposed over the source and drain implants 142, 147 (FIG. 1), and the additional exposed portions 113, 114 of the upper surface 112 of the substrate 110 that extend between the source and drain implants 142, 147 and the surface passivation layer 130. Suitable materials (e.g., Ti, TiAl, TiW, etc.) and other characteristics of the conductive layer 144, along with methods for depositing and annealing the conductive layer 144, are described above in conjunction with FIG. 3B, and those details are incorporated here.

In block 208 and fabrication stage 903 (FIG. 9C), a selective etch process is used to pattern and etch the conductive layer 144 to form the GFP alignment structures 162, 163 and the SFP alignment structures 192, 193. More specifically, photoresist layer 366 is applied over conductive layer 144, and a mask is used to pattern the photoresist layer 366 to expose portions of the conductive layer 144 through openings (not numbered) in the photoresist layer 366. The conductive layer 144 is then etched through the photoresist openings to remove the exposed portions all the way to the upper surface of the surface passivation layer 430 (i.e., the surface of layer 133). The conductive layer 144 may be etched using chemistries and techniques described in detail in conjunction with FIG. 3C, and those details are incorporated here.

The selective etch process results in the formation of the conductive GFP and SFP alignment structures 162, 163, 192, 193, along with conductive extensions 340, 345 that extend from the surface passivation layer 430 to overlie the source and drain implants 142, 147 (FIG. 1), respectively. Once the selective etch process has been completed, the photoresist 366 is removed.

In block 210 and fabrication stage 904 (FIG. 9D), one or more etch stop layers 544 and a first dielectric layer 151 (e.g., ILD0) are sequentially deposited over the source and drain contact extensions 340, 345, the GFP and SFP alignment structures 162, 163, 192, 193, and exposed portions of surface passivation layer 130 (i.e., exposed portions of layer 133). Etch stop layer(s) 544 may be formed from the same or different material layers as etch stop layer(s) 544 discussed in conjunction with FIG. 5. Suitable materials, deposition techniques, and other characteristics of the etch stop layer(s) 544 are described above in conjunction with etch stop layer(s) 544, FIG. 5B, and those details are incorporated here. It may be noted here that, in the alternate embodiment described above in which the two passivation sub-layers 131, 133 include $Si_3N_4$ (in various stoichiometries) for the lower sub-layer 131, and $SiO_2$ for the upper sub-layer 133, the etch stop layer(s) 544 may add additional $SiO_2$ and $Al_2O_3$, in some embodiments, so that, in the subsequently-performed block 212 and fabrication stage 905 (FIG. 9E), a similar etch chemistry may be used as is used to etch previously-described tri-layer passivation layer (e.g., the etch of passivation layer 430 in fabrication stage 405, FIG. 4E). Further, suitable materials (e.g., TEOS, $SiO_2$, organo-silicate glass, porous $SiO_2$, $Si_3N_4$, SiON, $HfO_2$, $Al_2O_3$, AlN, etc.) and other characteristics of the first dielectric layer 151, along with methods for depositing the first dielectric layer 151, are described above in conjunction with FIG. 3D, and those details are incorporated here.

In block 212 and fabrication stage 905 (FIG. 9E), a selective etch process is used to pattern and etch a gate opening through the first dielectric layer 151, while stopping on the etch stop layer 544. More specifically, photoresist layer 367 is applied over the first dielectric layer 151, and the photoresist layer 367 is processed and patterned to form an opening 360 that has a first side 361 aligned with GFP alignment structure 162 and a second side 362 aligned with GFP alignment structure 163.

The portion of first dielectric layer 151 that is exposed through opening 360 is then etched and removed through opening 360. The etch process using dry and/or wet etch techniques continues until reaching the etch stop layer 544. The first dielectric layer 151 may be etched using chemistries and techniques described in detail in conjunction with FIGS. 3B, and those details are incorporated here.

In fabrication stage 906 (FIG. 9F), sidewall spacers 962, 963 are formed on the interior vertical sidewalls of the GFP alignment structures 162, 163. In an embodiment, the sidewall spacers 962, 963 may be formed after etching dielectric layer 151 (and stopping on etch stop layer 544). The sidewall spacers 962, 963 may be formed by performing a suitably timed, anisotropic, dry etch of the etch stop layer 544, leaving some of the material of layer 544 (e.g., $Al_2O_3$) as the sidewall spacers 962, 963. In an embodiment in which the etch stop layer 544 consists of multiple layers (e.g., an $Al_2O_3$ layer over an $SiO_2$ layer) the sidewall spacers 962, 963 may be formed by a suitable sequence of etches, or the lower layer (e.g., $SiO_2$) of the multiple layers may be allowed to remain in place (i.e., not etched), and that lower layer may be removed during a subsequent step. For example, the sidewall spacers 962, 963 may be formed using RIE, ICP etching, or ECR etching. In various embodiments, the etchant used to etch the etch stop layer 544 may include octafluorocyclobutane $C_4F_8$ or $BCl_3$ plasma, or other suitable dry-etch chemistries, which may, for example, etch $Al_2O_3$ and stop on $SiO_2$.

After forming the sidewall spacers 962, 963, in fabrication stage 906 (FIG. 9F), formation of the gate opening is completed by etching through any remaining portion of the etch stop layer 544, if applicable, and through the surface passivation layer 130 between the sidewall spacers 962, 963, while stopping on the upper surface 112 of the substrate 110. The portions of the upper and lower passivation sub-layers 133, 131 are sequentially etched through an opening 964 between the sidewall spacers 962, 963 to remove the exposed portions of the layers 133, 131. The etching process continues until the upper surface 112 of the substrate 110 is exposed. Multiple dry and/or wet etch technique(s) may be used sequentially to etch openings through the surface passivation layer 130. The surface passivation layer 130 may be sequentially etched using chemistries and techniques described in detail in conjunction with FIG. 3B, and those details are incorporated here.

In block 214 and fabrication stage 907 (FIG. 9G), the gate electrode 960 (or gate metal stack) is formed by depositing one or more layers of gate metal into openings 360, 964, and the first gate metal layer defines the gate channel 161. As mentioned above, sidewall spacers 962, 963 enable the gate length 966 to be reduced, in comparison with the gate lengths of previously-described embodiments. The gate electrode 960 may be formed, for example, using techniques and materials described in detail in conjunction with FIG. 3F, and those details are incorporated here. After forming the gate electrode 960, photoresist layer 367 is removed.

In block 216 and fabrication stage 908 (FIG. 9H), a second dielectric layer 154 (e.g., ILD1) is deposited over the first dielectric layer 151 and the gate electrode 960, thus forming the "additional" dielectric layers 150 of FIG. 1. The second dielectric layer 154 may be formed from materials and using methods described in detail in conjunction with FIG. 3G, and those details are incorporated here.

In addition, in block 218, a selective etch process is used to pattern and etch a field plate opening through the first and second dielectric layers 151, 154, the etch stop layer 544, and the upper passivation sub-layer 133 of the surface passivation layer 130, while leaving the lower passivation sub-layer 131 essentially intact (i.e., the etching processes stop on layer 131). Simultaneously, openings through portions of the first and second dielectric layers 151, 154 overlying the source and drain Ohmic contacts 141, 146 (FIG. 1) are etched to facilitate forming conductive vias for source and drain electrodes 140, 145 (FIG. 1) in the following fabrication stage (stage 909, FIG. 9I) corresponding to block 220.

The second and first dielectric layers 154, 151 may be sequentially etched using chemistries and techniques described in detail in conjunction with etching layer 151 in FIG. 3E, and the upper passivation sub-layer 133 may be etched using chemistries and techniques described in detail in conjunction with FIG. 3B, and those details are incorporated here. This process results in an unfilled field plate via 396 over and between the SFP alignment structures 192, 193, with the portion 395 of the lower passivation sub-layer 131 defining the bottom extent of the via 396.

In block 220 and fabrication stage 909 (FIG. 9I), the photoresist 368 (FIG. 9H) is removed and source and drain metallization 148, 149 are deposited, resulting in the recessed SFP region 191 and the conductive field plate via 194, which connects with additional overlying source metallization 148. Further, the source metallization 148 is deposited so that it extends from the conductive field plate via 194 over the second dielectric layer 154 to the source contact 141. This completes the formation of the source-connected field plate 190, which includes the recessed SFP region 191, and the SFP alignment structures 192, 193. The source and drain metallization 148, 149 may be formed, for example, using techniques and materials described in detail in conjunction with FIG. 3H, and those details are incorporated here. At this point, in block 222, the device 100 may be completed by depositing the final passivation layers 170 and 180 (FIG. 1), as described above in conjunction with FIG. 3, and those details are incorporated here.

An embodiment of a semiconductor device includes a semiconductor substrate with an upper surface and a channel, source and drain electrodes over the upper surface of a semiconductor substrate, a passivation layer over the upper surface of the semiconductor substrate and between the source and drain electrodes, a gate electrode over the upper surface of the semiconductor substrate between the source and drain electrodes, and a conductive field plate adjacent to the gate electrode. The source and drain electrodes are electrically coupled to the channel, which extends between the source and drain electrodes. The passivation layer includes a lower passivation sub-layer over the upper surface of the semiconductor substrate, and an upper passivation sub-layer over the lower passivation sub-layer. The gate electrode includes a lower portion that extends through the passivation layer. The conductive field plate includes a recessed region that extends through the upper passivation sub-layer but does not extend through the lower passivation sub-layer. The conductive field plate and the upper surface of the semiconductor substrate are separated by a portion of the lower passivation sub-layer.

Another embodiment of a semiconductor device includes a semiconductor substrate with an upper surface and a channel, source and drain electrodes over the upper surface of a semiconductor substrate, a passivation layer over the upper surface of the semiconductor substrate and between the source and drain electrodes, a gate electrode over the upper surface of the semiconductor substrate between the source and drain electrodes, and a conductive field plate adjacent to the gate electrode. The source and drain electrodes are electrically coupled to the channel, and the channel extends between the source and drain electrodes. The passivation layer includes a lower passivation sub-layer over the upper surface of the semiconductor substrate, an intermediate passivation sub-layer over the lower passivation sub-layer, and an upper passivation sub-layer over the intermediate passivation sub-layer. The gate electrode includes a lower portion that extends through the upper passivation sub-layer and through the intermediate passivation sub-layer. The conductive field plate includes a recessed region that extends through the upper passivation sub-layer but does not extend through the lower passivation sub-layer, wherein the conductive field plate and the upper surface of the semiconductor substrate are separated by a portion of the lower passivation sub-layer, and wherein the lower portion of the gate electrode extends deeper into the passivation layer than the conductive field plate.

A method of forming a semiconductor device includes forming source and drain electrodes over an upper surface of a semiconductor substrate that includes a channel, where the source and drain electrodes are electrically coupled to the channel, and the channel extends between the source and drain electrodes. The method further includes depositing a passivation layer over the upper surface of the semiconductor substrate by depositing a lower passivation sub-layer on the upper surface of the semiconductor substrate, and depositing an upper passivation sub-layer over the lower passivation sub-layer. The lower passivation sub-layer is formed from a first dielectric material, and the upper passivation sub-layer is formed from a second dielectric material that is different from the first dielectric material. The method further includes forming a first opening at least partially through the passivation layer between the source and drain electrodes, and depositing a gate electrode over the semiconductor substrate between the source and drain electrodes. The gate electrode includes a lower portion that extends into the first opening in the passivation layer. The method further includes forming a second opening through the upper passivation sub-layer adjacent to the gate electrode, where the second opening does not extend through the lower passivation sub-layer, and the second opening is shallower than the first opening. The method further includes forming a conductive field plate over the semiconductor substrate and adjacent to the gate electrode. The conductive field plate includes a recessed region that extends through the second opening in the upper passivation sub-layer but does not extend through the lower passivation sub-layer, and the conductive field plate and the upper surface of the semiconductor substrate are separated by a portion of the lower passivation sub-layer.

The foregoing detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the detailed description.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

What is claimed is:

1. A semiconductor device comprising:
a semiconductor substrate with an upper surface and a channel;
source and drain electrodes over the upper surface of the semiconductor substrate, wherein the source and drain electrodes are electrically coupled to the channel, and the channel extends between the source and drain electrodes;
a passivation layer over the upper surface of the semiconductor substrate and between the source and drain electrodes, wherein the passivation layer includes a lower passivation sub-layer over the upper surface of the semiconductor substrate, and an upper passivation sub-layer over the lower passivation sub-layer;

a gate electrode over the upper surface of the semiconductor substrate between the source and drain electrodes, wherein the gate electrode includes a lower portion that extends through the passivation layer; and a conductive field plate adjacent to the gate electrode, wherein the conductive field plate includes a recessed region that extends through the upper passivation sub-layer but does not extend through the lower passivation sub-layer, and wherein the conductive field plate and the upper surface of the semiconductor substrate are separated by a portion of the lower passivation sub-layer.

2. The semiconductor device of claim 1, wherein:

the upper passivation sub-layer is formed from a first dielectric material that is etchable using a first etch chemistry that has a high etch selectivity to the first dielectric material; and the lower passivation sub-layer is formed from a second dielectric material that is different from the first dielectric material, and that functions as an etch stop for the first etch chemistry.

3. The semiconductor device of claim 2, wherein:

the first dielectric material of the upper passivation sub-layer is a material selected from aluminum oxide, aluminum nitride, and silicon dioxide; and the second dielectric material of the lower passivation sub-layer is silicon nitride.

4. The semiconductor device of claim 2, wherein the passivation layer further comprises an intermediate passivation sub-layer that is formed from a third dielectric material that is different from the first dielectric material, and that functions as an etch stop for the first etch chemistry.

5. The semiconductor device of claim 4, wherein:

the first dielectric material of the upper passivation sub-layer is a material selected from aluminum oxide and aluminum nitride;

the second dielectric material of the lower passivation sub-layer is silicon nitride; and the third dielectric material of the intermediate passivation sub-layer is silicon dioxide.

6. The semiconductor device of claim 1, further comprising:

a patterned conductive layer with first, second, third, and fourth portions positioned on the passivation layer, wherein the first and second portions form first and second gate alignment structures positioned at first and second sides of the gate electrode, respectively, and the third and fourth portions form first and second field plate alignment structures positioned at first and second sides of the conductive field plate.

7. The semiconductor device of claim 6, wherein the patterned conductive layer is formed from a material selected from titanium (Ti), titanium tungsten (TiW), titanium tungsten nitride (TiWN), and titanium aluminum (TiAl).

8. The semiconductor device of claim 6, wherein the source and drain electrodes are formed from fifth and sixth portions of the patterned conductive layer.

9. The semiconductor device of claim 6, further comprising:

an etch stop layer on the patterned conductive layer, wherein the etch stop layer is formed from one or more materials selected from silicon dioxide and aluminum oxide.

10. The semiconductor device of claim 6, further comprising:

a refractory metal layer on the patterned conductive layer, wherein the refractory metal layer is formed from a material selected from titanium tungsten and titanium-tungsten nitride.

11. The semiconductor device of claim 6, further comprising:

a dielectric step structure on the passivation layer next to the second field plate alignment structure, wherein the second field plate alignment structure has a first portion on the passivation layer and a second portion on an upper surface of the dielectric step structure.

12. The semiconductor device of claim 6, further comprising:

at least one dielectric sidewall spacer coupled to a sidewall of either or both of the first and second gate alignment structures, wherein the gate electrode includes a spacer-adjacent portion that extends upward from the lower portion of the gate electrode between the first and second gate alignment structures and the at least one dielectric sidewall spacer.

13. The semiconductor device of claim 1, further comprising:

a first dielectric layer over the passivation layer, wherein the gate electrode includes the lower portion that extends through the passivation layer to contact the upper surface of the semiconductor substrate, an intermediate portion extending from the lower portion through the first dielectric layer, and an upper portion coupled to the intermediate portion and extending over an upper surface of the first dielectric layer, and the lower portion of the gate electrode has a first width, the intermediate portion of the gate electrode has a second width that is greater than the first width, and the upper portion of the gate electrode has a third width that is greater than the second width.

14. The semiconductor device of claim 1, wherein the gate electrode contacts the upper surface of the semiconductor substrate.

15. The semiconductor device of claim 1, wherein the gate electrode contacts sidewalls of an opening through the upper passivation sub-layer, and contacts sidewalls of an opening through the lower passivation sub-layer.

16. The semiconductor device of claim 1, wherein the conductive field plate contacts sidewalls of the upper passivation sub-layer.

17. The semiconductor device of claim 1, wherein the upper and lower passivation sub-layers are present on a source-side and a drain-side of the gate electrode.

18. A semiconductor device comprising:

a semiconductor substrate with an upper surface and a channel;

source and drain electrodes over the upper surface of the semiconductor substrate, wherein the source and drain electrodes are electrically coupled to the channel, and the channel extends between the source and drain electrodes;

a passivation layer over the upper surface of the semiconductor substrate and between the source and drain electrodes, wherein the passivation layer includes a lower passivation sub-layer over the upper surface of the semiconductor substrate, an intermediate passivation sub-layer over the lower passivation sub-layer, and an upper passivation sub-layer over the intermediate passivation sub-layer;

a gate electrode over the upper surface of the semiconductor substrate between the source and drain electrodes, wherein the gate electrode includes a lower portion that extends through the upper passivation sub-layer and through the intermediate passivation sub-layer; and a conductive field plate adjacent to the gate electrode, wherein the conductive field plate includes a recessed region that extends through the upper passivation sub-layer but does not extend through the lower passivation sub-layer, wherein the conductive field plate and the upper surface of the semiconductor substrate are separated by a portion of the lower passivation sub-layer, and wherein the lower portion of the gate electrode extends deeper into the passivation layer than the conductive field plate.

19. The semiconductor device of claim 18, wherein:

a first dielectric material of the upper passivation sub-layer is a material selected from aluminum oxide and aluminum nitride;

a second dielectric material of the intermediate passivation sub-layer is silicon dioxide; and a third dielectric material of the lower passivation sub-layer is silicon nitride.

20. The semiconductor device of claim 18, wherein:

the lower portion of the gate electrode also extends through the lower passivation sub-layer to contact the upper surface of the semiconductor substrate.

21. The semiconductor device of claim 20, wherein:

the recessed region of the conductive field plate extends through the upper passivation sub-layer and through the intermediate passivation sub-layer.

22. The semiconductor device of claim 18, wherein:

the lower portion of the gate electrode does not extend through the lower passivation sub-layer, and a portion of the lower passivation layer forms a gate insulator between the gate electrode and the upper surface of the semiconductor substrate.

23. The semiconductor device of claim 22, wherein:

the recessed region of the conductive field plate extends through the upper passivation sub-layer but does not extend through the intermediate passivation sub-layer.

24. A method of forming a semiconductor device, the method comprising:

forming source and drain electrodes over an upper surface of a semiconductor substrate that includes a channel, wherein the source and drain electrodes are electrically coupled to the channel, and the channel extends between the source and drain electrodes;

depositing a passivation layer over the upper surface of the semiconductor substrate by depositing a lower passivation sub-layer on the upper surface of the semiconductor substrate, and depositing an upper passivation sub-layer over the lower passivation sub-layer, wherein the lower passivation sub-layer is formed from a first dielectric material, and the upper passivation sub-layer is formed from a second dielectric material that is different from the first dielectric material;

forming a first opening at least partially through the passivation layer between the source and drain electrodes;

depositing a gate electrode over the semiconductor substrate between the source and drain electrodes, wherein the gate electrode includes a lower portion that extends into the first opening in the passivation layer;

forming a second opening through the upper passivation sub-layer adjacent to the gate electrode, wherein the second opening does not extend through the lower passivation sub-layer, and the second opening is shallower than the first opening; and forming a conductive field plate over the semiconductor substrate and adjacent to the gate electrode, wherein the conductive field plate includes a recessed region that extends through the second opening in the upper passivation sub-layer but does not extend through the lower passivation sub-layer, and the conductive field plate and the upper surface of the semiconductor substrate are separated by a portion of the lower passivation sub-layer.

25. The method of claim 24, wherein:

forming the second opening comprises etching the upper passivation sub-layer using a first etch chemistry that has a high etch selectivity to the first dielectric material; and the lower passivation sub-layer functions as an etch stop for the first etch chemistry.

26. The method of claim 25, wherein:

the first dielectric material of the upper passivation sub-layer is selected from aluminum oxide, aluminum nitride, and silicon dioxide; and the second dielectric material of the lower passivation sub-layer is silicon nitride.

27. The method of claim 24, wherein depositing the passivation layer further comprises:

depositing an intermediate passivation sub-layer on the lower passivation sub-layer prior to depositing the upper passivation sub-layer, wherein the intermediate passivation sub-layer is formed from a third dielectric material that is different from the first and second dielectric materials; and wherein forming the second opening comprises etching the upper passivation sub-layer using a first etch chemistry that has a high etch selectivity to the first dielectric material, and etching the intermediate passivation sub-layer using a second etch chemistry that has a high etch selectivity to the third dielectric material, and wherein the lower passivation sub-layer functions as an etch stop for the second etch chemistry.

28. The method of claim 27, wherein:

the first dielectric material of the upper passivation sub-layer is selected from aluminum oxide and aluminum nitride;

the second dielectric material of the lower passivation sub-layer is silicon nitride; and the third dielectric material of the intermediate passivation sub-layer is silicon dioxide.

29. The method of claim 24, further comprising:

depositing a conductive layer over the passivation layer; and patterning the conductive layer to produce first, second, third, and fourth portions of the conductive layer that are positioned on the passivation layer, wherein the first and second portions form first and second gate alignment structures positioned at first and second sides of the gate electrode, respectively, and the third and fourth portions form first and second field plate alignment structures positioned at first and second sides of the conductive field plate.

30. The method of claim 29, wherein the conductive layer is formed from a material selected from titanium (Ti), titanium tungsten (TiW), titanium tungsten nitride (TiWN), and titanium aluminum (TiAl).

31. The method of claim 29, wherein the source and drain electrodes are formed from fifth and sixth portions of the conductive layer.

32. The method of claim 29, further comprising:

depositing an etch stop layer on the conductive layer either before or after patterning the conductive layer, wherein the etch stop layer is formed from one or more materials selected from silicon dioxide and aluminum oxide.

33. The method of claim 29, further comprising:

depositing a refractory metal layer on the conductive layer, wherein the refractory metal layer is formed from a material selected from titanium tungsten and titanium-tungsten nitride.

34. The method of claim 29, further comprising:

forming a dielectric step structure on the passivation layer prior to depositing the conductive layer; and wherein patterning the conductive layer includes patterning the second field plate alignment structure to have a first portion on the passivation layer and a second portion on an upper surface of the dielectric step structure.

35. The method of claim 29, further comprising:

forming at least one dielectric sidewall spacer on a sidewall of either or both of the first and second gate alignment structures; and depositing the gate electrode includes depositing a spacer-adjacent portion of the gate electrode that extends upward from the lower portion of the gate electrode between the first and second gate alignment structures and the at least one dielectric sidewall spacer.

36. The method of claim 24, further comprising:

depositing a first dielectric layer over the passivation layer; and wherein depositing the gate electrode includes depositing the lower portion of the gate electrode, which extends through the passivation layer to contact the upper surface of the semiconductor substrate, wherein the lower portion of the gate electrode has a first width, depositing an intermediate portion of the gate electrode, which extends from the lower portion through the first dielectric layer, wherein the intermediate portion of the gate electrode has a second width that is greater than the first width, and depositing an upper portion of the gate electrode, which is coupled to the intermediate portion and extends over an upper surface of the first dielectric layer, wherein the upper portion of the gate electrode has a third width that is greater than the second width.

* * * * *